United States Patent
Lee

(10) Patent No.: US 11,836,309 B2
(45) Date of Patent: *Dec. 5, 2023

(54) DISPLAY DEVICE

(71) Applicant: SAMSUNG DISPLAY CO., LTD., Yongin-si (KR)

(72) Inventor: Hyun Jae Lee, Seongnam-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 18/045,344

(22) Filed: Oct. 10, 2022

(65) Prior Publication Data

US 2023/0111028 A1    Apr. 13, 2023

Related U.S. Application Data

(63) Continuation of application No. 17/125,666, filed on Dec. 17, 2020, now Pat. No. 11,467,683.

(30) Foreign Application Priority Data

Feb. 26, 2020   (KR) .................. 10-2020-0023425

(51) Int. Cl.
| | |
|---|---|
| *G06F 3/041* | (2006.01) |
| *H01L 27/15* | (2006.01) |
| *H01L 33/38* | (2010.01) |
| *H01Q 1/24* | (2006.01) |
| *G06F 3/044* | (2006.01) |
| *H01L 33/62* | (2010.01) |

(52) U.S. Cl.
CPC .......... *G06F 3/0412* (2013.01); *G06F 3/0445* (2019.05); *H01L 27/156* (2013.01); *H01L 33/38* (2013.01); *H01L 33/62* (2013.01); *H01Q 1/243* (2013.01)

(58) Field of Classification Search
CPC ... G06F 3/0412; G06F 3/0445; H01L 27/156; H01L 33/38; H01L 33/62; H01Q 1/243
USPC .......................................... 345/173; 343/702
See application file for complete search history.

(56) References Cited

U.S. PATENT DOCUMENTS

| | | | |
|---|---|---|---|
| 9,411,479 B2 | 8/2016 | Kim et al. | |
| 9,671,914 B2 | 6/2017 | Kim et al. | |
| 10,186,754 B2 * | 1/2019 | Yang | ........................ G06F 3/041 |
| 11,016,542 B1 | 5/2021 | Zhang et al. | |

(Continued)

FOREIGN PATENT DOCUMENTS

| | | |
|---|---|---|
| KR | 10-2016-0050467 A | 5/2016 |
| KR | 10-1632237 B1 | 6/2016 |

(Continued)

*Primary Examiner* — Prabodh M Dharia
(74) *Attorney, Agent, or Firm* — Lewis Roca Rothgerber Christie LLP

(57) ABSTRACT

A display device includes sensor electrodes for sensing a touch. The sensor electrodes may also be used as an antenna. A display circuit board of the display device includes a radio signal connection unit for providing touch sensing signals and radio reception signals of the sensor electrodes to a touch driving circuit and an antenna driving circuit. Therefore, the display device not only senses a user's touch using the sensor electrodes but also conducts mobile communication using the sensor electrodes. For example, sensor electrodes for sensing a touch may also be used as an antenna.

33 Claims, 52 Drawing Sheets

(56) References Cited

U.S. PATENT DOCUMENTS

| | | | |
|---|---|---|---|
| 2010/0085988 A1 | 4/2010 | Fukuda | |
| 2014/0253392 A1* | 9/2014 | Yarga | H01Q 5/371 |
| | | | 343/702 |
| 2016/0091602 A1 | 3/2016 | Takeda | |
| 2018/0188849 A1 | 7/2018 | Ko et al. | |
| 2021/0005960 A1 | 1/2021 | Kida et al. | |
| 2021/0044885 A1* | 2/2021 | Fukahori | H01Q 1/273 |
| 2021/0263566 A1* | 8/2021 | Zhang | H04B 7/04 |

FOREIGN PATENT DOCUMENTS

| | | |
|---|---|---|
| KR | 10-2016-0118418 A | 10/2016 |
| KR | 10-1704536 B1 | 2/2017 |
| KR | 10-2018-0079978 A | 7/2018 |
| KR | 10-1984096 B1 | 5/2019 |
| KR | 10-2019-0090226 A | 8/2019 |

* cited by examiner

FIG. 29
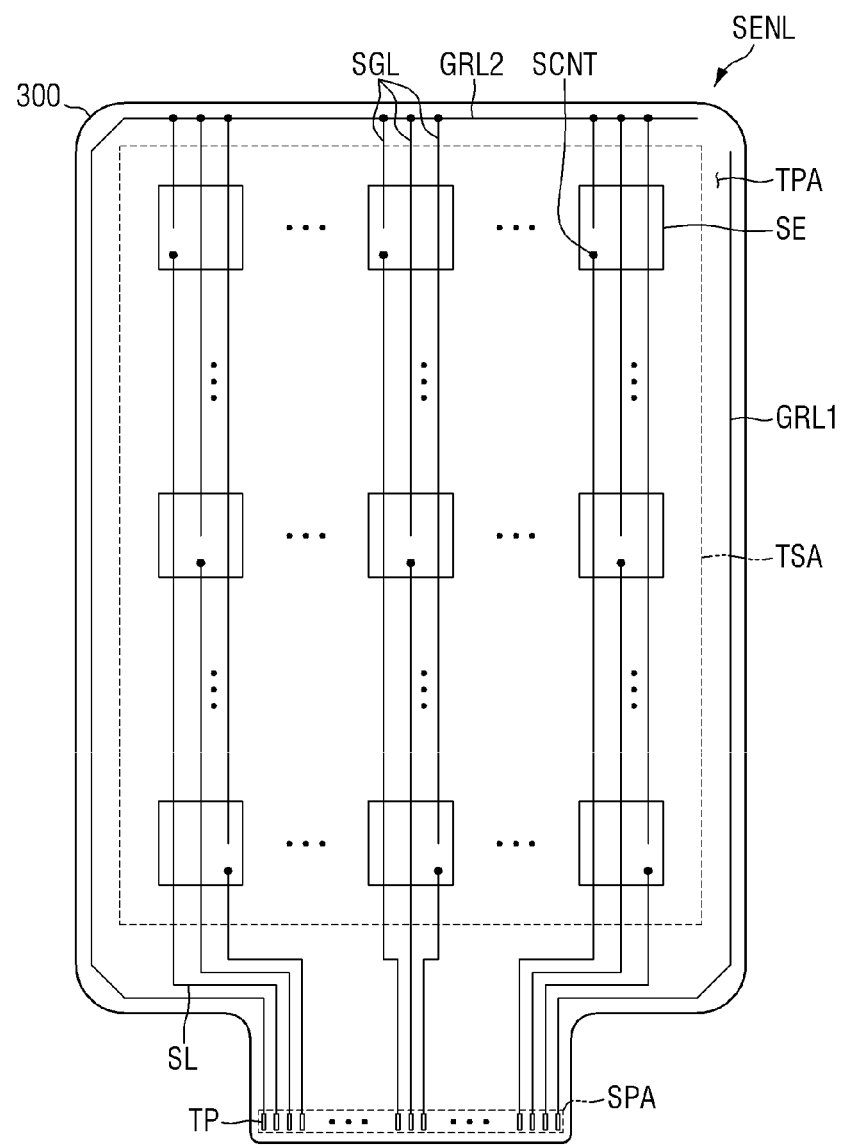
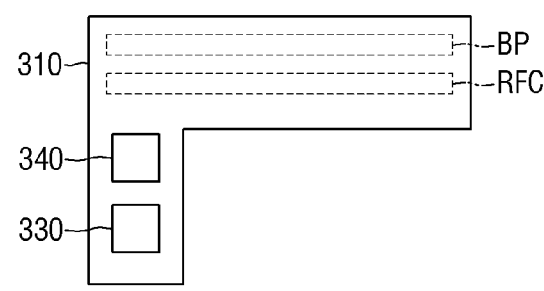

DISPLAY DEVICE

CROSS-REFERENCE TO RELATED APPLICATIONS

This application is a continuation of U.S. patent application Ser. No. 17/125,666, filed Dec. 17, 2020, which claims priority to and the benefit of Korean Patent Application No. 10-2020-0023425, filed Feb. 26, 2020, the entire content of both of which is incorporated herein by reference.

BACKGROUND

1. Field

Aspects of some example embodiments of the present disclosure relate to a display device.

2. Description of the Related Art

With the development of information society, requirements for display devices for displaying images have increased in various forms. For example, display devices are applied to various electronic appliances such as smart phones, digital cameras, notebook computers, navigators, and smart televisions.

A display device may include an antenna that transmits and receives radio electromagnetic waves for radio communication. For example, the display device may include an antenna for fourth generation (4G) mobile communication such as long-term evolution (LTE) and fifth generation (5G) mobile communication. Accordingly, the frequency band of radio electromagnetic waves that are transmitted and received may vary depending on communication technology, and the shape or length of an antenna may vary depending on the frequency band of the radio electromagnetic waves. Therefore, the display device needs an antenna according to the frequency band of the radio electromagnetic waves.

SUMMARY

Aspects of some example embodiments of the present disclosure are directed to a display device in which sensor electrodes for sensing a touch are used as an antenna.

However, example embodiments of the present disclosure are not restricted to those set forth herein. The above and other aspects of some example embodiments of the present disclosure will become more apparent to one of ordinary skill in the art to which the present disclosure pertains by referencing the detailed description of the present disclosure given below.

According to some example embodiments of the present disclosure, a display device includes: a substrate; a display layer on the substrate, the display layer including light emitting elements to emit light; a sensor electrode layer on the display layer, the sensor electrode layer including sensor electrodes and sensor lines connected to the sensor electrodes; and a circuit board including sensor circuit lines electrically connected to the sensor lines and radio signal lines that form coupling capacitors with the sensor circuit lines.

According to some example embodiments of the present disclosure, a display device includes: a substrate; a display layer on the substrate, the display layer including light emitting elements to emit light; a sensor electrode layer on the display layer, the sensor electrode layer including sensor electrodes and sensor lines connected to the sensor electrodes; and radio signal lines that form coupling capacitors with the sensor lines.

According to some example embodiments of the present disclosure, a display device includes: sensor electrodes on a substrate; sensor lines electrically connected to the sensor electrodes; radio signal lines that form coupling capacitors with the sensor lines; and an antenna driving circuit electrically connected to the radio signal lines. The antenna driving circuit is configured to receive coupling signals of radio reception signals received from the sensor electrodes through the radio signal lines, to select some of the sensor electrodes as antenna electrodes according to the coupling signals, and to output radio transmission signals to the antenna electrodes.

In one or more embodiments, the display device further includes an antenna driving circuit electrically connected to the radio signal lines. In one or more embodiments, the antenna driving circuit is on the circuit board. In one or more embodiments, the display device further includes a touch driving circuit on the circuit board and electrically connected to the sensor circuit lines. In one or more embodiments, the touch driving circuit is configured to receive signals of a first frequency of the sensor circuit lines, and the antenna driving circuit is configured to receive signals of a second frequency of the radio signal lines, the second frequency is higher than the first frequency.

In one or more embodiments, the sensor electrodes include a first sensor electrode and a second sensor electrode arranged in parallel in an extension direction of the sensor lines, and the sensor lines include a first sensor line connected to the first sensor electrode through a first sensor contact unit, and a second sensor line connected to the second sensor electrode through a second sensor contact unit.

In one or more embodiments, the first contact unit is larger than the second contact unit. In one or more embodiments, the display device further includes a capping electrode on the first sensor electrode in the first sensor contact unit. In one or more embodiments, the first sensor line has a first width, and the second sensor line has a second width smaller than the first width. In one or more embodiments, the first sensor line has a first width in an area overlapping the first sensor electrode and has a second width smaller than the first width in an area overlapping the second sensor electrode, and the second sensor line has the second width in an area overlapping the second sensor electrode.

In one or more embodiments, the sensor lines and the radio signal lines are arranged in parallel in one direction. In one or more embodiments, the sensor lines overlap the radio signal lines in a thickness direction of the substrate. In one or more embodiments, the display device further includes: a circuit board attached to the substrate; an antenna driving circuit on the circuit board and electrically connected to the radio signal lines; and a touch driving circuit on the circuit board and electrically connected to the sensor lines.

In one or more embodiments, the display device further includes: a first circuit board attached to the substrate; a second circuit board attached to the substrate; an antenna driving circuit on the second circuit board and electrically connected to the radio signal lines; and a touch driving circuit on the first circuit board and electrically connected to the sensor lines.

In one or more embodiments, the antenna electrodes include P×Q sensor electrodes arranged in parallel in one direction and along an other direction crossing the one direction, wherein P and Q are positive integers. In one or more embodiments, the antenna electrodes include a plurality of sub-antenna electrode groups. In one or more embodiments, the plurality of sub-antenna electrode groups are spaced from each other along the one direction. In one or more embodiments, the plurality of sub-antenna electrode groups are spaced from each other along the other direction crossing the one direction. In one or more embodiments, the plurality of sub-antenna electrode groups are at corners of the substrate, respectively. In one or more embodiments, each of the plurality of sub-antenna electrode groups includes R×S sensor electrodes arranged in parallel in one direction and along the other direction crossing the one direction, wherein R and S are positive integers.

According to one or more embodiments of the present disclosure, the display circuit board includes the radio signal connection unit for providing the touch sensing signals and the radio reception signals of the sensor electrodes to the touch driving circuit and the antenna driving circuit. Therefore, the display device not only senses a user's touch using the sensor electrodes SE but also conducts mobile communication using the sensor electrodes SE. For example, sensor electrodes for sensing a touch may be used as an antenna.

According to one or more embodiments of the present disclosure, the antenna driving circuit receives the first radio reception signals and transmits the first radio transmission signals using the first antenna electrodes. Further, the antenna driving circuit receives the second radio reception signals and transmits the first radio transmission signals using the second antenna electrodes. For example, some of the sensor electrodes for sensing the touch may be used as the first antenna, and others thereof may be used as the second antenna for transmitting and receiving electromagnetic waves having a different frequency from the first antenna.

Other aspects and characteristics of some example embodiments may be more apparent from the following detailed description, the drawings, and the claims.

BRIEF DESCRIPTION OF THE DRAWINGS

The above and other aspects of some example embodiments according to the present disclosure will become more apparent by describing in more detail example embodiments thereof with reference to the attached drawings, in which:

FIG. 29 is a layout view illustrating a sensor electrode layer of a display device according to one or more embodiments.

DETAILED DESCRIPTION

Figure 1:
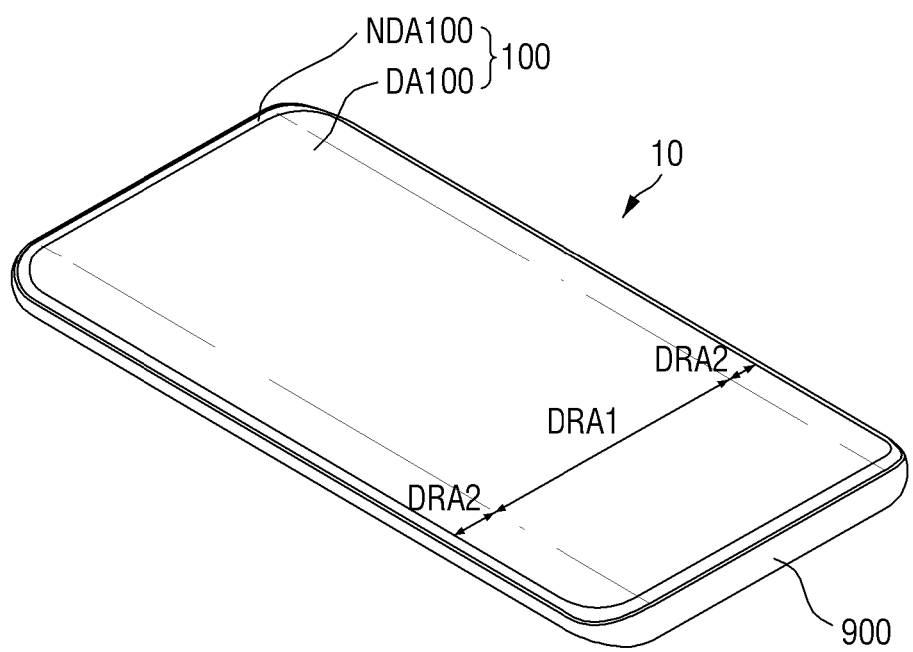
FIG. 1 is a perspective view of a display device according to one or more embodiments.

Further details of some example embodiments of the present disclosure will now be described more fully hereinafter with reference to the accompanying drawings, in which some example embodiments of the disclosure are shown. Embodiments according to the present disclosure may, however, be embodied in different forms and should not be construed as being limited to the example embodiments set forth herein. Rather, these example embodiments are provided so that this disclosure will be more thorough and more complete, and will more fully convey the scope of embodiments according to the disclosure to those skilled in the art. The same reference numbers indicate the same components throughout the specification. In the attached figures, the thickness of layers and regions is exaggerated for clarity.

Hereinafter, aspects of some example embodiments of the present disclosure will be described with reference to the attached drawings.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed herein could be termed a second element, component, region, layer or section, without departing from the scope of the present disclosure.

Spatially relative terms, such as "beneath", "below", "lower", "under", "above", "upper" and the like, may be used herein for ease of description to describe one element or feature's relationship to another element(s) or feature(s) as illustrated in the figures. It will be understood that such spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the present disclosure. As used herein, the terms "substantially," "about," and similar terms are used as terms of approximation and not as terms of degree, and are intended to account for the inherent deviations in measured or calculated values that would be recognized by those of ordinary skill in the art.

As used herein, the singular forms "a" and "an" are intended to include the plural forms as well, unless the context clearly indicates otherwise. It will be further understood that the terms "comprises" and/or "comprising", when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list. Further, the use of "may" when describing embodiments of the present disclosure refers to "one or more embodiments of the present disclosure". Also, the term "exemplary" is intended to refer to an example or illustration. As used herein, the terms "use," "using," and "used" may be considered synonymous with the terms "utilize," "utilizing," and "utilized," respectively.

It will be understood that when an element or layer is referred to as being "on", "connected to", "coupled to", or "adjacent to" another element or layer, it may be directly on, connected to, coupled to, or adjacent to the other element or layer, or one or more intervening elements or layers may be present. In contrast, when an element or layer is referred to as being "directly on", "directly connected to", "directly coupled to", or "immediately adjacent to" another element or layer, there are no intervening elements or layers present.

Any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein.

In some embodiments, one or more outputs of the different embodiments of the methods and systems of the present disclosure may be transmitted to an electronics device coupled to or having a display device for displaying the one or more outputs or information regarding the one or more outputs of the different embodiments of the methods and systems of the present disclosure.

Figure 2:
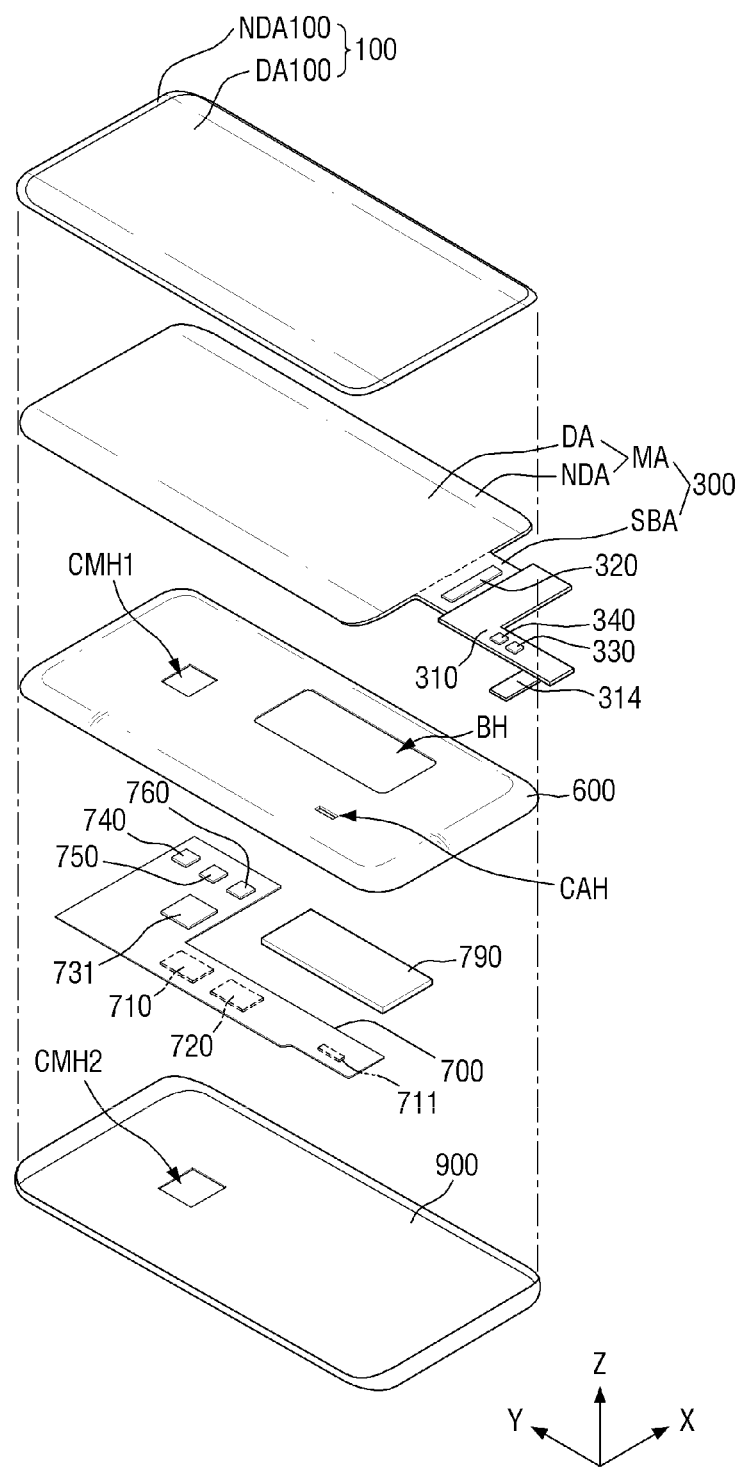
FIG. 2 is an exploded perspective view of a display device according to one or more embodiments.

FIG. 1 is a perspective view of a display device 10 according to one or more embodiments, and FIG. 2 is an exploded perspective view of a display device according to one or more embodiments.

For convenience of description, FIGS. 1 and 2 illustrate that a display device 10 according to one or more embodiments is used as a smart phone, but the present disclosure is not limited thereto. The display device 10 according to one or more embodiments may be a portable electronic appliance such as a mobile phone, a smart phone, a tablet personal computer (table PC), a mobile communication terminal, and electronic notebook, an e-book, a portable multimedia player (PMP), a navigator, or ultra mobile PC (UMPC). In one or more embodiments, the display device 10 according to an embodiment may be a display unit of a television, a notebook, a monitor, a billboard, or internet of things (IOT). In one or more embodiments, the display device 10 may be a wearable device such as a smart watch, a watch phone, an eyeglass display, or a head mounted display (HMD). In one or more embodiments, the display device 10 may be a center information display placed in a car instrument panel, a car center fascia or a carbon dashboard, a room mirror display replacing a car side mirror, or a display placed on the back surface of a front seat as an entertainment for a back seat of a car.

Referring to FIGS. 1 and 2, a display device 10 according to one or more embodiments includes a cover window 100, a display panel 300, a display circuit board 310, a display driving circuit 320, a touch driving circuit 330, an antenna driving circuit 340, a bracket 600, a main circuit board 700, and a lower cover 900.

In one or more embodiments of the present disclosure, the first direction (X-axis direction) is a direction parallel to short sides of the display device 10, for example, may be a horizontal direction of the display device 10. The second direction (Y-axis direction) is a direction parallel to long sides of the display device 10, for example, may be a vertical direction of the display device 10. The third direction (Z-axis direction) may be parallel to a thickness direction of the display device 10 (e.g., the thickness direction of a substrate therein).

The display device 10 may have a rectangular shape in a plan view. For example, as shown in FIG. 1, the display device 10 may have a rectangular planar shape having short sides in the first direction (X-axis direction) and long sides in the second direction (Y-axis direction). The edge where the short side in the first direction (X-axis direction) meets the long side in the second direction (Y-axis direction) may be formed to have a round shape of a set curvature (e.g., a predetermined curvature) or have a right angle shape. The planar shape of the display device 10 is not limited to a rectangular shape, and may be formed in another polygonal shape, circular shape, or elliptical shape.

The display device 10 may include a first area DRA1 and a second area DRA2 extending from the right and left sides of the first area DRA1 and extending along the long sides of the display device 10. The first area DRA1 may be formed to be flat or curved. The second area DRA2 may be formed to be flat or curved. When both the first area DRA1 and the second area DRA2 are formed to be curved, the curvature of the first area DRA1 may be different from the second area DRA2. When the first area DRA1 is formed to be curved, the first area DRA1 may have a substantially constant curvature (e.g., a constant curvature) or a variable curvature. When the second area DRA2 is formed to be curved, the second area DRA2 may have a substantially constant curvature (e.g., a constant curvature) or a variable curvature. When both the first area DRA1 and the second area DRA2 are formed to be flat, the angle formed by the first area DRA1 and the second area DRA2 may be an obtuse angle.

Although it is shown in FIG. 1 that the second area DRA2 extends from the left and right sides of the first area DRA1, the present disclosure is not limited thereto. For example, the second area DRA2 may extend from only one of the left and right sides of the first area DRA1. In one or more embodiments, the second area DRA2 may extend from only one of the upper and lower sides of the first area DRA1 as well as only one of the left and right sides of the first area DRA1. In one or more embodiments, the second area DRA2 may be omitted, and the display device 10 may include only the first area DRA1.

The cover window 100 may be disposed on the display panel 300 so as to cover the upper surface of the display panel 300. The cover window 100 may serve to protect the upper surface of the display panel 300.

The cover window 100 is made of a transparent material, and may include glass or plastic. For example, the cover window 100 may include ultra-thin glass (UTG) having a thickness of 0.1 mm or less. The cover window 100 may include a transparent polyimide film.

The cover window 100 may include a light transmitting area DA100 for transmitting light and a light blocking area NDA100 for blocking light. The light blocking area NDA100 may include a pattern layer on which a set pattern (e.g., a predetermined pattern) is formed.

The display panel 300 may be disposed under the cover window 100. The display panel 300 may be disposed to overlap the light transmitting area DA100 of the cover window 100. The display panel 300 may be disposed in the first area DRA1 and the second areas DRA2. A user may see an image of the display panel 300 in the first area DRA1 and the second area DRA2.

The display panel 300 may be a light emitting display panel including a light emitting element. Examples of the display panel 300 may include an organic light emitting display panel using an organic light emitting diode including an organic light emitting layer, an ultra-micro light emitting diode display panel using an ultra-micro light emitting diode (e.g., ultra-micro LED), a quantum dot light emitting diode display panel using a quantum dot light emitting diode including a quantum dot light emitting layer, and an inorganic light emitting display panel using an inorganic light emitting diode including an inorganic semiconductor.

The display panel 300 may be a rigid display panel that is not easily bent due to rigidity, or a flexible display panel that is easily bent, folded, or rolled due to flexibility. For example, the display panel 300 may be a foldable display panel that may be folded and unfolded, a curved display panel in which a display surface may be curved, a bent display panel in which an area other than a display surface may be bent, a rollable display panel that may be rolled or unrolled, or a stretchable display panel that may be stretched.

In one or more embodiments, the display panel 300 may be a transparent display panel that is transparently implemented to see objects or backgrounds disposed on the lower surface of the display panel 300 from the upper surface of the display panel 300. In one or more embodiments, the display panel 300 may be a reflective display panel that can reflect an object or background on the upper surface of the display panel 300.

As shown in FIG. 2, the display panel 300 may include a main area MA and a sub-area SBA protruding from one side of the main region MA.

The main area MA may include a display area DA displaying an image and a non-display area NDA that is a peripheral area of the display area DA. The display area DA may occupy most of the main area MA. The display area DA may be disposed at or near the center of the main area MA. The non-display area NDA may be an area outside the display area DA extending along the periphery of the display area DA. The non-display area NDA may be defined as an edge area of the display panel 300.

The sub-area SBA may protrude from one side of the main region MA in the second direction (Y-axis direction). As shown in FIG. 2, the length of the sub-area SBA in the first direction (X-axis direction) may be smaller than the length of the main area MA in the first direction (X-axis direction), and the length of the sub-area SBA in the second direction (Y-axis direction) may be smaller than the length of the main area MA in the second direction (Y-axis direction), but the present disclosure is not limited thereto. The sub-area SBA may be bent and may be disposed on the lower surface of the display panel 300 as shown in FIG. 5. The sub-area SBA may overlap the main area MA in the third direction (Z-axis direction).

The display circuit board 310 may be attached to the sub-area SBA of the display panel 300. The display circuit board 310 may be attached onto display pads of the sub-area SBA of the display panel 300 by using a low-resistance high-reliability material such as an anisotropic conductive film or a self-assembly anisotropic conductive paste (SAP). The display circuit board 310 is a flexible printed circuit board (FPCB) that may be bent, a rigid printed circuit board (PCB) that may not easily bent due to rigidity, and a composite printed circuit board that includes both a rigid printed circuit board and a flexible printed circuit board. The display circuit board 310 may have characteristics capable of reducing or minimizing path loss of transmitted and received radio signals.

The display driving circuit 320 may be disposed on the sub-area SBA of the display panel 300. The display driving circuit 320 may receive control signals and power voltages, and may generate and output signals and voltages for driving the display panel 300. The display driving circuit 320 may be formed as an integrated circuit (IC).

A touch driving circuit 330 and an antenna driving circuit 340 may be disposed on the display circuit board 310. Each of the touch driving circuit 330 and the antenna driving circuit 340 may be formed as an integrated circuit. In one or more embodiments, the touch driving circuit 330 and the antenna driving circuit 340 may be integrally formed as one integrated circuit. Each of the touch driving circuit 330 and the antenna driving circuit 340 may be attached to the display circuit board 310. In one or more embodiments, the antenna driving circuit 340 may be disposed on the main circuit board 700 rather than the display circuit board 310.

Because the touch driving circuit 330 may be electrically connected to sensor electrodes of a sensor electrode layer of the display panel 300 through the display circuit board 310, the touch driving circuit 330 may output a touch driving signal to each of the sensor electrodes, and sense a voltage corresponding to a charge in self-capacitance of each of the sensor electrodes. The touch driving circuit 330 may generate touch data according to a change in the electrical signal sensed at each of the sensor electrodes and transmit the touch data to a main processor 710, and the main processor 710 may analyze the touch data to calculate touch coordinates (of the display panel 300) where a touch has occurred. The touch may include a contact touch and a proximity touch. The contact touch indicates that an object such as a human finger or pen is in direct contact with the cover window 100 disposed on the sensor electrode layer. The proximity touch indicates that, like hovering, an object such as a human finger or pen is located close to the cover window 100.

Figure 6:
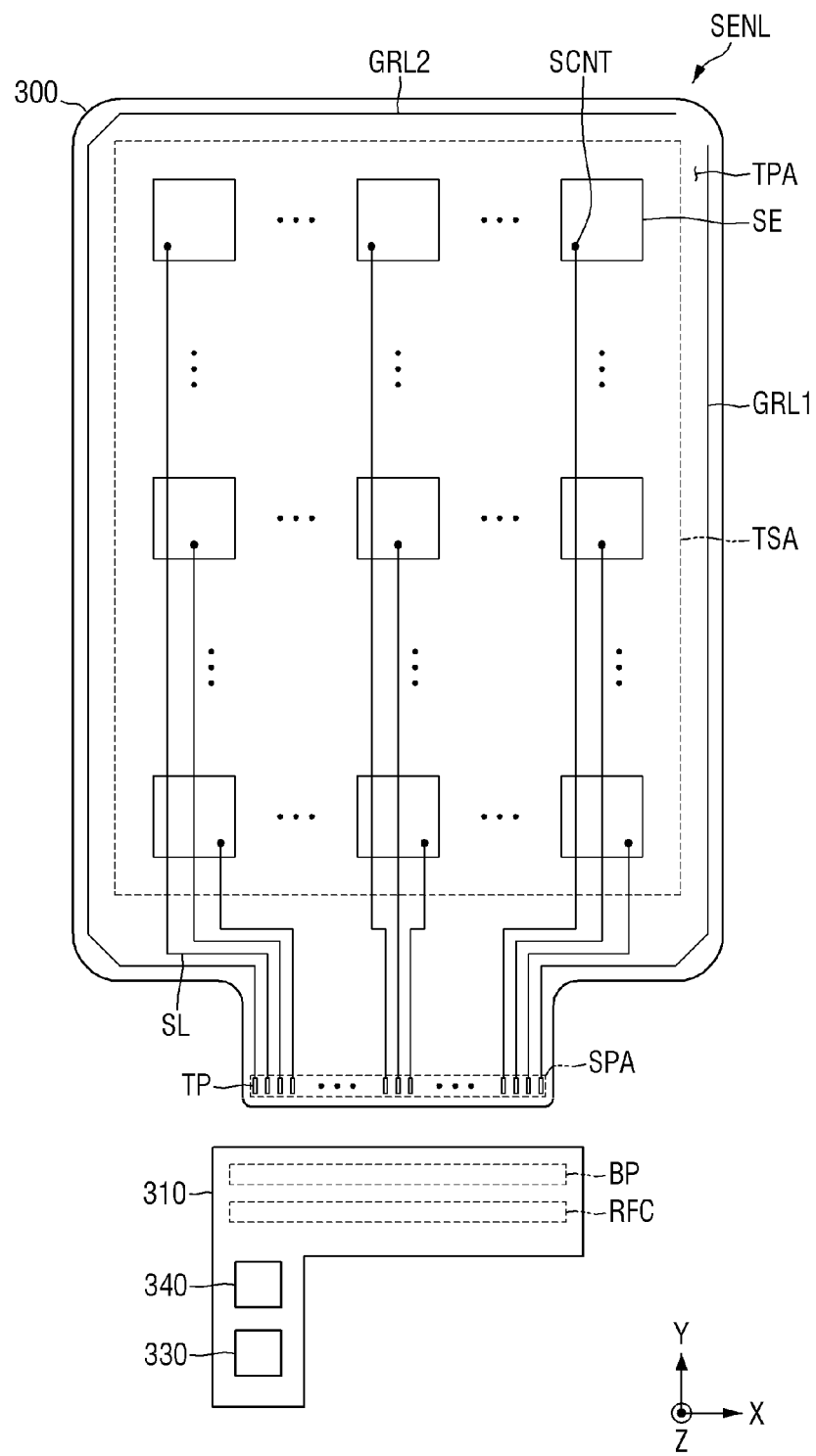
FIG. 6 is a layout view illustrating a sensor electrode layer of a display panel according to one or more embodiments.
Figure 30:
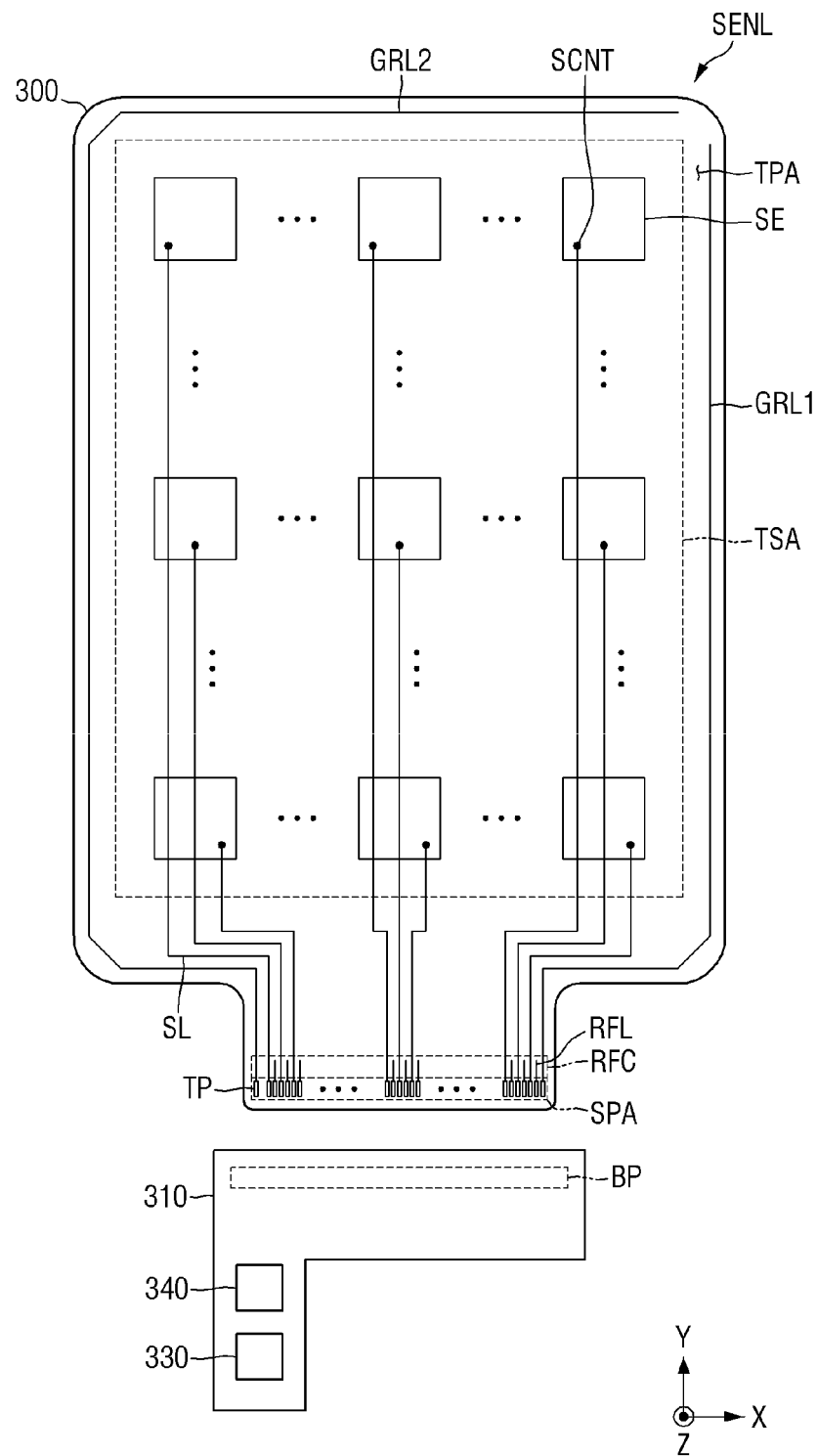
FIG. 30 is a layout view illustrating a sensor electrode layer of a display device according to one or more embodiments.

Because the antenna driving circuit 340 may be electrically connected to sensor electrodes of the sensor electrode layer of the display panel 300 through a radio signal connection unit RFC, the antenna driving circuit 340 may transmit a radio transmission signal to each of the sensor electrodes, and may receive a radio reception signal from each of the sensor electrodes. The radio signal connection unit RFC may be disposed on the display circuit board 310 as shown in FIG. 6, or may be disposed on the display panel 300 as shown in FIG. 30.

The antenna driving circuit 340 may change and amplify the phase of the radio reception signal and then transmit this radio reception signal to a mobile communication module 720 of the main circuit board 700. Further, the antenna driving circuit 340 may change and amplify the phase of the radio transmission signal transmitted from the mobile communication module 720 of the main circuit board 700 and transmit this radio transmission signal to each of the sensor electrodes. In one or more embodiments, the antenna driving circuit 340 and the mobile communication module 720 of the main circuit board 700 may be configured in an integrated form.

A power supply unit for supplying driving voltages for driving display pixels of the display panel 300 and the display driving circuit 320 may be additionally disposed on the display circuit board 310. In one or more embodiments, the power supply unit may be integrated with the display driving circuit 320, and in this case, the display driving circuit 320 and the power supply unit may be formed as one integrated circuit.

A bracket 600 for supporting the display panel 300 may be disposed under the display panel 300. The bracket 600 may include plastic, metal, or both plastic and metal. The bracket 600 may be provided with a first camera hole CMH1 into which a camera device 731 is inserted, a battery hole BH in which a battery is disposed, and a cable hole CAH through which a cable 314 connected to the display circuit board 310 passes.

The main circuit board 700 and a battery 790 may be disposed under the bracket 600. The main circuit board 700 may be a printed circuit board (PCB) or a flexible printed circuit board (FPCB).

The main circuit board 700 may include a main processor 710, a mobile communication module 720, a camera device 731, an acceleration sensor 740, a gyro sensor 750, a proximity sensor 760, and a main connector 711. The main processor 710 may be formed of an integrated circuit. The camera device 731 may be disposed on both the upper surface and lower surface of the main circuit board 700. Each of the main processor 710, the mobile communication module 720, the camera device 731, the acceleration sensor 740, the gyro sensor 750, the proximity sensor 760, and the main connector 711 may be disposed on any one of the lower surface and upper surface of the main circuit board 700.

The main processor 710 may control all the functions of the display device 10. For example, the main processor 710 may output digital video data to the display driving circuit 320 through the display circuit board 310 such that the display panel 300 displays an image. Further, the main processor 710 may receive touch data from the touch driving circuit 330. Further, the main processor 710 may determine the touch position of a user, and then execute an application indicated by an icon displayed at the touch position of the user. Further, the main processor 710 may receive touch data from the touch driving circuit 330, and may execute an application indicated by an icon displayed at the touch coordinate of the user according to the touch data. The main processor 710 may determine whether an object has touched the cover window 100 of the display panel 300 according to the touch data, and may execute an operation corresponding to a direct touch or proximity touch of the object. For example, the main processor 710 may analyze touch data, calculate touch coordinates of an object, and then execute an application indicated by an icon touched by the object or perform an operation. Further, the main processor 710 may determine the degree of inclination of the display device 10 and the rotation direction of the display device 10 according to acceleration data from the acceleration sensor 740 and angular velocity data from the gyro sensor 750, and may determine whether an object such as a human finger approaches to the display device 300 through the proximity sensor 760. Further, the main processor 710 may output touch coordinate data including touch coordinate information to the antenna driving circuit 340. Further, the main processor 710 may output acceleration data from the acceleration sensor 740 and angular velocity data from the gyro sensor 750 to the antenna driving circuit 340. The main processor 710 may be an application processor formed of an integrated circuit, a central processing unit (CPU), or a system chip.

The mobile communication module 720 transmits radio signals to and receives radio signals from at least one of a base station, an external terminal, and a server on a mobile communication network built according to technical standards or communication methods for mobile communication, for example, Global System for Mobile communication (GSM), Code Division Multi Access (CDMA), Code Division Multi Access 2000 (CDMA2000), Enhanced Voice-Data Optimized or Enhanced Voice-Data Only (EV-DO), Wideband CDMA (WCDMA), High Speed Downlink Packet Access (HSDPA), High Speed Uplink Packet Access (HSUPA), Long Term Evolution (LTE), Long Term Evolution-Advanced (LTE-A), and fifth generation (5G) radio communication. The radio signals may include various types of data according to transmission and reception of a voice call signal, a video call signal, or a text/multimedia message.

The camera device 731 processes an image frame of a still image or a mobile image obtained by an image sensor in the camera mode and outputs the processed frame to the main processor 710. The camera device 731 may include at least one of a camera sensor (for example, a charge-coupled device (CCD) sensor, complementary metal-oxide-semiconductor (CMOS) sensor), a photo sensor (or image sensor), and a laser sensor.

The acceleration sensor 740 may sense accelerations in the first direction (X-axis direction), the second direction (Y-axis direction), and the third direction (Z-axis direction). The acceleration sensor 740 may output acceleration data including acceleration information in the first direction (X-axis direction), the second direction (Y-axis direction), and the third direction (Z-axis direction) to the main processor 710.

The gyro sensor 750 may sense angular velocity in the first direction (X-axis direction), the second direction (Y-axis direction), and the third direction (Z-axis direction). The gyro sensor 750 may output angular velocity data including angular velocity information in the first direction (X-axis direction), the second direction (Y-axis direction), and the third direction (Z-axis direction) to the main processor 710.

The proximity sensor 760 is a sensor for detecting whether an object is located close to the front surface of the display device 10. The proximity sensor 760 may include a light source that outputs light and a light receiver that receives light reflected by an object (e.g., an object that is in proximity to the front surface of the display device 10). The proximity sensor 760 may determine whether an object located close to the front surface of the display device 10 exists according to the amount of light reflected by the object. The proximity sensor 760 may generate proximity sensor data and output the proximity sensor data to the main processor 710 according to whether an object located close to the front surface of the display device 10 exists.

The cable 314 having passed through the cable hole CAH of the bracket 600 may be connected to the main connector 711, and thus the main circuit board 700 may be electrically connected to the display circuit board 310.

The lower cover 900 may be disposed under the main circuit board 700 and the battery 790. The lower cover 900 may be engaged and fixed to the bracket 600. The lower cover 900 may form a lower surface appearance of the display device 10. The lower cover 900 may include plastic, metal, or both plastic and metal.

The lower cover 900 may be provided with a second camera hole CMH2 through which the lower surface of the camera device 731 is exposed to outside. The position of the camera device 731 and the positions of the first and second camera holes CMH1 and CMH2 corresponding to the camera device 731 may not be limited to the embodiment shown in FIG. 2.

Figure 3:
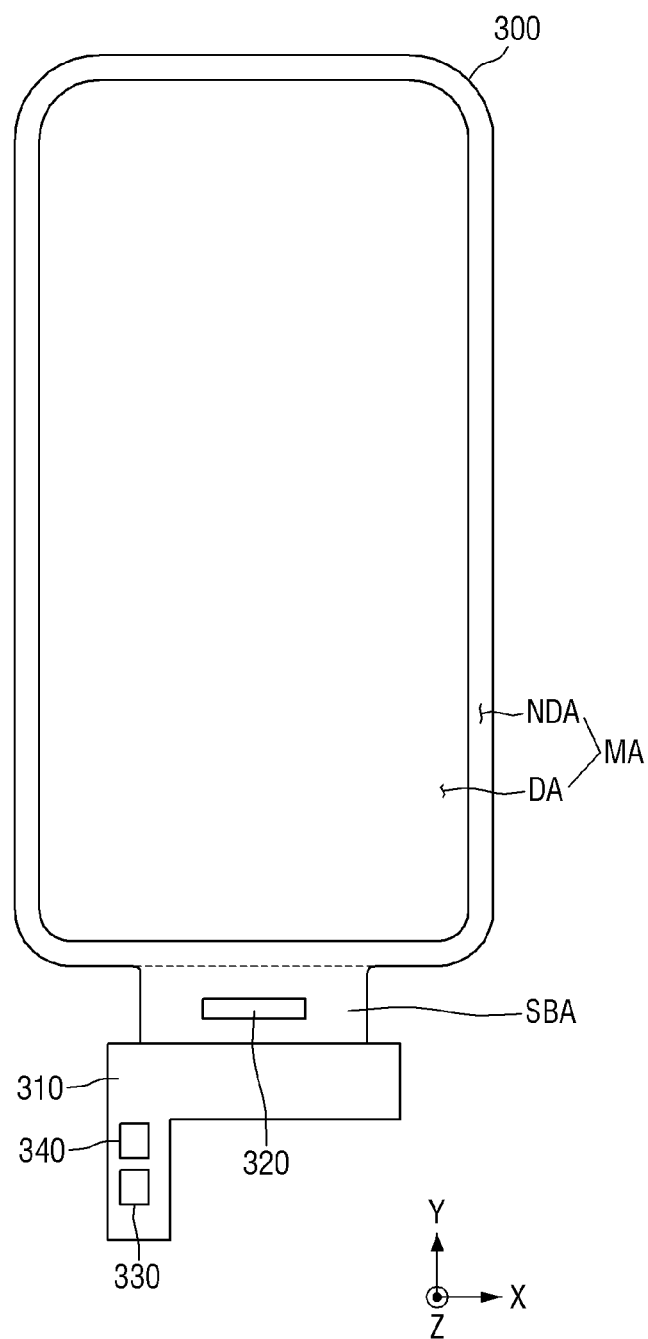
FIGS. 3 and 4 are plan views of a display panel according to one or more embodiments.
Figure 4:
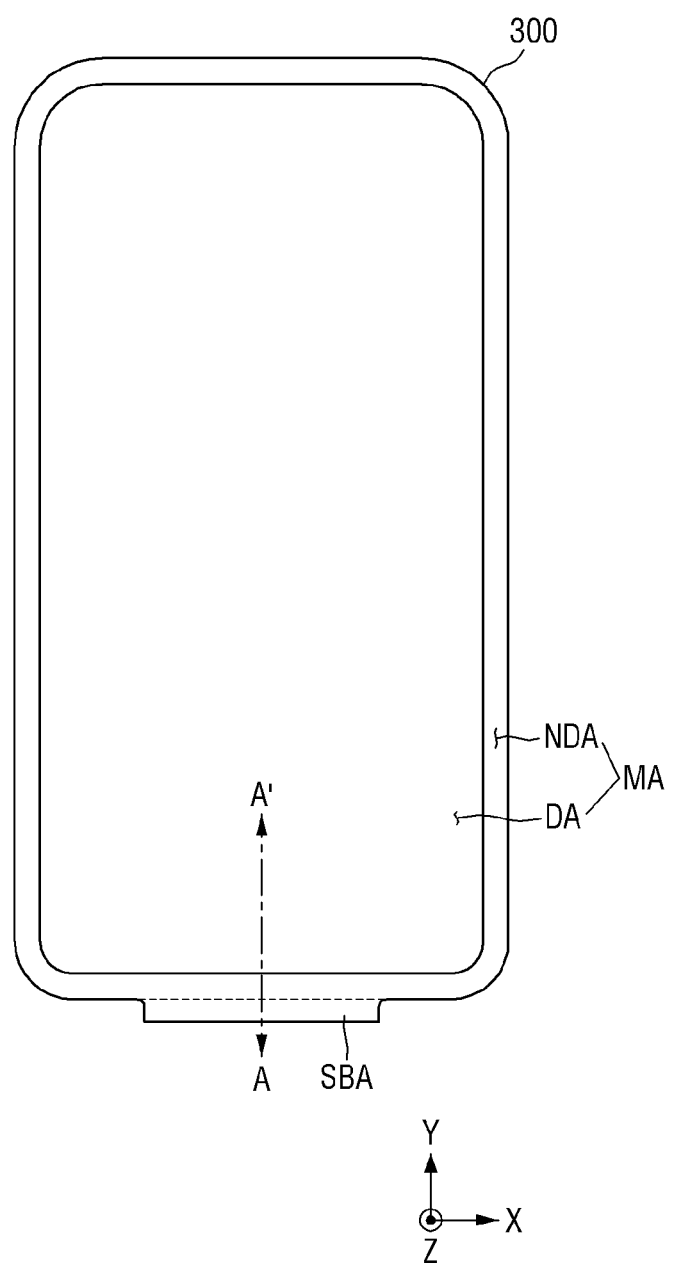

FIGS. 3 and 4 are plan views of a display panel according to one or more embodiments of the present disclosure. FIG. 3 shows a plan view of the display panel 300 when the sub-area SBA is unfolded without being bent, and FIG. 4 shows a plan view of the display panel 300 when the sub-area SBA is bent downward.

Referring to FIGS. 3 and 4, the display panel 300 may include a main area MA and a sub-area SBA. The main area MA may include a display area DA in which display pixels are arranged (e.g., in a matrix form) to display an image, and a non-display area NDA which does not display an image as a peripheral area of the display area DA. For example, the non-display area NDA may surround the display area DA along the periphery of the display area DA.

The sub-area SBA may protrude from one side of the main area MA in the second direction (Y-axis direction). As shown in FIG. 4, the length of the sub-area SBA in the first direction (X-axis direction) may be smaller than the length of the main area MA in the first direction (X-axis direction), and the length of the sub-area SBA in the second direction (Y-axis direction) may be smaller than the length of the main area MA in the second direction (Y-axis direction), but the present disclosure is not limited thereto. The sub-area SBA may be bent, and may be disposed on the lower surface of the substrate SUB. The sub-area SBA may overlap the main area MA in the third direction (Z-axis direction) which is the thickness direction of the substrate SUB.

The display circuit board 310 and the display driving circuit 320 may be disposed in the sub-area SBA. The display circuit board 310 may be disposed on pads disposed at one side of the sub-area SBA. The display circuit board 310 may be attached to pads of the sub-area SBA using an anisotropic conductive film.

In one or more embodiments, although it is illustrated in FIG. 3 that the display driving circuit 320 is disposed on the display panel 300, and the touch driving circuit 330 and the antenna driving circuit 340 are disposed on the display circuit board 310, the present disclosure is not limited thereto. For example, all of the display driving circuit 320, the touch driving circuit 330, and the antenna driving circuit 340 may be disposed on the display circuit board 310. In one or more embodiments, as shown FIGS. 36 and 37, the display driving circuit 320 may be disposed on the display panel 300, the touch driving circuit 330 may be disposed on the display circuit board 310, and the antenna driving circuit 340 may be disposed on the antenna circuit board 360. In one or more embodiments, the display driving circuit 320 and the touch driving circuit 330 may be disposed on the display circuit board 310, and the antenna driving circuit 340 may be disposed on the antenna circuit board 360. In one or more embodiments, the touch driving circuit 330 may be disposed on the display circuit board 310, and the display driving circuit 320 and the antenna driving circuit 340 may be disposed on the antenna circuit board 360.

Figure 5A:
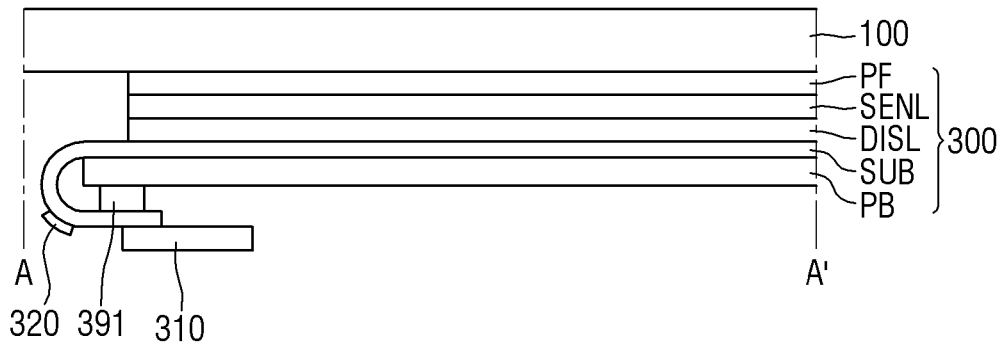
FIG. 5A is a cross-sectional view illustrating a cover window and a display panel according to one or more embodiments.

FIG. 5A is a cross-sectional view illustrating a cover window and a display panel according to one or more embodiments. FIG. 5A shows a cross-sectional view of the display panel 300 when the sub-area SBA is bent as shown in FIG. 4 to be disposed on the lower surface of the display panel 300.

Referring to FIG. 5A, the display panel 300 may include a substrate SUB, a display layer DISL, a sensor electrode layer SENL, a polarizing film PF, and a panel lower cover PB.

The substrate SUB may be made of an insulating material such as glass, quartz, or a polymer resin. The substrate SUB may be a rigid substrate or may be a flexible substrate capable of bending, folding, rolling, or the like.

A display layer DISL may be disposed on the main area MA of the substrate SUB. The display layer DISL may be a layer in which display pixels are provided to display an image. Further, the display layer DISL may be a layer in which sensor pixels are provided to sense light incident from the outside. The display layer DISL may include a thin film transistor (TFT) layer in which thin film transistors are formed, a light emitting element layer in which light emitting elements are formed to emit light, and an encapsulation layer for encapsulating the light emitting element layer.

In the display area DA of the display layer DISL, not only display pixels but also scan lines, data lines, and power lines, which are connected to the display pixels, may be arranged. In the non-display area NDA of the display layer DISL, a scan driver, fanout lines, and the like may be arranged. The scan lines may be connected to a scan driver, and the fanout lines may connect the data lines and the display driving circuit 320.

A sensor electrode layer SENL may be disposed on the display layer DISL. The sensor electrode layer SENL may include sensor electrodes and may be a layer for sensing a touch.

The sensor electrode layer SENL may include a touch sensing area and a touch peripheral area. The touch sensing area may be an area in which sensor electrodes are disposed to sense a touch input. The touch peripheral area is an area in which sensor electrodes are not disposed, and may be arranged to surround the touch sensing area. The touch peripheral area may be an area from the outside of the touch sensing area to the edge of the display panel 300. Sensor electrodes and sensor lines may be arranged in the touch sensing area. Pads may be arranged in the touch peripheral area.

The touch sensing area of the sensor electrode layer SENL may be substantially the same as the display area DA of the display panel 300. The touch peripheral area of the sensor electrode layer SENL may be substantially the same as the non-display area NDA of the display panel 300.

A polarizing film PF may be disposed on the sensor electrode layer SENL. The polarizing film PF may include a first base film, a phase retardation film, a linear polarizing plate, and a second base film, which are sequentially stacked. Each of the first base film and the second base film may be a tri-acetyl-cellulose film (TAC film), and the phase retardation film may include at least one of a quarter-wave plate ($\lambda/4$ plate) and a half-wave plate ($\lambda/2$ plate).

In one or more embodiments, the sensor electrode layer SENL and the polarizing film PF may be integrally formed. In this case, the sensor electrode layer SENL may be disposed between the first base film and the phase retardation film.

A cover window 100 may be disposed on the polarizing film PF. The cover window 100 may be attached onto the polarizing film PF by a transparent adhesive member such as an optically clear adhesive (OCA).

A panel lower cover PB may be disposed under the display panel 300. The panel lower cover PB may be attached to the lower surface of the display panel 300 through an adhesive member. The adhesive member may be a pressure sensitive adhesive (PSA). The panel lower cover PB may include at least one of a light blocking member for absorbing light incident from the outside, a buffer member for absorbing shock from the outside, and a heat radiation member for efficiently radiating heat from the display panel 300.

The light blocking member may be disposed under the display panel 300. The light blocking member may block the transmission of light, to prevent components disposed under the light blocking member, for example, the display circuit board 310 and the like, from being viewed from the top of the display panel 300. The light blocking member may include a light absorbing material such as a black pigment or a black dye.

The buffer member may be disposed under the light absorbing member. The buffer member absorbs an external impact to prevent or protect the display panel 300 from being damaged. The buffer member may be formed as a single layer or a plurality of layers. For example, the buffer member may be formed of a polymer resin such as polyurethane, polycarbonate, polypropylene, or polyethylene, or may be formed of an elastic material such as a rubber, a urethane material, or a sponge formed by foaming an acrylic material. The buffer member may be a cushion layer.

The heat radiation member may be disposed under the buffer member. The heat radiation member may include a first heat radiation layer including graphite or carbon nanotubes and a second heat radiation layer capable of blocking electromagnetic waves and formed of a metal thin film of copper, nickel, ferrite or silver having excellent thermal conductivity.

The sub-area SBA of the substrate SUB may be bent, and thus may be disposed on the lower surface of the display panel 300. The sub-area SBA of the substrate SUB may be attached to the lower surface of the panel lower cover PB by an adhesive layer 391. The adhesive layer 391 may be a pressure sensitive adhesive layer.

Figure 5B:
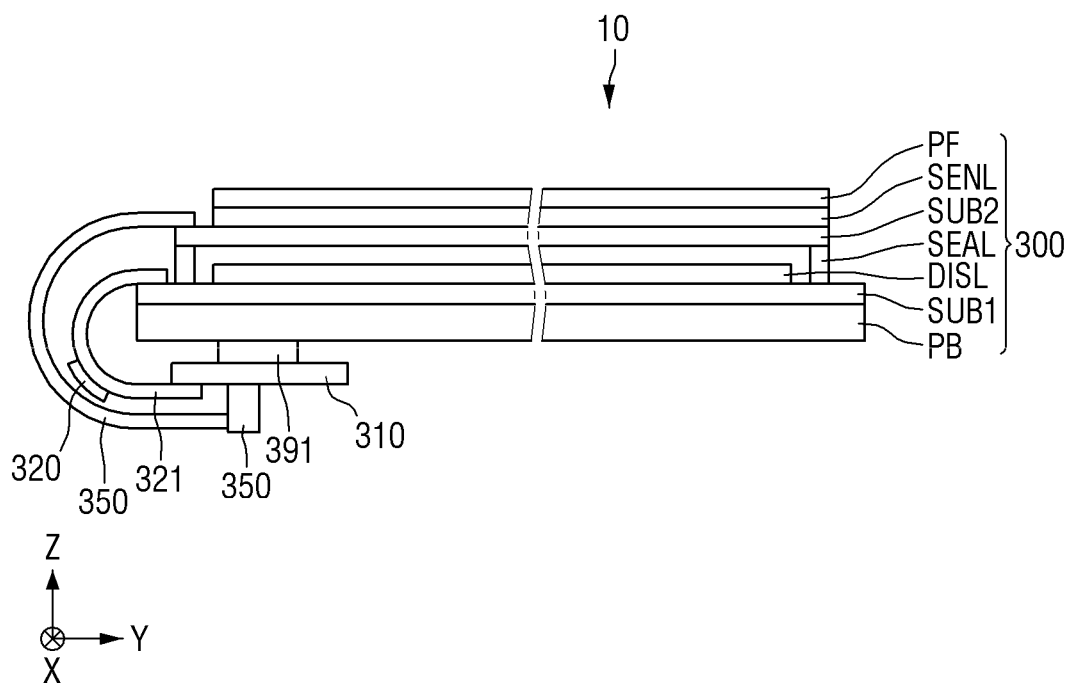
FIG. 5B is a cross-sectional view illustrating a cover window and a display panel according to one or more embodiments.

FIG. 5B is a cross-sectional view illustrating a cover window and a display panel according to one or more embodiments.

Referring to FIG. 5B, the display panel 300 may include a first substrate SUB1, a display layer DISL, an adhesive member SEAL, a second substrate SUB2, a sensor electrode layer SENL, a polarizing film PF, and a panel lower cover PB.

The adhesive member SEAL may attach the first substrate SUB1 to the second substrate SUB2. The adhesive member SEAL may be disposed on edges of the first substrate SUB1 and the second substrate SUB2 to surround the display layer DISL. The adhesive member SEAL may be a frit adhesive layer, an ultraviolet curing resin layer, or a thermosetting resin layer, but is not limited thereto.

The second substrate SUB2 may be made of an insulating material such as glass, quartz, or a polymer resin. The second substrate SUB2 may be a rigid substrate or may be a flexible substrate capable of bending, folding, rolling, and the like.

The sensor electrode layer SENL may be disposed on the second substrate SUB2. The sensor electrode layer SENL may include sensor electrodes. The sensor electrode layer SENL may be a layer for sensing a touch using sensor electrodes.

The polarizing film PF may be disposed on the sensor electrode layer SENL. In one or more embodiments, the sensor electrode layer SENL and the polarizing film PF may be integrally formed.

The touch circuit board 350 may be attached to the upper surface of the second substrate SUB2 using an anisotropic conductive film or a low-resistance high-reliability material such as SAP. The touch circuit board 350 may be bent, and may be disposed under the display panel 300. The touch circuit board 350 may be connected to a connector of the display circuit board 310. Thus, the touch circuit board 350 may be electrically connected to the touch driving circuit 330 and the antenna driving circuit 340.

The sensor electrode layer SENL may be disposed on the display layer DISL as shown in FIG. 2, or may be disposed on the second substrate SUB2 as shown in FIG. 3. Hereinafter, for convenience of description, a case where the sensor electrode layer SENL is disposed on the display layer DISL will be mainly described.

FIG. 6 is a layout view illustrating a sensor electrode layer of a display panel according to one or more embodiments.

Referring to FIG. 6, the sensor electrode layer SENL includes sensor electrodes SE and sensor lines SL, and each of the sensor electrodes SE may be driven by a self-capacitance method in which a voltage charged in self-capacitance is sensed.

The sensor electrodes SE may be electrically separated from each other. The sensor electrodes SE may be disposed to be spaced from each other. The sensor electrodes SE may be arranged in a matrix form in the first direction (X-axis direction) and the second direction (Y-axis direction).

The sensor electrodes SE may be connected one-to-one to the sensor lines SL. The sensor lines SL may be connected one-to-one to the sensor pads TP. For example, any one of the sensor lines SL may connect to one of the sensor electrodes SE and one of the sensor pads TP.

Although it is illustrated that each of the sensor electrodes SE has a rectangular planar shape, the present disclosure is not limited thereto. In order for the sensor electrode SE to be used as an antenna for 5G mobile communication, the length of the sensor electrode SE in the first direction (X-axis direction) and the length of the sensor electrode SE in the second direction (Y-axis direction) may be approximately 2.5 mm to 4.5 mm, respectively. The length of the sensor electrode SE in the first direction (X-axis direction) and the length of the sensor electrode SE in the second direction (Y-axis direction) may be changed depending on the frequency band for transmission and reception and the material of the sensor electrode SE.

Each of the sensor electrodes SE may be connected to the sensor line SL in a sensor contact unit SCNT. Although it is illustrated in FIG. 6 that each of the sensor electrodes SE may be connected to the sensor line SL in one sensor contact unit SCNT, the present disclosure is not limited thereto. Each of the sensor electrodes SE may be connected to the sensor line SL in a plurality of sensor contact units SCNT.

The sensor lines SL may extend in the second direction (Y-axis direction). The sensor lines SL may overlap the at least one sensor electrode SE in the third direction (Z-axis direction).

A ground voltage may be applied to a first ground line GRL1 and a second ground line GRL2. The first ground line GRL1 may be disposed in the sensor peripheral area TPA at the left side of the sensor area TSA and in the sensor peripheral area TPA at the upper side of the sensor area TSA. The second ground line GRL2 may be disposed in the sensor peripheral area TPA at the right side of the sensor area TSA.

The sensor pad area SPA in which the sensor pads TP are arranged may be disposed at one end of the sub area SBA. The sensor pads TP may be connected one-to-one to bumps in a bump area BP of the display circuit board 310. The sensor pads TP may be electrically connected to the bumps of the display circuit board 310 using an anisotropic conductive film.

The display circuit board 310 may include a radio signal connection unit RFC. The radio signal connection unit RFC may provide touch sensing signals and radio reception signals of the sensor electrodes SE to the touch driving circuit 330 and the antenna driving circuit 340.

As shown in FIG. 6, the sensor electrodes SE may be electrically connected to the touch driving circuit 330 and the antenna driving circuit 340 of the display circuit board 310 through the sensor lines SL, the sensor pads TP, the bumps in the bump area BP, and the radio signal connection unit RFC. Therefore, the touch driving circuit 330 may apply a touch driving signal to each of the sensor electrodes SE, and may sense a voltage charged in the self-capacitance of each of the sensor electrodes SE. Further, the antenna driving circuit 340 may sense a radio reception signal received from each of the sensor electrodes SE, and transmit a radio transmission signal to each of the sensor electrodes SE, thereby radiating radio signals.

The display circuit board 310 may include the radio signal connection unit RFC for providing the touch sensing signals and the radio reception signals of the sensor electrodes SE to the touch driving circuit 330 and the antenna driving circuit 340, thereby not only sensing a user's touch using the sensor electrodes SE but also conducting mobile communication using the sensor electrodes SE. For example, sensor electrodes for sensing a touch may be used as an antenna.

In one or more embodiments, the antenna driving circuit 340 may select antenna electrodes ASE from the sensor electrodes SE and output radio transmission signals to the antenna electrodes ASE, rather than outputting radio transmission signals to all of the sensor electrodes SE. A method for transmitting and receiving radio signals of the antenna driving circuit 340 will be described later with reference to FIG. 9.

Figure 7:
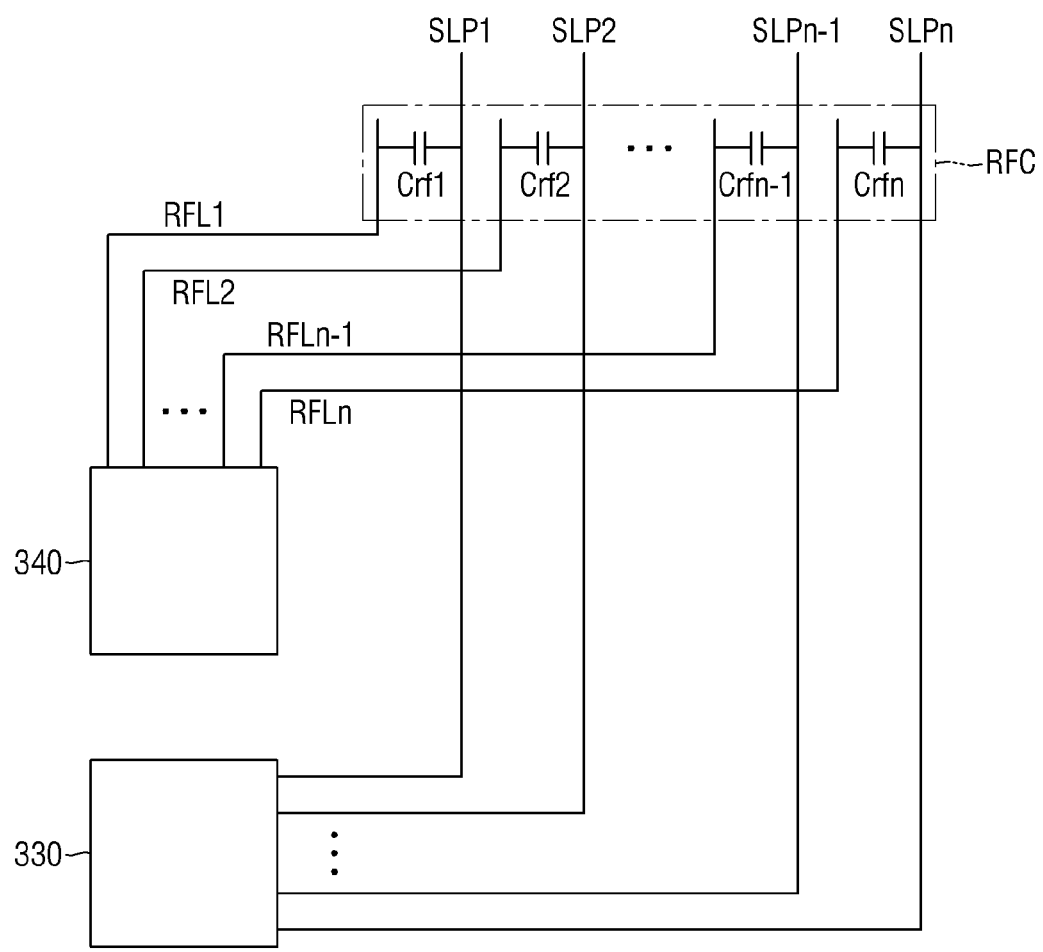
FIG. 7 is a circuit diagram specifically illustrating the radio signal connection unit of FIG. 6.

FIG. 7 is a circuit diagram specifically illustrating the radio signal connection unit of FIG. 6.

Referring to FIG. 7, the display circuit board 310 may include sensor circuit lines SLP1 to SLPn, radio signal lines RFL1 to RFLn, and coupling capacitors Crf1 to Crfn of the radio signal connection unit RFC.

One end of each of the sensor circuit lines SLP1 to SLPn may be connected to any one of the bumps of the bump area BP of FIG. 6 (and also to one electrode of any one of the coupling capacitors Crf1 to Crfn as shown in FIG. 7), and the other end thereof may be connected to the touch driving circuit 330. Because the sensor circuit lines SLP1 to SLPn are connected to the pads TP of the display panel 300 through the bumps, the sensor circuit lines SLP1 to SLPn may be electrically connected to the sensor electrodes SE and the sensor lines SL of the display panel 300.

One end of each of the radio signal lines RFL1 to RFLn may be connected to one electrode of any one of the coupling capacitors Crf1 to Crfn, and the other end thereof may be connected to the antenna driving circuit 340.

Each of the coupling capacitors Crf1 to Crfn may be a capacitor formed by overlapping lines or adjacent lines, or may be a capacitor formed as a separate physical circuit element. One electrode of each of the coupling capacitors Crf1 to Crfn may be connected to any one of the radio signal lines RFL1 to RFLn, and the other electrode thereof may be connected to any one of the sensor circuit lines SLP1 to SLPn. For example, the first coupling capacitor Crf1 may be formed between the first radio signal line RFL1 and the first sensor circuit line SLP1. The second coupling capacitor Crf2 may be formed between the second radio signal line RFL2 and the second sensor circuit line SLP2. The n−1th coupling capacitor Crfn−1 may be formed between the n−1th radio signal line RFLn−1 and the n−1th sensor circuit line SLPn−1. The n-th coupling capacitor Crfn may be formed between the n-th radio signal line RFLn and the n-th sensor circuit line SLPn.

The touch sensing signals and radio reception signals of the sensor electrodes SE electrically connected to the sensor circuit lines SLP1 to SLPn may be coupled to the radio signal lines RFL1 to RFLn by coupling capacitors Crf1 to Crfn. Thus, even when the antenna driving circuit 340 is not directly connected to the sensor circuit lines SLP1 to SLPn, the antenna driving circuit 340 may receive the touch sensing signals and radio reception signals of the sensor electrodes SE.

Further, the radio transmission signals of the radio signal lines RFL1 to RFLn output from the antenna driving circuit 340 may be coupled to the sensor circuit lines SLP1 to SLPn by coupling capacitors Crf1 to Crfn. Thus, even when the sensor circuit lines SLP1 to SLPn are not directly connected to the antenna driving circuit 340, the sensor circuit lines SLP1 to SLPn may transmit radio transmission signals to the sensor electrodes SE.

As shown in FIG. 7, because the coupling capacitors Crf1 to Crfn are formed between the sensor circuit lines SLP1 to SLPn and the radio signal lines RFL1 to RFLn, the signals of the sensor circuit lines SLP1 to SLPn may be coupled to the radio signal lines RFL1 to RFLn by the coupling capacitors Crf1 to Crfn, and the signals of the radio signal lines RFL1 to RFLn may be coupled to the sensor circuit lines SLP1 to SLPn by the coupling capacitors Crf1 to Crfn.

Figure 8:
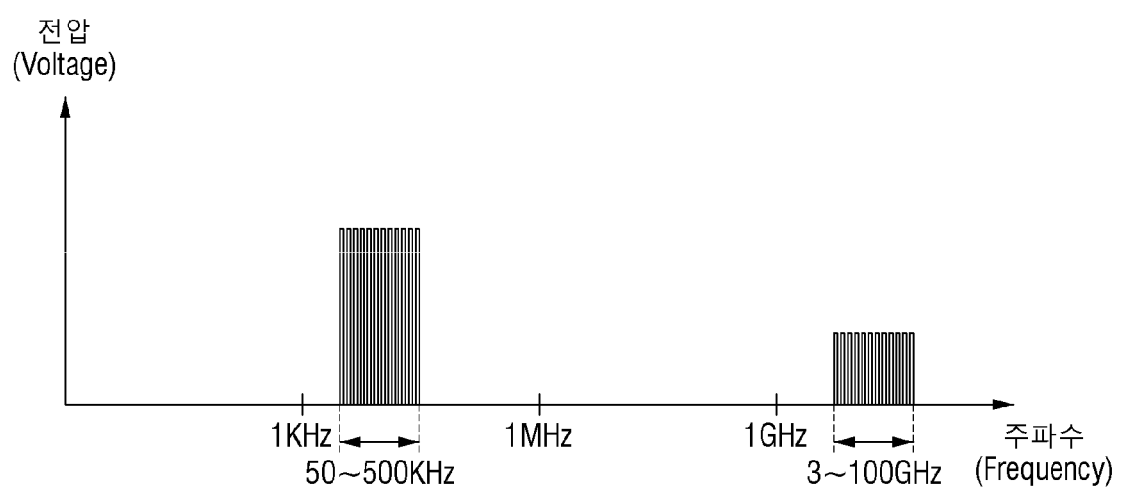
FIG. 8 is an example view illustrating a frequency of a touch driving signal applied to a sensor electrode according to one or more embodiments and a frequency of a radio signal.

FIG. 8 is an example view illustrating a frequency of touch driving signals and touch sensing signals applied to a sensor electrode and a frequency radio transmission signals and radio reception signals according to one or more embodiments of the present disclosure.

Referring to FIG. 8, touch driving signals and touch sensing signals have a frequency of about 50 kHz to 500 kHz. In contrast, radio transmission signals and radio reception signals for fifth-generation (5G) mobile communication may have a frequency of 3 GHz to 100 GHz. For example, the touch driving signals and the touch sensing signals have a frequency of 1 MHz or less, whereas the radio transmission signals and radio reception signals for fifth-generation (5G) mobile communication may have a frequency of 1 GHz or more. Therefore, the touch driving circuit 330 for transmitting and receiving touch driving signals and touch sensing signals having a frequency of 1 MHz or less and the antenna driving circuit 340 for transmitting and receiving radio transmission signals and radio reception signals having a frequency of 1 GHz or more is capable of frequency division duplex.

The touch driving circuit 330 may include a low pass filter that passes only signals having a frequency of 1 MHz or less from among the signals received from the sensor circuit lines SLP1 to SLPn, or may include a band pass filter that selects and filters only the required frequency band. In this case, the touch driving circuit 330 may stably receive touch sensing signals having a frequency of 1 MHz or less because the radio transmission signals and radio reception signals having a frequency of 1 GHz or more are attenuated.

Further, the antenna driving circuit 340 may include a high pass filter that passes only signals having a frequency of 1 MHz or more or 1 GHz or more from among the signals received from the radio signal lines RFL1 to RFLn, or may include a band pass filter that selects and filters only the required frequency band. In this case, the antenna driving circuit 340 may stably receive radio reception signals having a frequency of 1 MHz or more or 1 GHz or more because the touch driving signals and touch sensing signals having a frequency of 1 MHz or less are attenuated.

The antenna driving circuit 340 may perform a function of selecting antenna electrodes ASE to transmit and receive electromagnetic waves from among the sensor electrodes SE. In this case, the antenna driving circuit 340 may select the antenna electrodes ASE from among the sensor electrodes SE in consideration of (or based on) reception sensitivity, the positions of the sensor electrodes SE, and the inclination degree of the display device 10. Hereinafter, a method of selecting the antenna electrodes ASE from the sensor electrodes SE by the antenna driving circuit 340 will be described in detail with reference to FIGS. 9-18.

Figure 9:
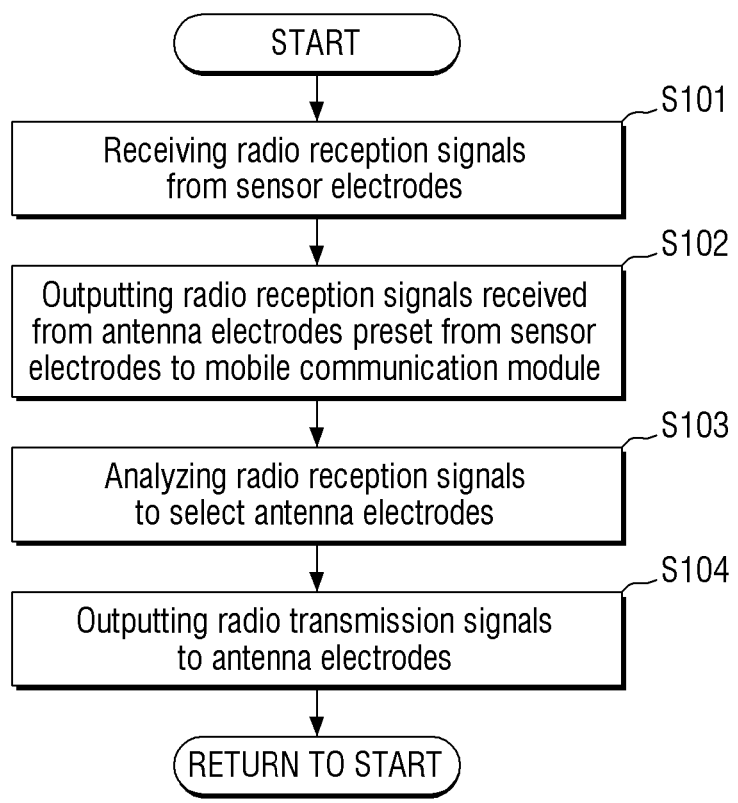
FIG. 9 is a flowchart illustrating a method of transmitting and receiving a radio signal according to one or more embodiments.

FIG. 9 is a flowchart illustrating a method of transmitting and receiving a radio signal according to one or more embodiments.

Referring to FIG. 9, first, the antenna driving circuit 340 receives radio reception signals from the sensor electrodes SE (S101 in FIG. 9).

Radio reception signals of the sensor electrodes SE may be transmitted to the sensor circuit lines SLP1 to SLPn of the display circuit board 310 through the sensor lines SL and the sensor pads TP. The radio reception signals of the sensor circuit lines SLP1 to SLPn may be coupled to the radio signal lines RFL1 to RFLn by coupling capacitors Crf1 to Crfn. The antenna driving circuit 340 may receive the radio reception signals via the radio signal lines RFL1 to RFLn coupled to the sensor circuit lines SLP1 to SLPn.

Figure 10:
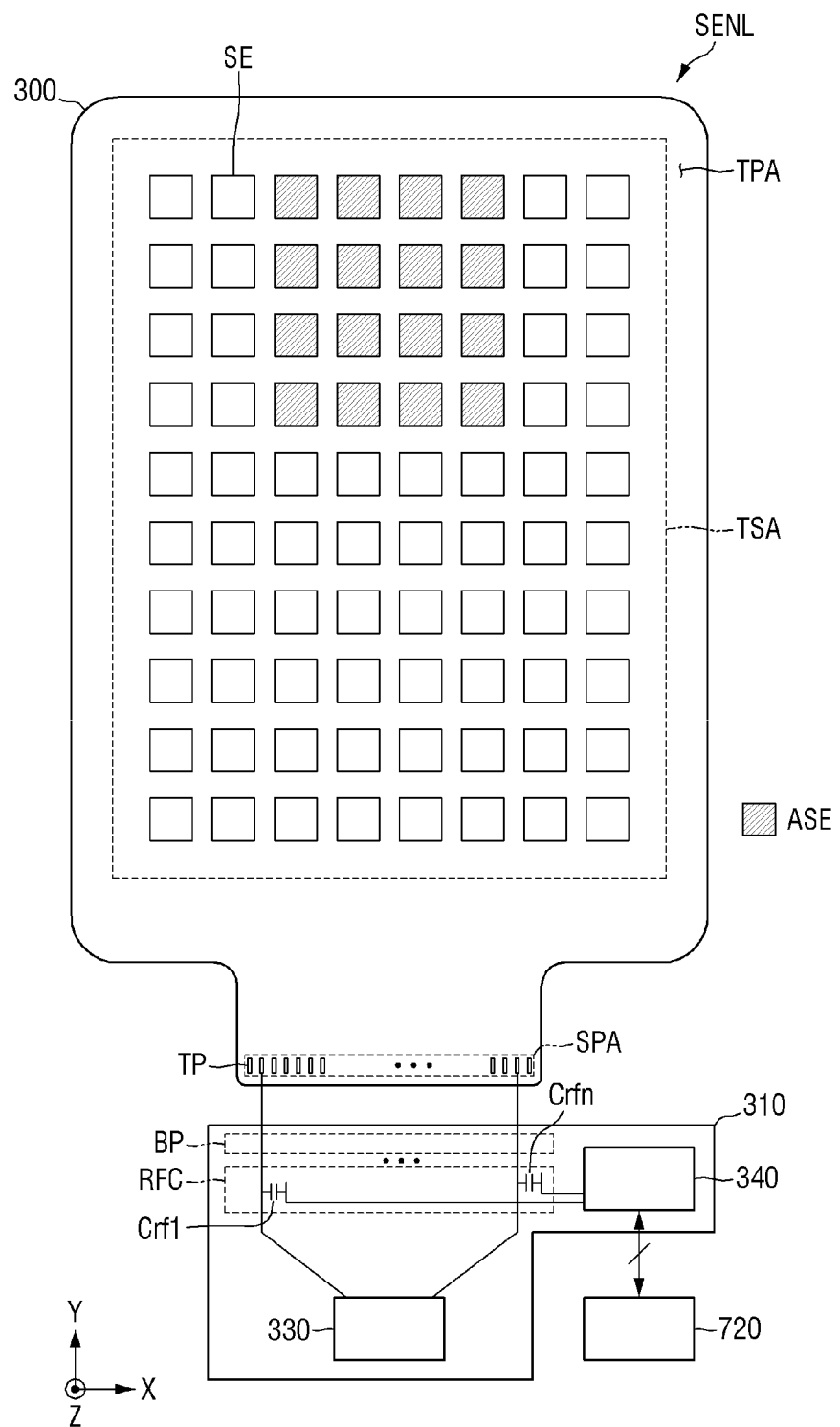
FIG. 10 is a layout view illustrating antenna electrodes for transmitting and receiving a radio signal according to one or more embodiments.

Second, the antenna driving circuit 340 outputs the radio reception signals of the antenna electrodes SE to the mobile communication module 720 (e.g., as shown in FIG. 10) (S102 in FIG. 9).

The antenna driving circuit 340 may preset antenna electrodes ASE to be used as an antenna from among the sensor electrodes SE as in step S103 before performing radio communication. The antenna electrode ASE may be an electrode that transmits electromagnetic waves according to the radio transmission signal and receives electromagnetic waves according to the radio reception signal. Therefore, the sensor electrode SE may be defined as an electrode that receives a touch driving signal for touch sensing, and the antenna electrode ASE may be defined as an electrode that not only receives a touch driving signal for touch sensing but also receives a radio transmission signal for mobile communication to emit electromagnetic waves.

Figure 11:
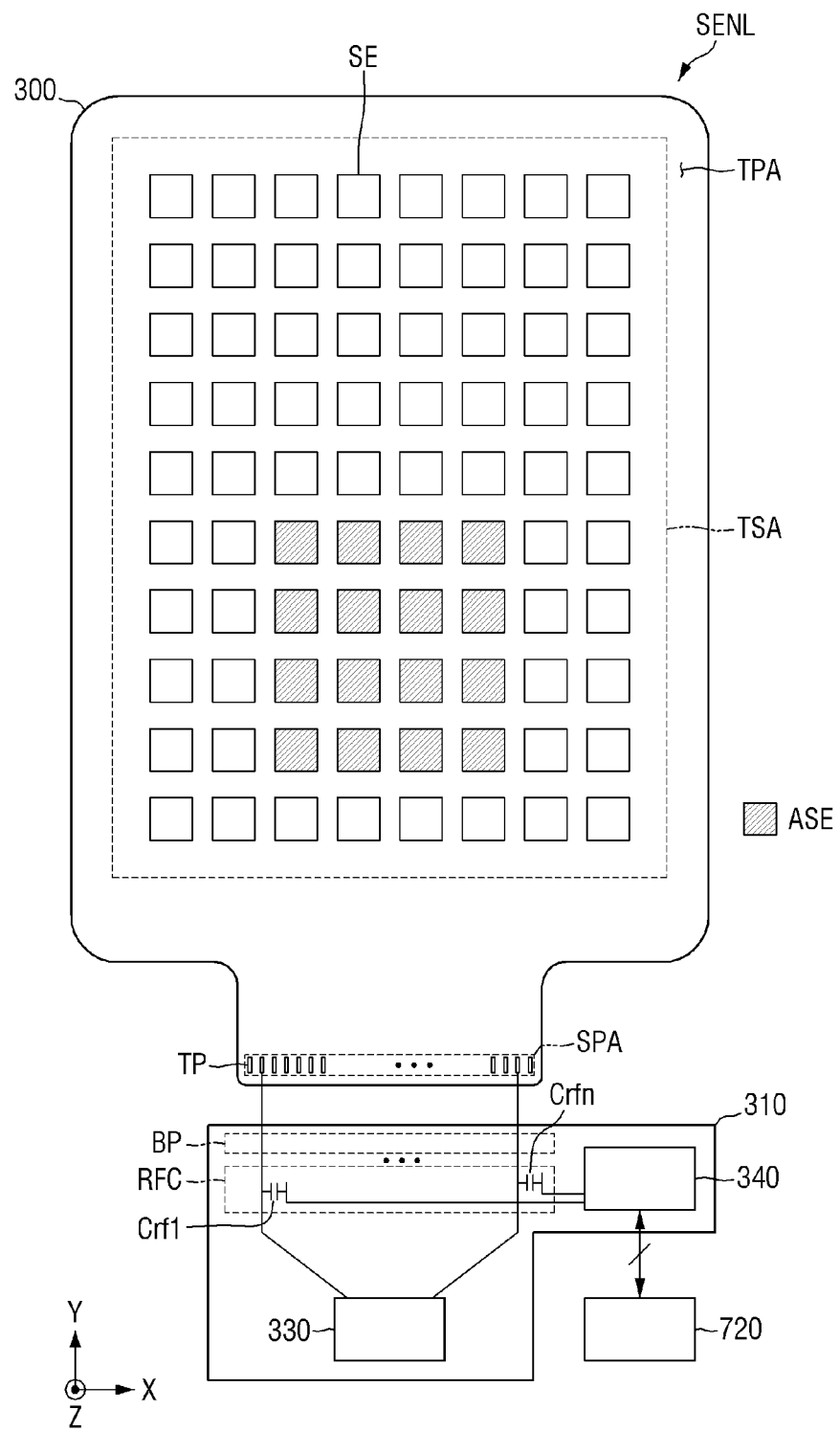
FIG. 11 is a layout view illustrating antenna electrodes for transmitting and receiving a radio signal according to one or more embodiments.

The sensor area TSA includes I×J sensor electrodes SE, and some of the sensor electrodes SE may serve as an antenna electrode ASE. For example, the sensor electrodes SE may include P×Q antenna electrodes ASE (P is a positive integer less than I, and Q is a positive integer less than J) as shown in FIGS. 10 and 11. For example, as shown in FIG. 10, the sensor area TSA may include 8×10 sensor electrodes SE, and 4×4 sensor electrodes SE from among the sensor electrodes SE may serve as an antenna electrode ASE.

Figure 12:
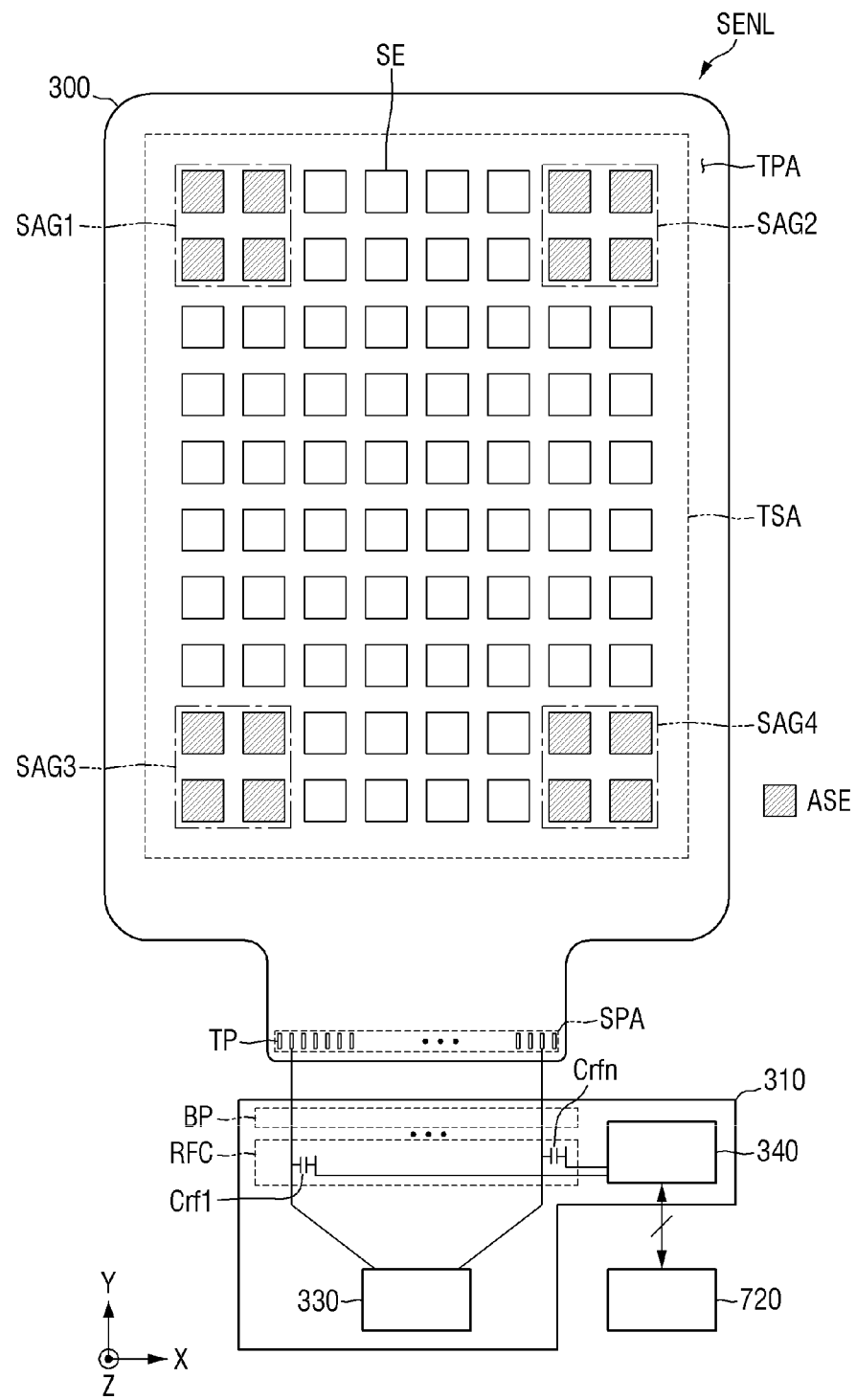
FIG. 12 is a layout view illustrating antenna electrodes for transmitting and receiving a radio signal according to one or more embodiments.
Figure 13:
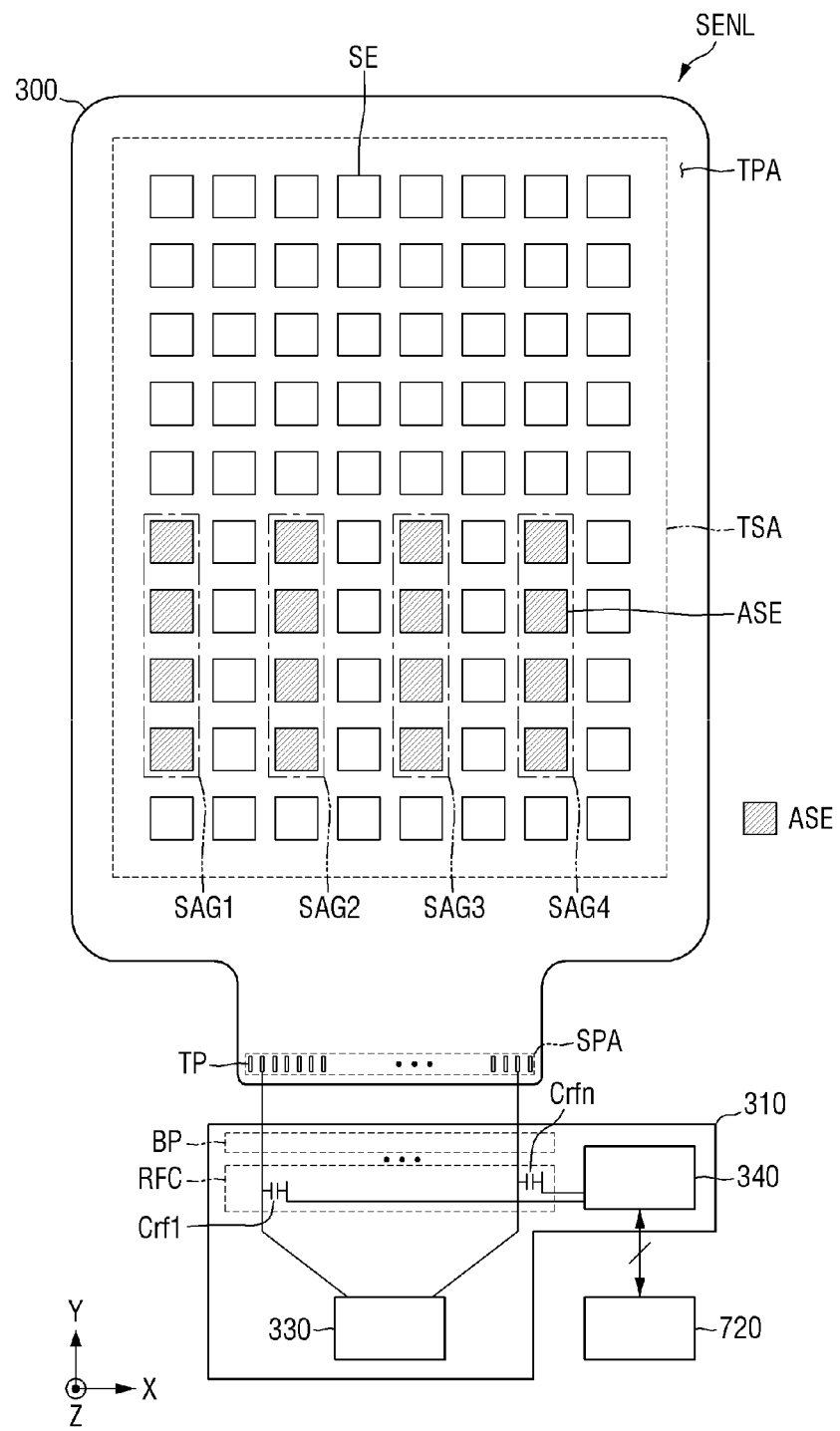
FIG. 13 is a layout view illustrating antenna electrodes for transmitting and receiving a radio signal according to one or more embodiments.
Figure 14:
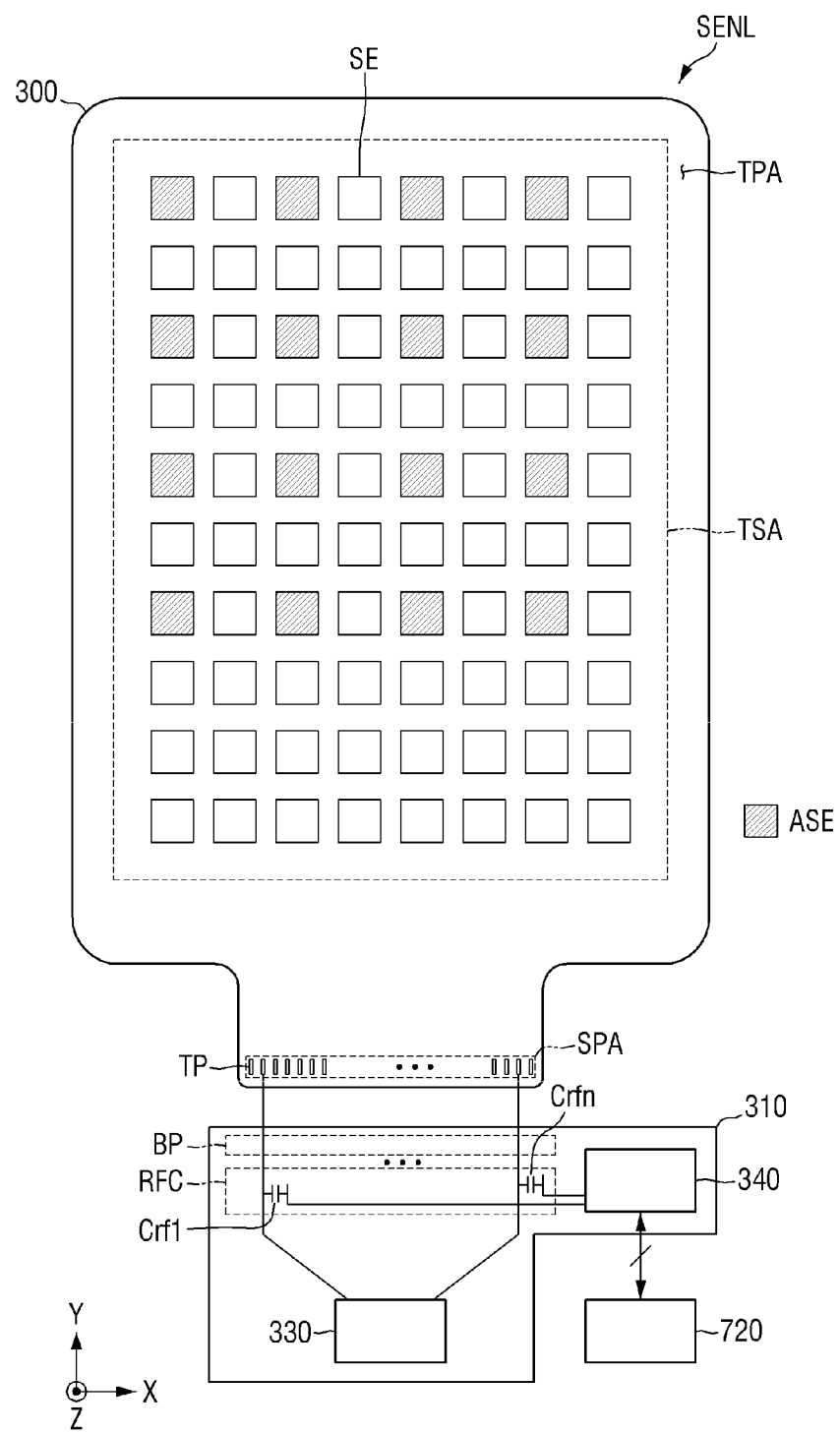
FIG. 14 is a layout view illustrating antenna electrodes for transmitting and receiving a radio signal according to one or more embodiments.

In one or more embodiments, the sensor electrodes SE may include a plurality of sub-antenna electrode groups SAG1 to SAG4 as shown in FIGS. 12-14. Each of the plurality of sub-antenna electrode groups SAG1 to SAG4 may include a plurality of antenna electrodes ASE.

The antenna driving circuit 340 may change the frequency of each of the radio reception signals of the antenna electrodes ASE and amplify the amplitude to output these radio reception signals to the mobile communication module 720 as shown in FIG. 10. The antenna driving circuit 340 may change the phase of each of the radio reception signals of the antenna electrodes ASE.

Third, the antenna driving circuit 340 analyzes radio reception signals to select antenna electrodes ASE. (S103 in FIG. 9).

The antenna driving circuit 340 may analyze radio reception signals of all sensor electrodes SE to select antenna electrodes ASE to be used as an antenna. For example, the antenna driving circuit 340 may select the antenna electrodes ASE in consideration of (or based on) the reception sensitivity or quality of radio reception signals of all the sensor electrodes SE. It may be seen that as the reception sensitivity of the radio reception signals increases, the antenna driving circuit 340 was placed in the most suitable location to communicate with an external base station. Therefore, the antenna driving circuit 340 may select sensor electrodes SE receiving radio reception signals having high reception sensitivity from among the radio reception signals, as antenna electrodes ASE. The radio reception signals having high reception sensitivity may indicate radio reception signals of relatively strong intensity.

Fourth, radio transmission signals are output to the antenna electrodes ASE. (S104 in FIG. 9)

The antenna driving circuit 340 may receive radio transmission signals from the mobile communication module 720 as shown in FIG. 10 and change the frequency of the radio transmission signals to output the selected antenna electrodes ASE. Therefore, electromagnetic waves may be emitted to the external base station through the selected antenna electrodes ASE.

As shown in FIG. 9, the antenna driving circuit 340 selects sensor electrodes SE having optimum reception sensitivity from among the sensor electrodes SE as antenna electrodes ASE and uses these antenna electrodes ASE as an antenna that emits electromagnetic waves, thereby improving the performance of the antenna of the display device.

In one or more embodiments, although it is illustrated in FIG. 9 that the antenna driving circuit 340 continuously repeats steps S101 to S104, the present disclosure is not limited thereto. For example, only when the mobile communication module 720 or the antenna driving circuit 340 determines that the sensitivity or quality of the radio reception signals received by the antenna electrodes ASE is low, step S103 is performed to select antenna electrodes ASE to be used as an antenna.

Hereinafter, embodiments of the sensor electrodes SE and the antenna electrodes ASE will be described with reference to FIGS. 10-14. FIGS. 10-14 are example views showing antenna electrodes ASE selected from among sensor electrodes SE as in step S103 to increase the sensitivity or quality of the radio reception signals.

FIG. 10 is a layout view showing sensor electrodes and antenna electrodes according to one or more embodiments of the present disclosure.

For convenience of description, although it is shown in FIG. 10 that the sensor area TSA includes 8×10 sensor electrodes SE, but the present disclosure is not limited thereto.

Referring to FIG. 10, the sensor electrodes SE may be arranged in a matrix form along the first direction (X-axis direction) and the second direction (Y-axis direction). I (e.g., I is a positive integer) sensor electrodes SE may be arranged in parallel in the first direction (X-axis direction), and J (e.g., J is a positive integer) sensor electrodes SE may be arranged in parallel in the second direction (Y-axis direction). For example, as shown in FIG. 10, eight sensor electrodes SE may be arranged in parallel in the first direction (X-axis direction), and ten sensor electrodes SE may be arranged in parallel in the second direction (Y-axis direction).

The sensor electrodes SE may include P×Q antenna electrodes ASE. The antenna electrodes ASE may be arranged in a matrix form in the first direction (X-axis direction) and the second direction (Y-axis direction). P antenna electrodes SE may be arranged in parallel in the first direction (X-axis direction), and Q antenna electrodes ASE may be arranged in parallel in the second direction (Y-axis direction). For example, as shown in FIG. 10, four antenna electrodes ASE may be arranged in parallel in the first direction (X-axis direction), and four antenna electrodes ASE may be arranged in parallel in the second direction (Y-axis direction).

As used herein, the sensor electrode SE may be defined as an electrode that receives a touch driving signal for touch sensing, and the antenna electrode ASE may be defined as an electrode that not only receives a touch driving signal for touch sensing but also receives a radio transmission signal for mobile communication to emit electromagnetic waves.

The antenna electrodes ASE may be disposed at or near the center of one side of the sensor area TSA. For example, the antenna electrodes ASE may be disposed at or near the center of the upper side of the sensor area TSA. For example, some of the sensor electrodes SE disposed at or near the uppermost side of the sensor area TSA may be selected as antenna electrodes ASE.

As shown in FIG. 10, when P×Q antenna electrodes ASE are continuously arranged along the first direction (X-axis direction) and the second direction (Y-axis direction), the intensity of electromagnetic waves emitted by the antenna electrodes ASE is high, and the electromagnetic waves may be emitted in a set direction (e.g., a predetermined direction). Therefore, the embodiment of FIG. 10 may be suitable or advantageous when the location of the external base station is known and the display device 10 emits electromagnetic waves in accordance with the direction of the external base station.

FIG. 11 is a layout view showing sensor electrodes and antenna electrodes according to one or more embodiments.

The embodiment of FIG. 11 is different from the embodiment of FIG. 10 in that antenna electrodes ASE are disposed adjacent to one side of the sensor area TSA, but none of sensor electrodes SE disposed at one side of the sensor area TSA is selected as an antenna electrode ASE.

Referring to FIG. 11, the antenna electrodes ASE are disposed adjacent to the lower side of the sensor area TSA, but none of the sensor electrodes SE disposed at or near the lowermost side of the sensor area TSA is an antenna electrode ASE.

In one or more embodiments, the antenna electrodes ASE may be disposed closer to the center of the sensor area TSA than to the four sides of the sensor area TSA.

FIG. 12 is a layout view showing sensor electrodes and antenna electrodes according to one or more embodiments.

The embodiment of FIG. 12 is different from the embodiment of FIG. 10 in that sensor electrodes SE include a plurality of sub-antenna electrode groups SAG1 to SAG4.

Referring to FIG. 12, the sensor electrodes SE may include a plurality of sub-antenna electrode groups SAG1 to SAG4. Each of the plurality of sub antenna electrode groups SAG1 to SAG4 may include R×S (R is a positive integer less than I and S is a positive integer less than J) antenna electrodes ASE. R indicates the number of antenna electrodes ASE arranged along the first direction (X-axis direction), and S indicates the number of antenna electrodes ASE arranged along the second direction (Y-axis direction). For example, each of the plurality of sub antenna electrode groups SAG1 to SAG4 may include 2×2 antenna electrodes ASE as shown in FIG. 12.

The plurality of sub-antenna electrode groups SAG1 to SAG4 may be disposed to be spaced from each other. For example, the plurality of sub-antenna electrode groups SAG1 to SAG4 may be respectively disposed at or near respective corners of the sensor area TSA. For example, the first sub-antenna electrode group SAG1 may be disposed at or near a corner where the upper side and left side of the sensor area TSA meet (e.g., upper left corner of the sensor area TSA), and the second sub antenna electrode group SAG2 may be disposed at or near a corner where the upper side and right side of the sensor area TSA meet (e.g., upper right corner of the sensor area TSA). The third sub-antenna electrode group SAG3 may be disposed at or near a corner where the lower side and left side of the sensor area TSA meet (e.g., lower left corner of the sensor area TSA), and the fourth sub-antenna electrode group SAG4 may be disposed at or near a corner where the lower side and right side of the sensor area TSA meet (e.g., lower right corner of the sensor area TSA).

As shown in FIG. 12, when the plurality of sub-antenna electrode groups SAG1 to SAG4 are respectively disposed at or near the corners of the sensor area TSA, electromagnetic waves emitted by the plurality of sub-antenna electrode groups SAG1 to SAG4 may be emitted in various directions. Therefore, the embodiment of FIG. 12 may be suitable or advantageous when the location of the external base station is not known and thus the display device 10 emits electromagnetic waves in various directions.

FIG. 13 is a layout view showing sensor electrodes and antenna electrodes according to one or more embodiments.

The embodiment of FIG. 13 is different from the embodiment of FIG. 12 in that the plurality of sub-antenna electrode groups SAG1 to SAG4 extend long in one direction (e.g., sub-antenna electrodes of each of sub-antenna electrode groups SAG1 to SAG4 are arranged in one column).

Referring to FIG. 13, antenna electrodes ASE of each of the plurality of sub-antenna electrode groups SAG1 to SAG4 may be arranged along the second direction (Y-axis direction). For example, as shown in FIG. 13, each of the plurality of sub-antenna electrode groups SAG1 to SAG4 may include 1×4 antenna electrodes ASE. In this case, sensor electrodes SE may be disposed between the sub-antenna electrode groups adjacent to each other in the first direction (X-axis direction) from among the plurality of sub-antenna electrode groups SAG1 to SAG4. For example, 1×4 sensor electrodes SE may be disposed between the first sub-antenna electrode group SAG1 and the second sub-antenna electrode group SAG2.

In one or more embodiments, antenna electrodes ASE of each of the plurality of sub-antenna electrode groups SAG1 to SAG4 may be arranged along the first direction (X-axis direction). In this case, sensor electrodes SE may be disposed between the sub-antenna electrode groups adjacent to each other in the second direction (Y-axis direction) from among the plurality of sub-antenna electrode groups SAG1 to SAG4.

As shown in FIG. 13, when each of the plurality of sub-antenna electrode groups SAG1 to SAG4 extends in one direction and sensor electrodes SE are disposed between the plurality of sub-antenna electrode groups SAG1 to SAG4, electromagnetic waves may be received in a wider area. Therefore, the embodiment of FIG. 13 may be suitable or advantageous when the location of the external base station is not known and thus the display device 10 desires to receive electromagnetic waves in a larger area.

FIG. 14 is a layout view showing sensor electrodes and antenna electrodes according to one or more embodiments.

The embodiment of FIG. 14 is different from the embodiment of FIG. 10 in that antenna electrodes ASE are disposed to be spaced from each other.

Referring to FIG. 14, at least one sensor electrode SE may be disposed between antenna electrodes ASE adjacent to each other in the first direction (X-axis direction) from among the antenna electrodes ASE. Further, at least one sensor electrode SE may be disposed between antenna electrodes ASE adjacent to each other in the second direction (Y-axis direction) from among the antenna electrodes ASE.

As shown in FIG. 14, when the antenna electrodes ASE are disposed to be spaced from each other, electromagnetic waves may be received in a wider area. Therefore, the embodiment of FIG. 14 may be suitable or advantageous when the location of the external base station is not known and thus the display device 10 desires to receive electromagnetic waves in a larger area.

Figure 15:
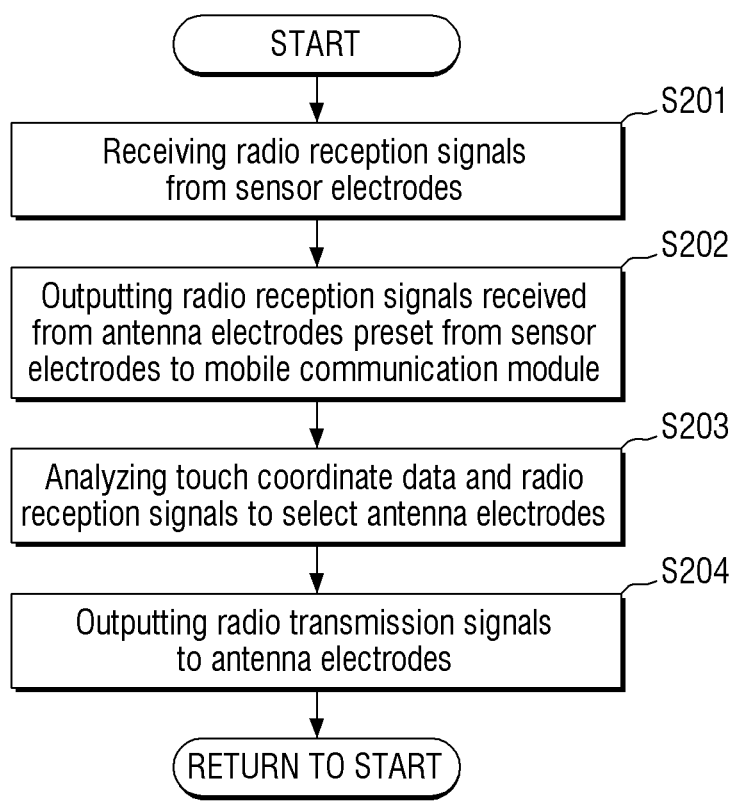
FIG. 15 is a flowchart illustrating a method of transmitting and receiving a radio signal according to one or more embodiments.

FIG. 15 is a flowchart illustrating a method of transmitting and receiving radio signals according to one or more embodiments.

The embodiment of FIG. 15 is different from the embodiment of FIG. 9 in that, in step S203, touch coordinate data as well as radio reception signals of the sensor electrodes SE are analyzed to select antenna electrodes ASE.

Referring to FIG. 15, when the antenna driving circuit 340 selects antenna electrodes ASE, the touched sensor electrodes SE may be excluded according to touch coordinate information of touch coordinate data. When a person or an object is located on the sensor electrodes SE where a touch occurs, the performance of the antenna may be deteriorated by absorbing or reflecting electromagnetic waves emitted by the person or object. Therefore, the antenna driving circuit 340 may select the antenna electrodes ASE in consideration of the reception sensitivity of radio reception signals of the remaining sensor electrodes SE, except for the sensor electrodes SE where the touch occurs.

Figure 16:
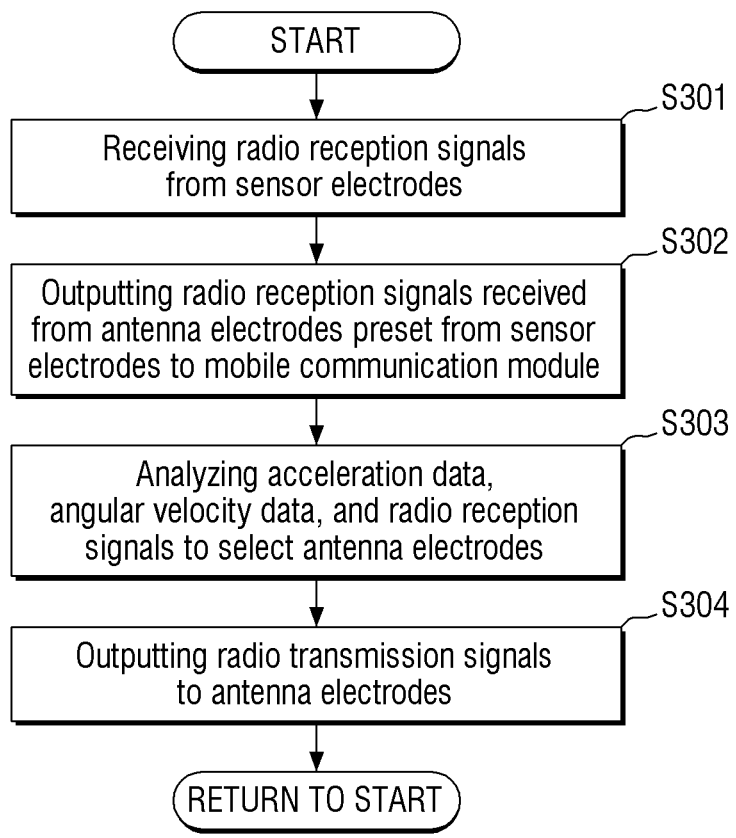
FIG. 16 is a flowchart illustrating a method of transmitting and receiving a radio signal according to one or more embodiments.

FIG. 16 is a flowchart illustrating a method of transmitting and receiving radio signals according to one or more embodiments embodiment.

The embodiment of FIG. 16 is different from the embodiment of FIG. 9 in that, in step S303, not only the radio reception signals of the sensor electrodes SE, but also the acceleration data of the acceleration sensor 740 and the angular velocity data of the gyro sensor 750 are analyzed to select antenna electrodes ASE.

Referring to FIG. 16, when selecting antenna electrode ASE, the antenna driving circuit 340 may determine an inclination degree and a rotation direction of the display device 10 according to acceleration data of the acceleration sensor 740 and angular velocity data of the gyro sensor 750. The antenna driving circuit 340 may exclude sensor electrodes SE disposed adjacent to ground (e.g., a first ground line CRL1 and a second ground line CRL2 disposed in the sensor peripheral area TPA) from among the sensor electrodes SE according to the inclination degree and rotation direction of the display device 10. Electromagnetic waves emitted from the sensor electrodes SE disposed adjacent to ground may be absorbed to the ground or reflected from the ground, thereby deteriorating the performance of an antenna. Therefore, the antenna driving circuit 340 may select the antenna electrodes ASE in consideration of the reception sensitivity of the radio reception signals of the remaining sensor electrodes SE, except for the sensor electrodes SE disposed adjacent to the ground.

In one or more embodiments, the antenna driving circuit 340 may select sensor electrodes SE disposed at a relatively high position from among the sensor electrodes SE as candidate sensor electrodes SE according to the inclination degree and rotation direction of the display device 10. Electromagnetic waves emitted by the sensor electrodes SE disposed at a high position may be stably emitted because there is no disturbed structure. Therefore, the antenna driving circuit 340 may select the antenna electrodes ASE in consideration of the reception sensitivity of the radio reception signals of the candidate sensor electrodes SE.

Figure 17:
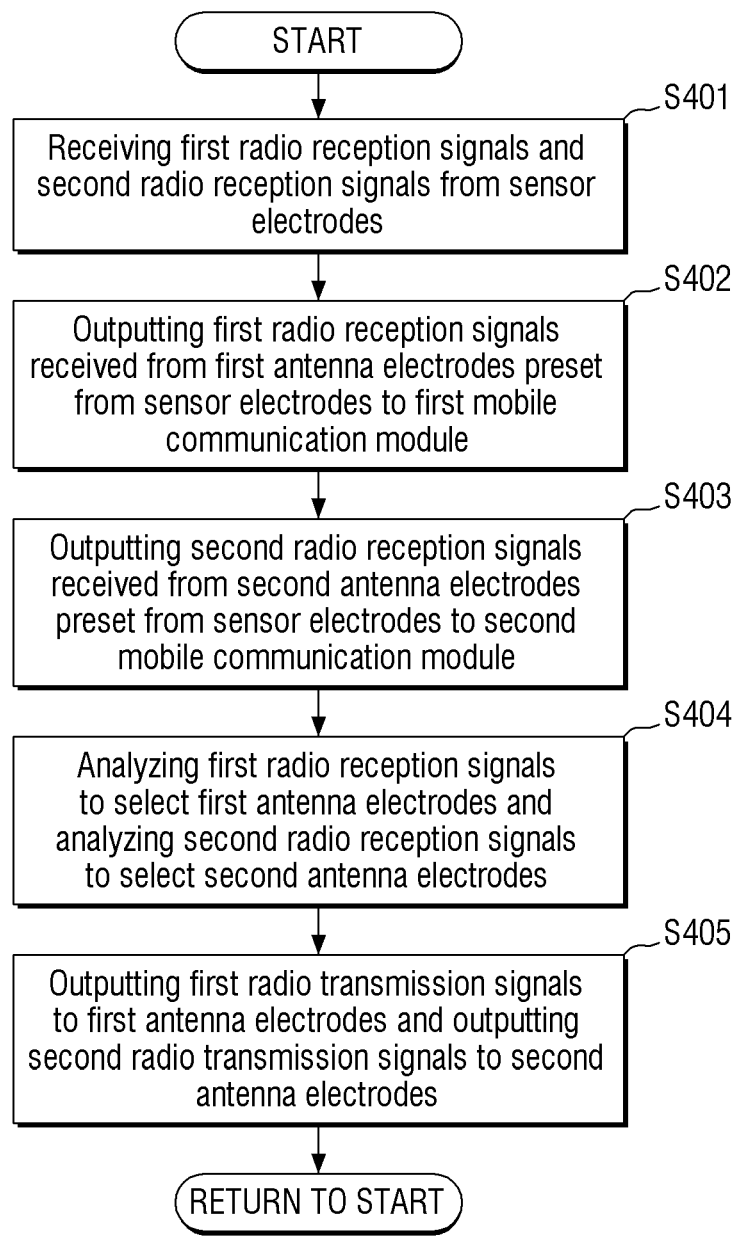
FIG. 17 is a flowchart illustrating a method of transmitting and receiving a radio signal according to one or more embodiments.
Figure 18:
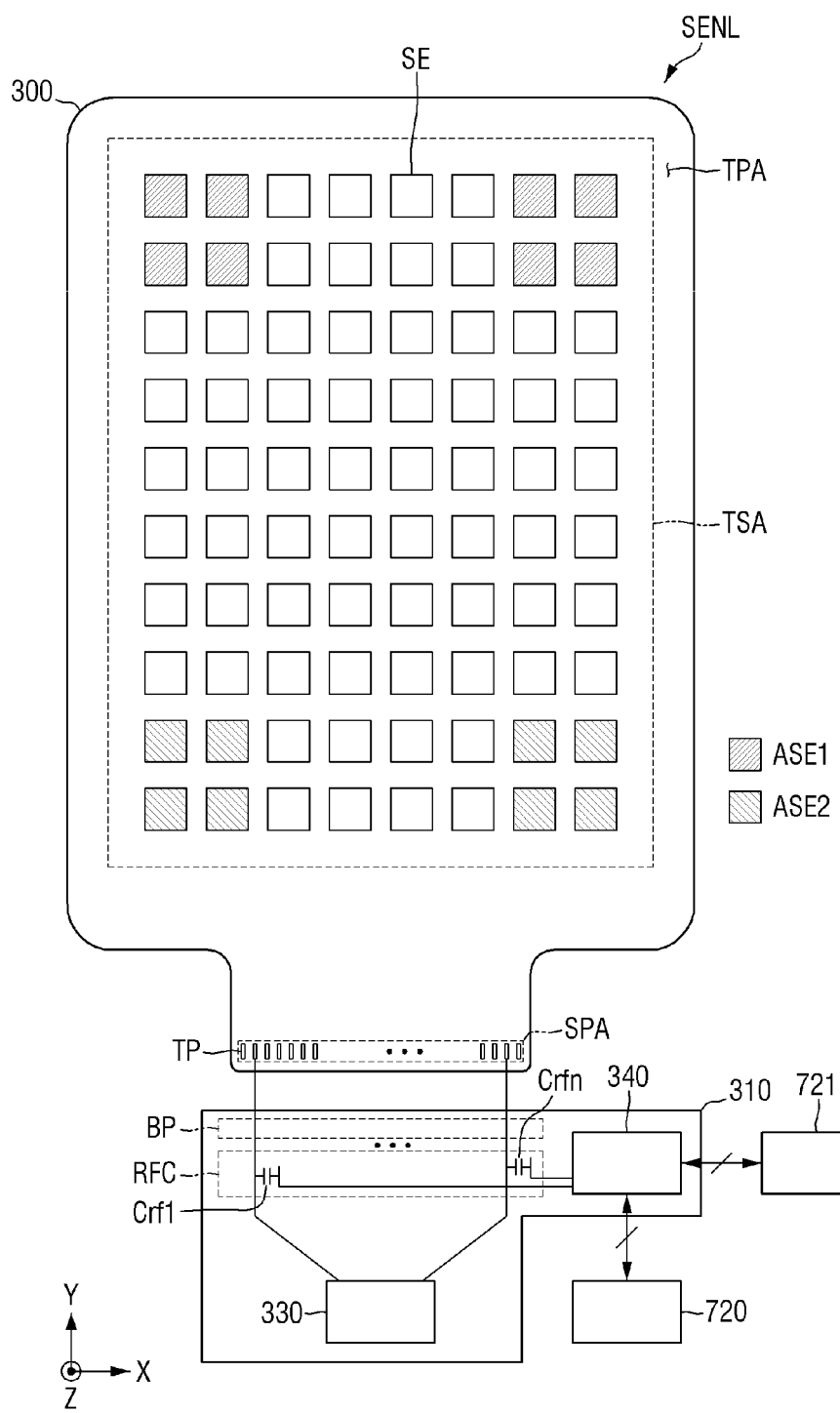
FIG. 18 is a layout view illustrating first antenna electrodes and second antenna electrodes according to one or more embodiments.

FIG. 17 is a flowchart illustrating a method of transmitting and receiving a radio signal according to one or more embodiments, and FIG. 18 is a layout view illustrating first antenna electrodes and second antenna electrodes according to one or more embodiments.

Referring to FIGS. 17 and 18, first, first radio reception signals and second radio reception signals are received from the sensor electrodes SE (S401 in FIG. 17).

The first radio reception signals and the second radio reception signals of the sensor electrodes SE may be transmitted to the sensor circuit lines SLP1 to SLPn of the display circuit board 310 through the sensor lines SL and the sensor pads TP. The first radio reception signals and the second radio reception signals of the sensor circuit lines SLP1 to SLPn may be coupled to the radio signal lines RFL1 to RFLn by coupling capacitors Crf1 to Crfn. The antenna driving circuit 340 may receive the first radio reception signals and the second radio reception signals coupled to the radio signal lines RFL1 to RFLn.

The first radio reception signals may be signals having a frequency of approximately 5 GHz to 30 GHz, and the second radio reception signals may be signals having a frequency of approximately 30 GHz to 70 GHz. Because the frequencies of the first radio reception signals and the second radio reception signals are divided, the antenna driving circuit 340 for transmitting and receiving the first radio reception signals and the second radio reception signals is capable of frequency division duplex. In this case, the display device 10 may include a first mobile communication module 720 for receiving the first radio reception signals and transmitting the first radio transmission signals and a second mobile communication module 721 for transmitting second radio transmission signals.

Second, the first radio reception signals of the first antenna electrodes ASE1 are output to the first mobile communication module 720 (S402 in FIG. 17).

The antenna driving circuit 340 may preset first antenna electrodes ASE1 to be used as a first antenna from among the sensor electrodes SE as in step S404 before performing radio communication. For example, the sensor electrodes SE may include first antenna electrodes ASE1 arranged at or near a corner where the left and upper sides of the sensor area TSA meet (e.g., upper left corner of the sensor area TSA) and a corner where the right and upper sides meet (e.g., upper right corner of the sensor area TSA), as shown in FIG. 18. The arrangement of the first antenna electrodes ASE1 is not limited to that shown in FIG. 18. For example, the first antenna electrodes ASE1 may be arranged at or near the center of one side of the sensor area TSA as shown in FIG. 10 or may be arranged adjacent to the center area of the sensor area TSA as shown in FIG. 11. In one or more embodiments, the first antenna electrodes ASE1 may be respectively included in sub-antenna electrode groups extending long in one direction (e.g., the first antenna electrodes ASE1 may be arranged in one column) as shown in FIG. 13. In one or more embodiments, the first antenna electrodes ASE1 may be arranged to be spaced from each other as shown in FIG. 14.

The antenna driving circuit 340 may output the first radio reception signals to the first mobile communication module 720 by changing the frequency of each of the first radio reception signals of the first antenna electrodes ASE1 as shown in FIG. 18.

Third, the second radio reception signals of the second antenna electrodes ASE2 are output to the second mobile communication module 721 (S403 in FIG. 17).

The antenna driving circuit 340 may preset second antenna electrodes ASE2 to be used as a second antenna from among the sensor electrodes SE as in step S404 before performing radio communication. For example, the sensor electrodes SE may include second antenna electrodes ASE2 arranged at or near a corner where the left and lower sides of the sensor area TSA meet (e.g., lower left corner of the sensor area TSA) and a corner where the right and lower sides meet (e.g., lower right corner of the sensor area TSA), as shown in FIG. 18. The arrangement of the second antenna electrodes ASE2 is not limited to that shown in FIG. 18. For example, the second antenna electrodes ASE1 may be arranged at or near the center of one side of the sensor area TSA as shown in FIG. 10 or may be arranged adjacent to the center area of the sensor area TSA as shown in FIG. 11. In one or more embodiments, the second antenna electrodes ASE2 may be respectively included in sub-antenna electrode groups extending long in one direction (e.g., the second antenna electrodes ASE2 may be arranged in one column) as shown in FIG. 13. In one or more embodiments, the second antenna electrodes ASE2 may be arranged to be spaced from each other as shown in FIG. 14.

The antenna driving circuit 340 may output the second radio reception signals to the second mobile communication module 721 by changing the frequency of each of the second radio reception signals of the second antenna electrodes ASE2 as shown in FIG. 18.

Fourth, the first radio reception signals are analyzed to select the first antenna electrodes ASE1, and the second radio reception signals are analyzed to select the second antenna electrodes ASE2 (S404 in FIG. 17).

The antenna driving circuit 340 may analyze radio reception signals of all the sensor electrodes SE to select the first antenna electrodes ASE1 to be used as the first antenna and the second antenna electrodes ASE2 to be used as the second antenna. For example, the antenna driving circuit 340 may select the first antenna electrodes ASE1 and the second antenna electrodes ASE2 in consideration of the reception sensitivity of radio reception signals of all the sensor electrodes SE.

Fifth, the first radio transmission signals are output to the first antenna electrodes ASE1, and the second radio transmission signals are output to the second antenna electrodes ASE2 (S405 in FIG. 17).

The antenna driving circuit 340 may receive the first radio transmission signals from the first mobile communication module 720 as shown in FIG. 18, change the phase of the first radio transmission signals, amplify the amplitude of the first radio transmission signals, and output these first radio transmission signals to the selected first antenna electrodes ASE1. Therefore, the first radio transmission signals may be transmitted to the external base station through the selected first antenna electrodes ASE1.

Further, the antenna driving circuit 340 may receive the second radio transmission signals from the second mobile communication module 721 as shown in FIG. 18, change the phase of the second radio transmission signals, amplify the amplitude of the second radio transmission signals, and output these second radio transmission signals to the selected second antenna electrodes ASE2. Therefore, the second radio transmission signals may be transmitted to the external base station through the selected second antenna electrodes ASE2.

As shown in FIGS. 17 and 18, the antenna driving circuit 340 may receive the first radio reception signals and transmit the first radio transmission signals using the first antenna electrodes ASE1. Further, the antenna driving circuit 340 may receive the second radio reception signals and transmit the first radio transmission signals using the second antenna electrodes ASE2. For example, some of the sensor electrodes for sensing the touch may be used as the first antenna, and others thereof may be used as the second antenna for transmitting and receiving electromagnetic waves having a different frequency from the first antenna.

Figure 19:
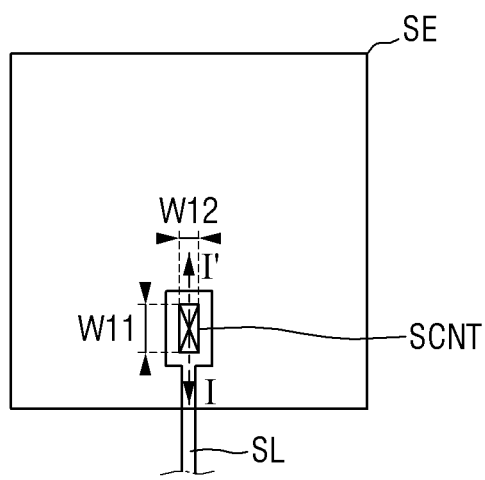
FIG. 19 is a layout view illustrating an example of the sensor line, the sensor electrode, and the sensor contact unit of FIG. 6.
Figure 20:
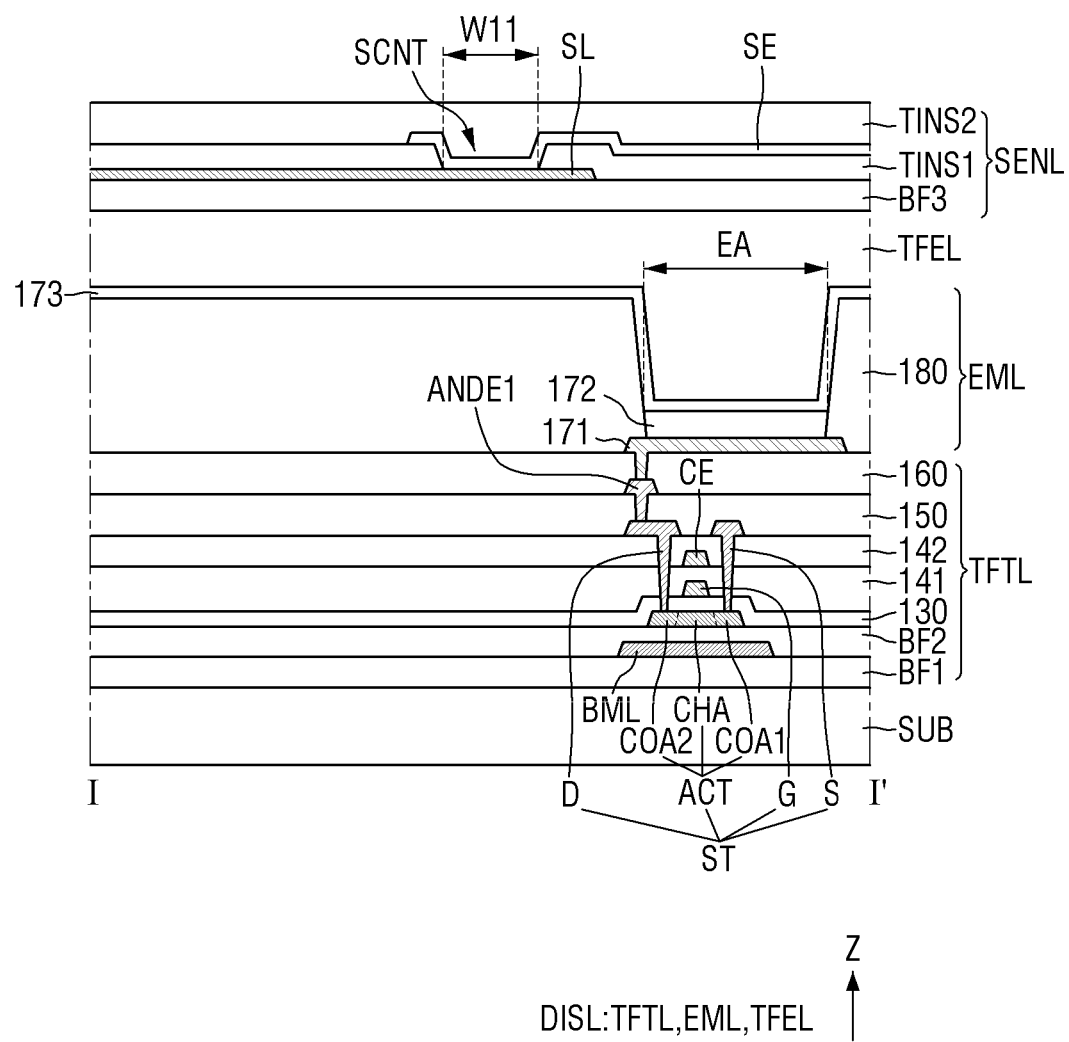
FIG. 20 is a cross-sectional view illustrating an example of a display panel taken along the line I-I' of FIG. 19.

FIG. 19 is a layout view illustrating an example of the sensor line, the sensor electrode, and the sensor contact unit of FIG. 6, and FIG. 20 is a cross-sectional view illustrating an example of a display panel taken along the line I-I' of FIG. 19.

In FIGS. 19 and 20, for convenience of description, only one sensor electrode SE and only one sensor line SL are illustrated.

Referring to FIGS. 19 and 20, the sensor electrode SE may be connected to the sensor line SL through the sensor contact unit SCNT.

A display layer DISL including a thin film transistor layer TFTL, a light emitting element layer EML, and an encapsulation layer TFEL is disposed on a substrate SUB. A sensor electrode layer SENL including the sensor electrodes SE may be disposed on the display layer DISL.

A first buffer film BF1 may be disposed on one surface of the substrate SUB, and a second buffer film BF2 may be disposed on the first buffer film BF1. The first and second buffer films BF1 and BF2 may be disposed on one surface of the substrate SUB to protect thin film transistors of the thin film transistor layer TFTL and a light emitting layer 172 of the light emitting element layer EML from moisture penetrating through the substrate SUB which is vulnerable to moisture permeation. The buffer film BF (e.g., BF1, BF2) may include a plurality of inorganic films alternately stacked. For example, each of the first and second buffer films BF1 and BF2 may be formed as a multi-layer film in which one or more inorganic layers of a silicon nitride layer, a silicon oxynitride layer, a silicon oxide layer, a titanium oxide layer, and an aluminum oxide layer are alternately stacked. At least one of the first and second buffer films BF1 and BF2 may be omitted.

A light blocking layer BML may be disposed on the first buffer film BF1. The light blocking layer BML may be formed of a single layer or multiple layers including one of molybdenum (Mo), aluminum (Al), chromium (Cr), gold (Au), titanium (Ti), nickel (Ni), neodymium (Nd), and copper (Cu) or including an alloy thereof. In one or more embodiments, the light blocking layer BML may be an organic layer including a black pigment.

An active layer ACT of a thin film transistor ST of a display pixel may be disposed on the second buffer film BF2. The active layer ACT may include polycrystalline silicon, monocrystalline silicon, low-temperature polycrystalline silicon, amorphous silicon, or an oxide semiconductor material. When the active layer ACT includes polycrystalline silicon or an oxide semiconductor material, the ion-doped region in the active layer ACT may be a conductive region having conductivity.

The active layer ACT may overlap the light blocking layer BML in the third direction (Z-axis direction). Because light incident through the substrate SUB may be blocked by the light blocking layer BML, it is possible to prevent (or substantially prevent) leakage current from flowing into the active layer ACT by the light incident through the substrate SUB.

A gate insulating film 130 may be formed on the active layer ACT of the thin film transistor ST. The gate insulating film 130 may be formed of an inorganic layer, for example, a silicon nitride layer, a silicon oxy nitride layer, a silicon oxide layer, a titanium oxide layer, or an aluminum oxide layer.

A gate electrode G of the thin film transistor ST may be disposed on the gate insulating film 130. The gate electrode G of the thin film transistor ST may overlap the active layer ACT in the third direction (Z-axis direction). A portion of the active layer ACT overlapping the gate electrode G in the third direction (Z-axis direction) may be a channel region CHA. The gate electrode G of the thin film transistor ST may be formed of a single layer or multiple layers including any one of molybdenum (Mo), aluminum (Al), chromium (Cr), gold (Au), titanium (Ti), nickel (Ni), neodymium (Nd), and copper (Cu), or including an alloy thereof.

A first interlayer insulating film 141 may be disposed on the gate electrode G of the thin film transistor ST. The first interlayer insulating film 141 may be formed of an inorganic layer, for example, a silicon nitride layer, a silicon oxy nitride layer, a silicon oxide layer, a titanium oxide layer, or an aluminum oxide layer. The first interlayer insulating film 141 may include a plurality of inorganic layers.

One electrode CE of a capacitor may be disposed on the first interlayer insulating film 141. One electrode of the capacitor may overlap the gate electrode G of the thin film transistor ST in the third direction (Z-axis direction). One electrode of the capacitor may be formed of a single layer or multiple layers including any one of molybdenum (Mo), aluminum (Al), chromium (Cr), gold (Au), titanium (Ti), nickel (Ni), neodymium (Nd), and copper (Cu), or including an alloy thereof.

A second interlayer insulating film 142 may be disposed on one electrode CE of the capacitor. The second interlayer insulating film 142 may be formed of an inorganic layer, for example, a silicon nitride layer, a silicon oxy nitride layer, a silicon oxide layer, a titanium oxide layer, or an aluminum oxide layer. The second interlayer insulating film 142 may include a plurality of inorganic layers.

A first electrode S and a second electrode D of the thin film transistor ST may be disposed on the second interlayer insulating film 142. The first electrode S and the second electrode D of the thin film transistor ST may be formed of a single layer or multiple layers including any one of molybdenum (Mo), aluminum (Al), chromium (Cr), gold (Au), titanium (Ti), nickel (Ni), neodymium (Nd), and copper (Cu), or including an alloy thereof.

The first electrode S of the thin film transistor ST may be connected to a first conductive region COA1 disposed at one side of the channel region CHA of the active layer ACT through a contact hole penetrating the gate insulating film 130, the first interlayer insulating film 141, and the second interlayer insulating film 142. The second electrode D of the thin film transistor ST may be connected to a second conductive region COA2 disposed at the other side of the channel region CHA of the active layer ACT through a contact hole penetrating the gate insulating film 130, the first interlayer insulating film 141, and the second interlayer insulating film 142.

A first organic layer 150 (or the first organic film) for flattening the step due to thin film transistors may be disposed on the first electrode S and the second electrode D of the thin film transistor ST. The first organic layer 150 may be formed of an organic material such as an acrylic resin, an epoxy resin, a phenolic resin, a polyamide resin, or a polyimide resin.

A first connection electrode ANDE1 may be disposed on the first organic layer 150. The first connection electrode ANDE1 may be connected to the second electrode D of the thin film transistor ST through a contact hole penetrating the first organic layer 150. The first connection electrode ANDE1 may be formed of a single layer or multiple layers including any one of molybdenum (Mo), aluminum (Al), chromium (Cr), gold (Au), titanium (Ti), nickel (Ni), neodymium (Nd), and copper (Cu), or including an alloy thereof.

A second organic layer 160 may be disposed on the first connection electrode ANDE1. The second organic layer 160 may be formed of an organic material such as an acrylic resin, an epoxy resin, a phenolic resin, a polyamide resin, or a polyimide resin.

A light emitting element layer EML is disposed on the thin film transistor layer TFTL. The light emitting element layer EML may include light emitting elements 170 and a bank 180.

Each of the light emitting elements 170 may include a first light emitting electrode 171, a light emitting layer 172, and a second light emitting electrode 173.

The first light emitting electrode 171 may be formed on the second organic layer 160. The first light emitting electrode 171 may be connected to the first connection electrode ANDE1 through a contact hole penetrating the second organic layer 160.

In the top emission structure in which light is emitted in the direction of the second light emitting electrode 173 based on the light emitting layer 172, the first light emitting electrode 171 may be formed of a single layer of molybdenum (Mo), titanium (Ti), copper (Cu), or aluminum (Al), or may be formed as a laminate structure (Ti/Al/Ti) of aluminum and titanium, a laminate structure (ITO/Al/ITO) of aluminum and ITO, an APC alloy structure, or a laminate structure (ITO/APC/ITO) of an APC alloy and ITO. The APC alloy is an alloy of silver (Ag), palladium (Pd), and copper (Cu).

The bank 180 serves to define a light emitting area EA of the display pixel. In the light emitting area EA, the first light emitting electrode 171, the light emitting layer 172, and the second light emitting electrode 173 are sequentially stacked, and holes from the first light emitting electrode 171 and electrons from the second light emitting electrode 173 are combined with each other in the light emitting layer 172 to emit light. In this case, the first light emitting electrode 171 may be an anode electrode, and the second light emitting electrode 173 may be a cathode electrode.

The bank 180 may be formed on the second organic layer 160 to expose a portion of the first light emitting electrode 171. The bank 180 may cover the edge of the first light emitting electrode 171. The bank 180 may be disposed in a contact hole penetrating the second organic layer 160. Thus, the contact hole penetrating the second organic layer 160 may be filled by the bank 180. The bank 180 may be formed of an organic material such as an acrylic resin, an epoxy resin, a phenolic resin, a polyamide resin, or a polyimide resin.

The light emitting layer 172 is formed on the first light emitting electrode 171. The light emitting layer 172 may include an organic material to emit light of a set color (e.g., a predetermined color). For example, the light emitting layer 172 may include a hole transporting layer, an organic material layer, and an electron transporting layer. The organic material layer may include a host and a dopant. The organic material layer may include a material for emitting light (e.g., predetermined light), and may be formed using a phosphorescent material or a fluorescent material.

Figure 43:
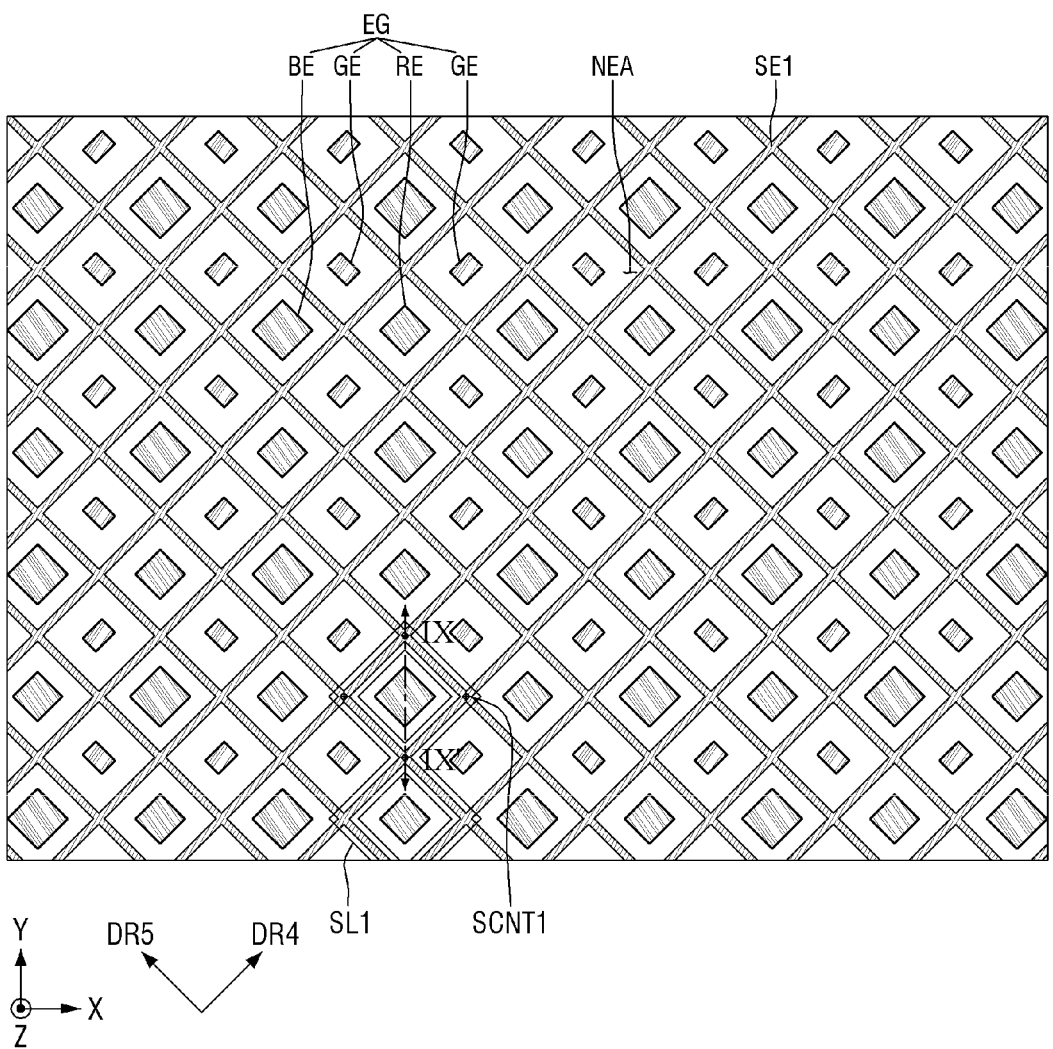
FIG. 43 is a layout view illustrating an example of the sensor line, the sensor electrode, and the sensor contact unit of FIG. 42.

For example, the organic material layer of the light emitting layer 172 of the first light emitting area RE (e.g., as shown in FIG. 43) for emitting light of a first color may include a host material including CBP (carbazole biphenyl) or mCP (1,3-bis (carbazol-9-yl)), and may include a phosphorescent material including a dopant including at least one selected from PIQIr (acac)(bis(1-phenylisoquinoline)acetylacetonate iridium), PQIr (acac)(bis(1-phenylquinoline) acetylacetonate iridium), PQIr (tris(1-phenylquinoline) iridium), and PtOEP (octaethylporphyrin platinum). In one or more embodiments, the organic material layer of the light emitting layer 172 of the first light emitting area RE may include a fluorescent material including PBD:Eu(DBM)3 (Phen) or perylene, but the material thereof is not limited thereto.

The organic material layer of the light emitting layer 172 of the second light emitting area GE (e.g., as shown in FIG. 43) for emitting light of a second color may include a host material including CBP or mCP, and may include a phosphorescent material including a dopant material including Ir(ppy)3(fac tris(2-phenylpyridine)iridium). In one or more embodiments, the organic material layer of the light emitting layer 172 of the second light emitting area GE for emitting light of a second color may include a fluorescent material including Alq3(tris(8-hydroxyquinolino)aluminum), but the material thereof is not limited thereto.

The organic material layer of the light emitting layer 172 of the third light emitting area BE (e.g., as shown in FIG. 43) for emitting light of a third color may include a host material including CBP or mCP, and may include a phosphorescent material including a dopant material including (4,6-F2ppy) 2Irpic or L2BD111, but the materials thereof are not limited thereto.

The second light emitting electrode 173 is formed on the light emitting layer 172. The second light emitting electrode 173 may be formed to cover the light emitting layer 172. The second light emitting electrode 173 may be a common layer formed commonly over the display pixels. A capping layer may be formed on the second light emitting electrode 173.

In the top emission structure, the second light emitting electrode 173 may be formed of a transparent conductive material (TCO) such as ITO or IZO, which can transmit light, or may be formed of a semi-transmissive conductive material such as magnesium (Mg), silver (Ag), or an alloy of magnesium (Mg) and silver (Ag). When the second light emitting electrode 173 is formed of a semi-transmissive metal material, light emission efficiency may be increased by micro cavities.

An encapsulation layer TFEL may be formed on the light emitting element layer EML. The encapsulation layer TFEL may include at least one inorganic film to prevent oxygen or moisture from penetrating the light emitting element layer EML. Further, the encapsulation layer TFEL may include at least one organic layer to protect the light emitting element layer EML from foreign matter such as dust.

in one or more embodiments, a substrate, instead of the encapsulation layer TFEL, may be disposed on the light emitting element layer EML, and a space between the light emitting element layer EML and the substrate may be empty in a vacuum state or may be filled with a filling film. The filling film may be an epoxy filling film or a silicon filling film.

A sensor electrode layer SENL is disposed on the encapsulation layer TFEL. The sensor electrode layer SENL may include a third buffer film BF3, a sensor line SL, a sensor electrode SE, a first sensor insulating film TINS1, and a second sensor insulating film TINS2.

The third buffer film BF3 may be disposed on the encapsulation layer TFEL. The third buffer layer BF3 may include at least one inorganic layer. For example, the third buffer film BF3 may be formed as a multi-layer film in which one or more inorganic layers of a silicon nitride layer, a silicon oxynitride layer, a silicon oxide layer, a titanium oxide layer, and an aluminum oxide layer. The third buffer film BF3 may be omitted.

The sensor line SL may be disposed on the third buffer layer BF3. The sensor line SL may not overlap the light emitting area EA in the third direction. The sensor line SL may be formed of a single layer of molybdenum (Mo), titanium (Ti), copper (Cu), or aluminum (Al), or may be formed as a laminate structure (Ti/Al/Ti) of aluminum and titanium, a laminate structure (ITO/Al/ITO) of aluminum and ITO, an APC alloy structure, or a laminate structure (ITO/APC/ITO) of an APC alloy and ITO.

The first sensor insulating film TINS1 may be disposed on the sensor line SL. The first sensor insulating layer TINS1 may be formed of an inorganic layer, for example, a silicon nitride layer, a silicon oxy nitride layer, a silicon oxide layer, a titanium oxide layer, or an aluminum oxide layer.

The sensor electrode SE may be disposed on the first sensor insulating film TINS1. The sensor electrode SE may be connected to the sensor line SL through a sensor contact unit SCNT. The sensor contact unit SCNT may be a region that penetrates the first sensor insulating film TINS1 to expose the sensor line SL. The sensor electrode SE may be formed of a transparent conductive material (TCO) such as ITO or IZO which can transmit light.

The second sensor insulating film TINS2 may be disposed on the sensor electrode SE. The second sensor insulating film TINS2 may include at least one of an inorganic layer and an organic layer. The inorganic layer may be a silicon nitride layer, a silicon oxy nitride layer, a silicon oxide layer, a titanium oxide layer, or an aluminum oxide layer. The organic layer may be formed of an acrylic resin, an epoxy resin, a phenolic resin, a polyamide resin, or a polyimide resin.

Figure 21:
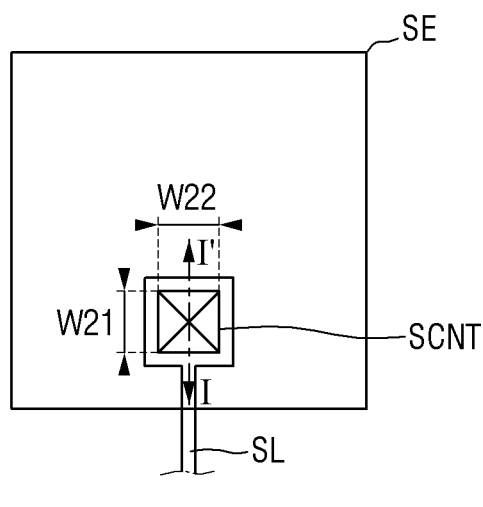
FIG. 21 is a layout view illustrating another example of the sensor line, the sensor electrode, and the sensor contact unit of FIG. 6.
Figure 22:
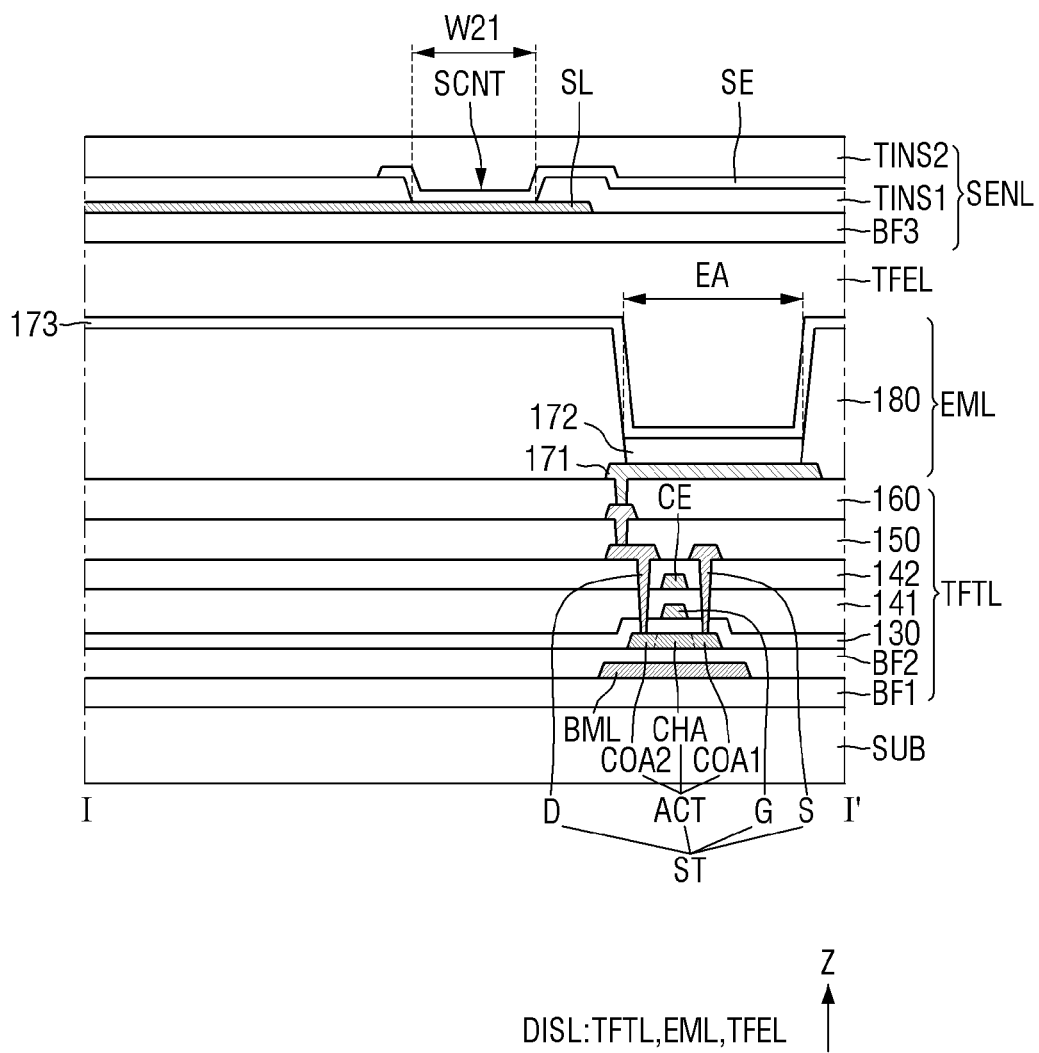
FIG. 22 is a cross-sectional view illustrating an example of a display panel taken along the line I-I' of FIG. 21.

FIG. 21 is a layout view illustrating another example of the sensor line, the sensor electrode, and the sensor contact unit of FIG. 6, and FIG. 22 is a cross-sectional view illustrating an example of a display panel taken along the line I-I' of FIG. 21.

The embodiment of FIGS. 21 and 22 is different from the embodiment of FIGS. 19 and 20 in that the area of the sensor contact unit SCNT to which the sensor electrode SE and the sensor line SL are connected is increased.

The length W21 of the sensor contact unit SCNT shown in FIGS. 21 and 22 in the second direction (Y-axis direction) and the length W22 thereof in the first direction (X-axis direction) may be longer than the length W11 of the sensor contact unit SCNT shown in FIGS. 19 and 20 in the second direction (Y-axis direction) and the length W12 thereof in the first direction (X-axis direction), respectively. Thus, the area of the sensor contact unit SCNT shown in FIGS. 21 and 22 may be larger than the area of the sensor contact unit SCNT shown in FIGS. 19 and 20. When the area of the sensor contact unit SCNT is increased, the contact resistance between the sensor electrode SE and the sensor line SL may be lowered.

Because the resistance of the sensor line SL increases with the increase in length of the sensor line SL, the sensor contact unit SCNT of the sensor electrode SE connected to the relatively long sensor line SL may be formed to have a large area, and the sensor contact unit SCNT of the sensor electrode SE connected to the relatively short sensor line SL may be formed to have a small area. Thus, a difference in resistance between the sensor lines SL may be decreased.

Figure 23:
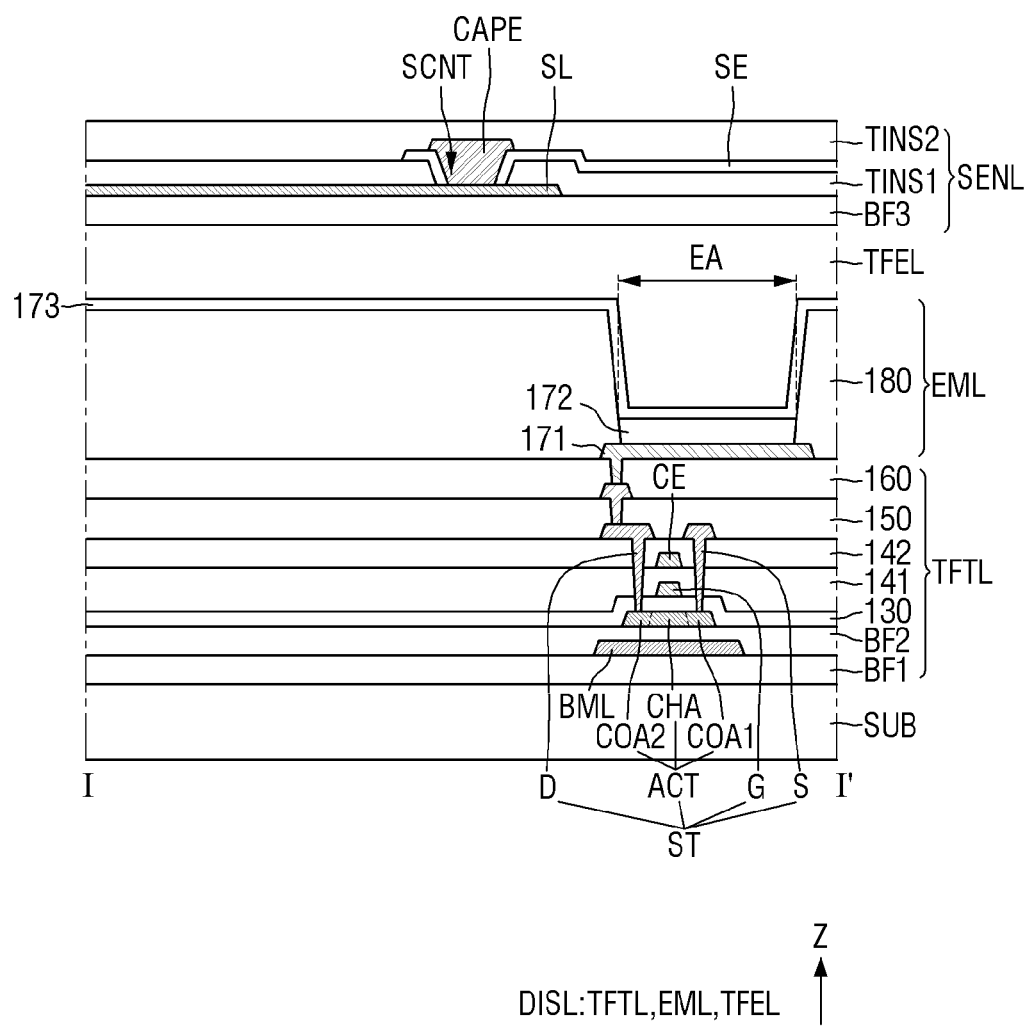
FIG. 23 is a cross-sectional view illustrating another example of a display panel taken along the line I-I' of FIG. 21.

FIG. 23 is a cross-sectional view illustrating another example of a display panel taken along the line I-I' of FIG. 21.

The embodiment of FIG. 23 is different from the embodiment of FIG. 22 in that a capping electrode CAPE is disposed on the sensor electrode SE in the sensor contact unit SCNT.

Referring to FIG. 23, the capping electrode CAPE may be disposed on the sensor electrode SE to fill the sensor contact unit SCNT. The area of the capping electrode CAPE may be larger than the area of the sensor contact unit SCNT. The capping electrode CAPE may not overlap the light emitting area EA. The capping electrode CAPE may include molybdenum (Mo), titanium (Ti), copper (Cu), or aluminum (Al).

Further, when a part of the sensor electrode SE disposed on the sensor line SL in the sensor contact unit SCNT is removed, the capping electrode CAPE may be directly connected to the sensor line SL. In this case, when the capping electrode CAPE includes a low-resistance material, the contact resistance between the sensor line SL and the sensor electrode SE may be lowered.

As shown in FIG. 23, when the capping electrode CAPE is disposed in the sensor contact unit SCNT, the contact resistance between the sensor electrode SE and the sensor line SL may be lowered.

Because the resistance of the sensor line SL increases with the increase in length of the sensor line SL, the capping electrode CAPE may be disposed in the sensor contact unit SCNT of the sensor electrode SE connected to the relatively long sensor line SL, and the capping electrode CAPE may not be disposed in the sensor contact unit SCNT of the sensor electrode SE connected to the relatively short sensor line SL. In this case, a difference in resistance between the sensor lines SL may be decreased.

Figure 24:
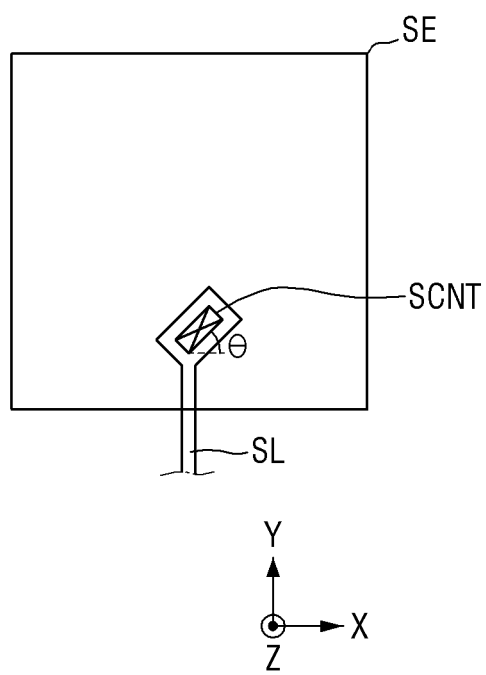
FIG. 24 is a layout view illustrating another example of the sensor line, the sensor electrode, and the sensor contact unit of FIG. 6.

FIG. 24 is a layout view illustrating another example of the sensor line, the sensor electrode, and the sensor contact unit of FIG. 6.

The embodiment of FIG. 24 is different from the embodiment of FIG. 19 in that the sensor contact unit SCNT is disposed to be inclined at a first angle θ1 with respect to the first direction (X-axis direction). The first angle θ1 may be an acute angle.

Figure 25:
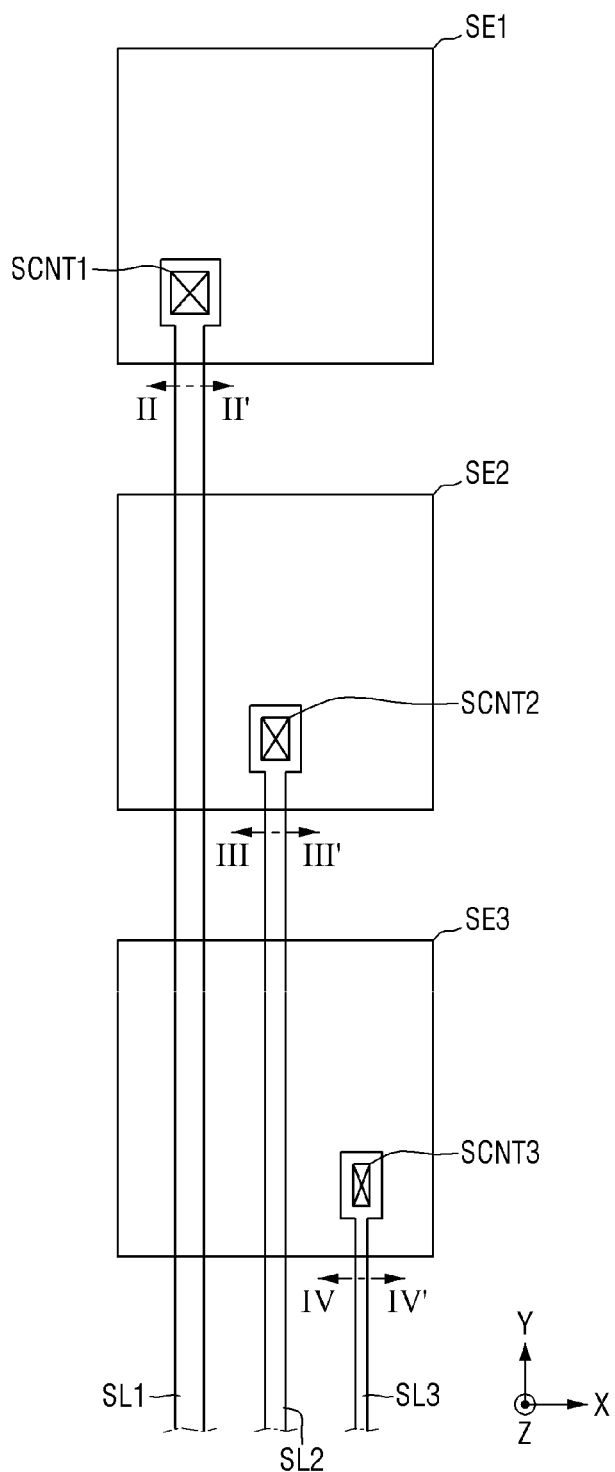
FIG. 25 is a layout view illustrating an example of sensor electrodes arranged in any one column and sensor line connected thereto according to one or more embodiments.
Figure 26A:
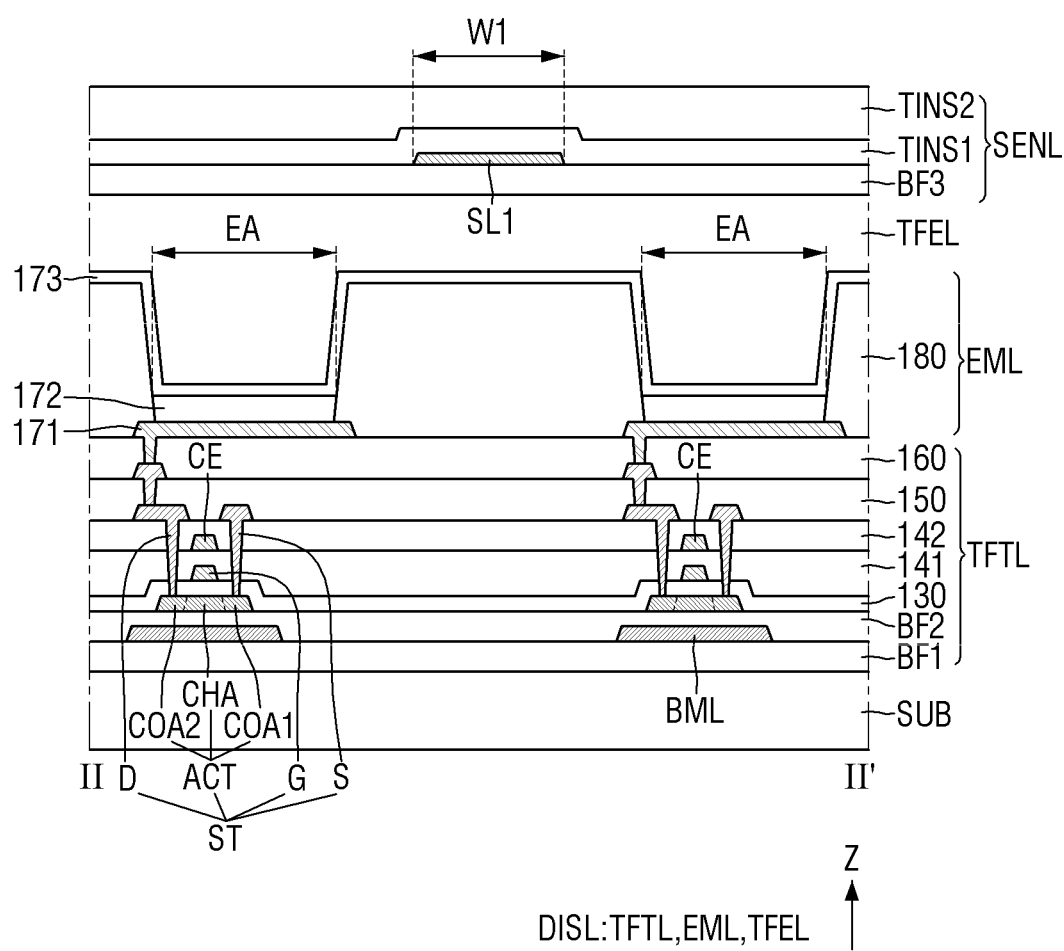
FIGS. 26A-26C are cross-sectional views illustrating an example of a display panel taken along the lines and IV-IV' of FIG. 25.
Figure 26B:
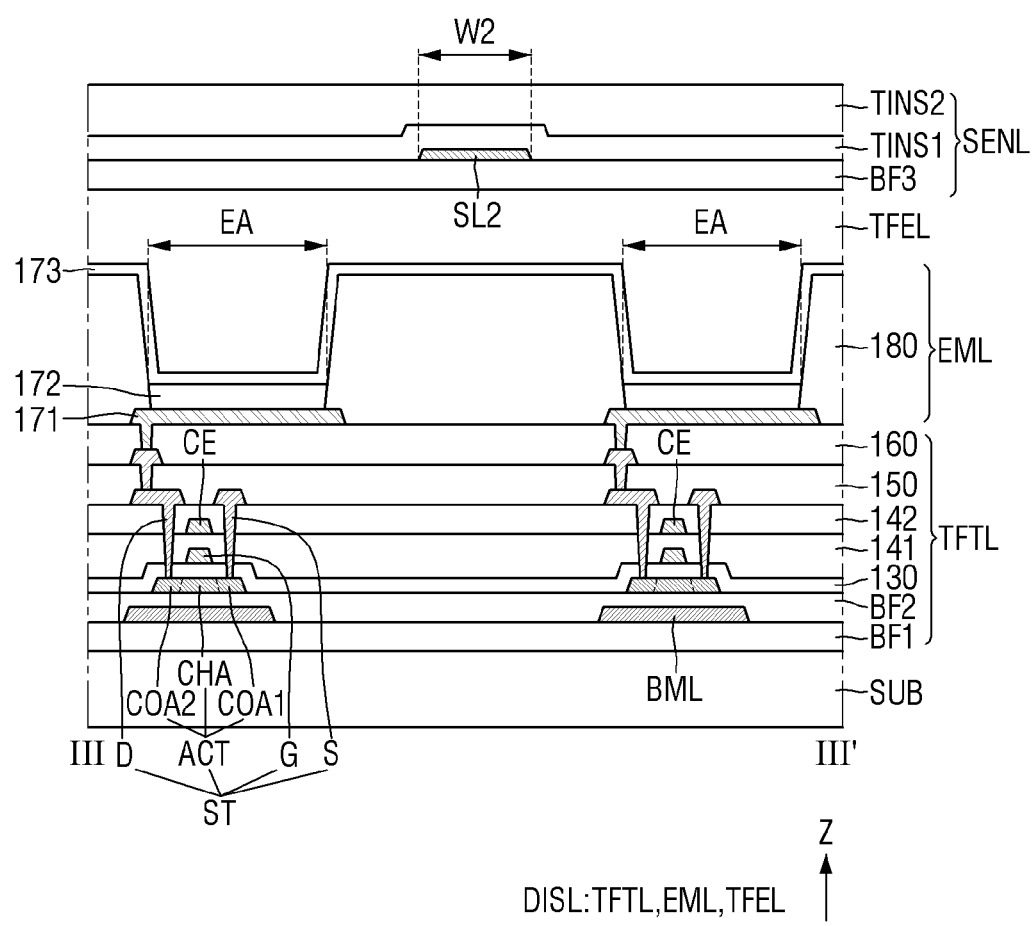
Figure 26C:
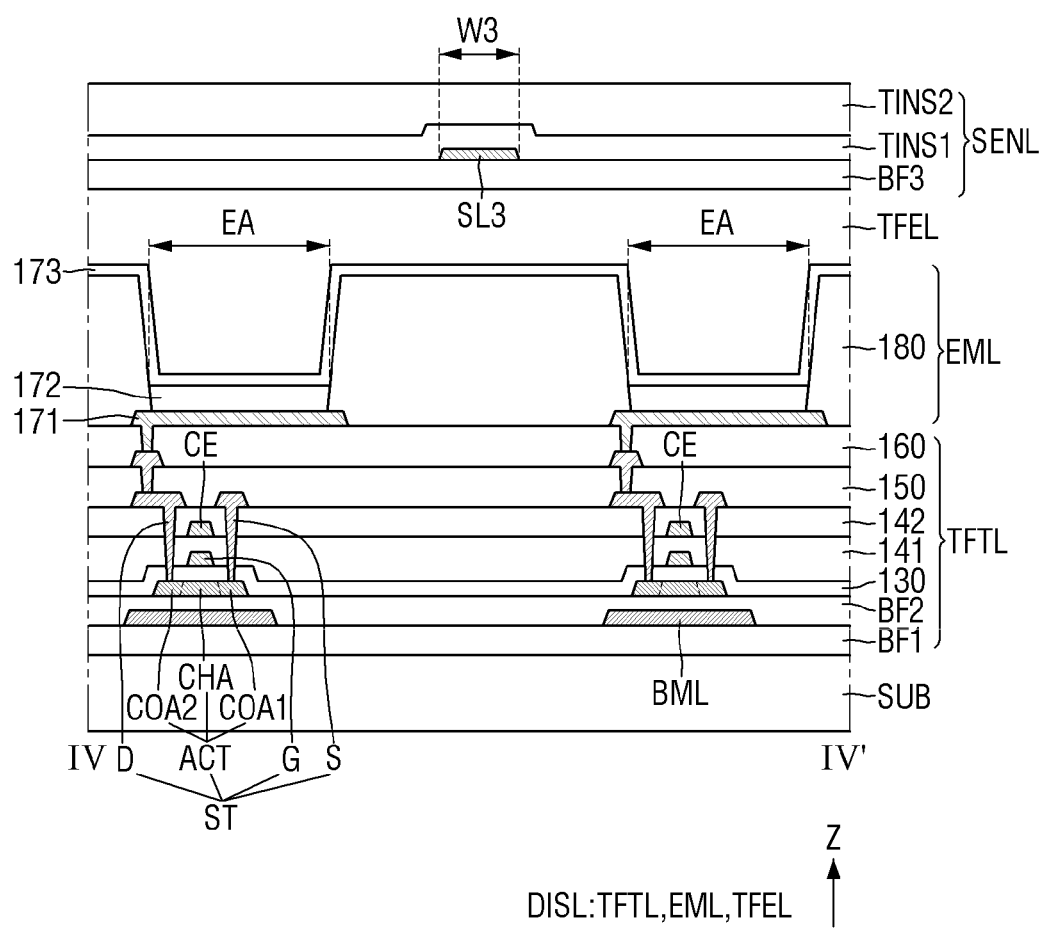

FIG. 25 is a layout view illustrating an example of sensor electrodes arranged in any one column and sensor line connected thereto, and FIGS. 26A-26C are cross-sectional views illustrating an example of a display panel taken along the lines and IV-IV' of FIG. 25.

For convenience of description, FIG. 25 illustrates only first to third sensor electrodes SE1, SE2, and SE3 arranged adjacent to each other along the second direction (Y-axis direction).

Referring to FIGS. 25 and 26A-26C, the first sensor electrode SE1 may be disposed at or near the uppermost side of the first to third sensor electrodes SE1, SE2, and SE3, and the third sensor electrode SE3 may be disposed at or near the lowermost side of the first to third sensor electrodes SE1, SE2, and SE3.

The first sensor electrode SE1 may be connected to the first sensor line SL1 through the first sensor contact unit SCNT1. The second sensor electrode SE2 may be connected to the second sensor line SL2 through the second sensor contact unit SCNT2. The third sensor electrode SE3 may be connected to the third sensor line SL3 through the third sensor contact unit SCNT3.

The first to third sensor lines SL1, SL2, and SL3 may extend in the second direction (Y-axis direction). The first to third sensor lines SL1, SL2, and SL3 may be connected to pads TP disposed under the third sensor electrode SE3. Thus, the length of the third sensor line SL3 disposed at or near the lowermost side of the first to third sensor electrodes SE1, SE2, and SE3 may be the shortest, and the length of the first sensor line SL1 disposed at or near the uppermost side of the first to third sensor electrodes SE1, SE2, and SE3 may be the longest.

Because the length of the first sensor line SL1 is the longest and the length of the third sensor line SL3 is the shortest, the resistance of the first sensor line SL1 may be the greatest, and the resistance of the third sensor line SL3 may be the smallest. As shown in FIGS. 26A-26C, the width W1 of the first sensor line SL1 may be greater than the width W2 of the second sensor line SL2, and the width W2 of the second sensor line SL2 may be greater than the width W3 of the third sensor line SL3. In this case, a difference in resistance between the first to third sensor lines SL1, SL2, and SL3 may be lowered.

Figure 27:
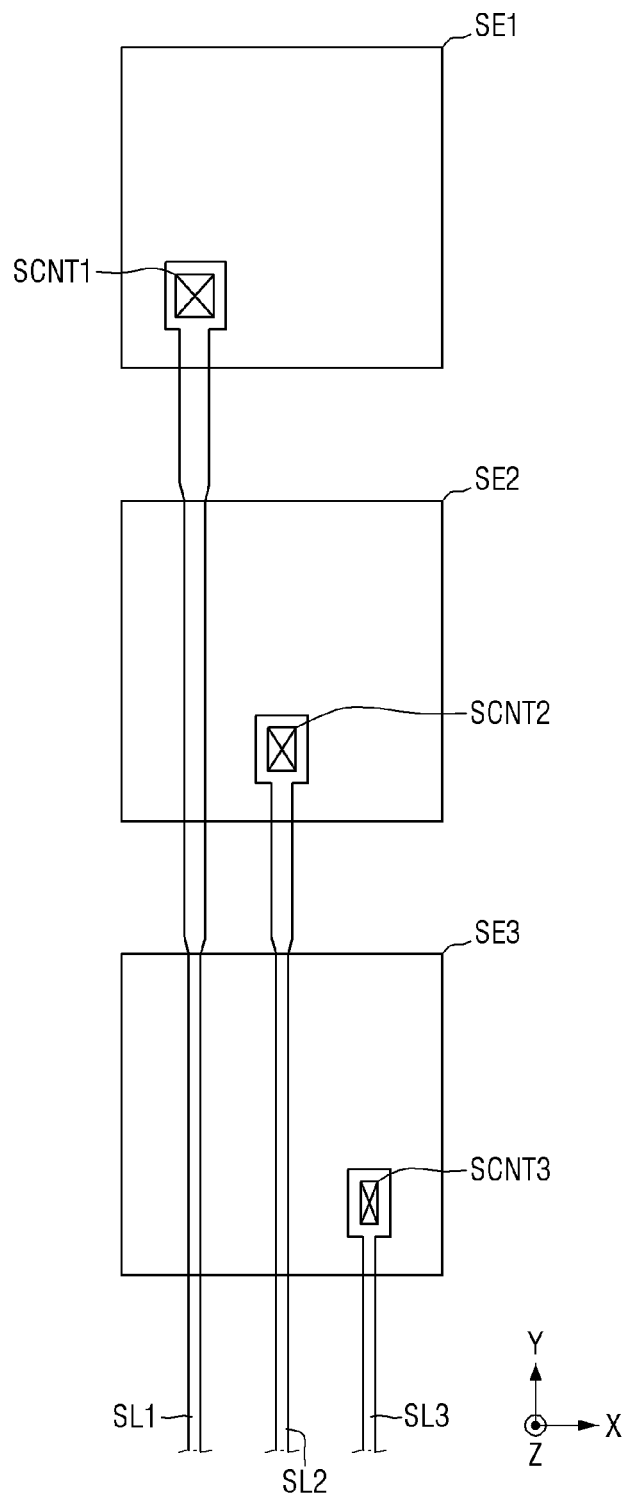
FIG. 27 is a layout view illustrating another example of sensor electrodes arranged in any one column and sensor line connected thereto according to one or more embodiments.

FIG. 27 is a layout view illustrating another example of sensor electrodes arranged in any one column and sensor line connected thereto.

The embodiment of FIG. 27 is different from the embodiment of FIG. 25 in that the width of the first sensor line SL1 and the width of the second sensor line SL2 gradually increase from the lower side toward the upper side (e.g., in Y-direction from SE3 to SE1).

The width as used in below three paragraphs may refer to a width of an overlapping area or region between two sensor electrodes in the third direction (Z-axis direction). Referring to FIG. 27, the width of the first sensor electrode SE1 overlapping the third sensor electrode SE3 in the third direction (Z-axis direction) may be smaller than the width of the first sensor electrode SE1 overlapping the second sensor electrode SE2 in the third direction (Z-axis direction). The width of the first sensor electrode SE1 overlapping the second sensor electrode SE2 in the third direction (Z-axis direction) may be smaller than the width of the first sensor electrode SE1 overlapping the first sensor electrode SE1 in the third direction (Z-axis direction).

The width of the second sensor electrode SE2 overlapping the third sensor electrode SE3 in the third direction (Z-axis direction) may be smaller than the width of the second sensor electrode SE2 overlapping the second sensor electrode SE2 in the third direction (Z-axis direction).

The width of the first sensor electrode SE1 overlapping the third sensor electrode SE3 in the third direction (Z-axis direction), the width of the second sensor electrode SE2 overlapping the third sensor electrode SE3 in the third direction (Z-axis direction), and the width of the third sensor electrode SE3 overlapping the third sensor electrode SE3 in the third direction (Z-axis direction) may be substantially the same as each other second. The width of the first sensor electrode SE1 overlapping the second sensor electrode SE2 in the third direction (Z-axis direction) and the width of the sensor electrode SE2 overlapping the second sensor electrode SE2 in the third direction (Z-axis direction) may be substantially the same as each other.

As shown in FIG. 27, when the width of the first sensor line SL1 and the width of the second sensor line SL2 gradually increase from the lower side toward the upper side, a difference in resistance between the first to third sensor lines SL1, SL2, and SL3 may be lowered.

Figure 28:
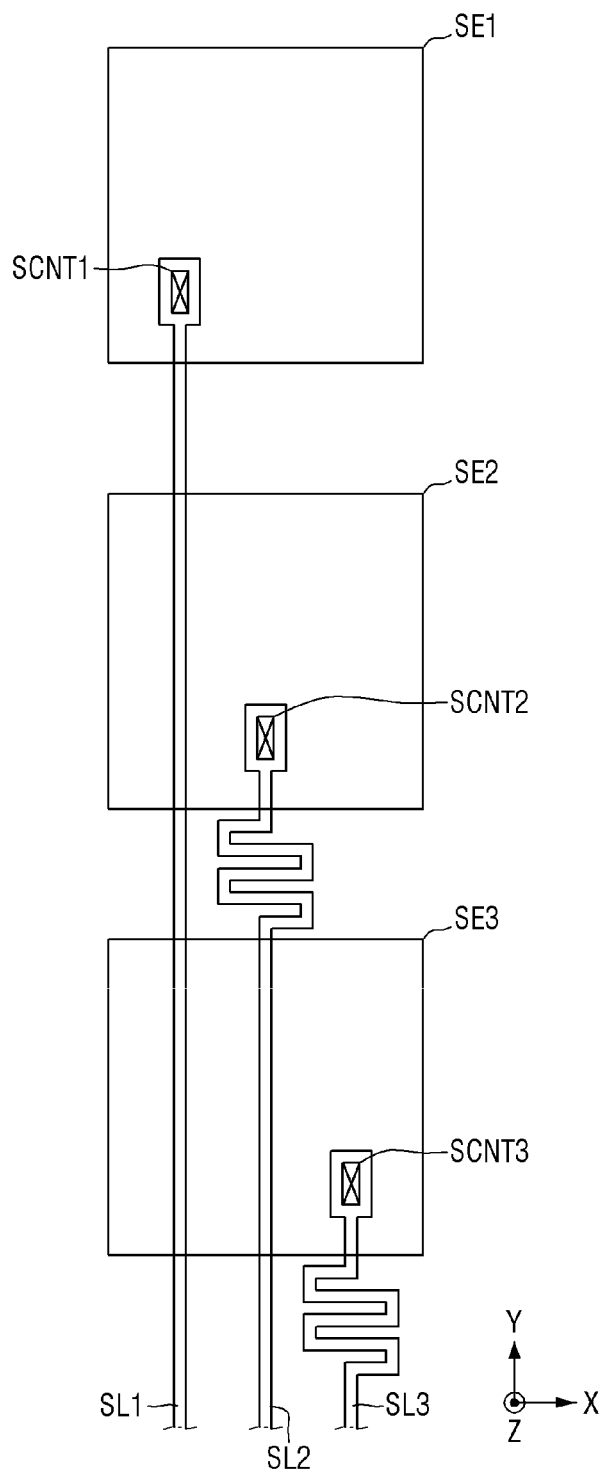
FIG. 28 is a layout view illustrating another example of sensor electrodes arranged in any one column and sensor line connected thereto according to one or more embodiments.

FIG. 28 is a layout view illustrating another example of sensor electrodes arranged in any one column and sensor line connected thereto.

The embodiment of FIG. 28 is different from the embodiment of FIG. 25 in that each of the second sensor line SL2 and the third sensor line SL3 has a serpentine shape including a plurality of bent portions.

Referring to FIG. 28, the second sensor line SL2 may have a serpentine shape including a plurality of bent portions between the second sensor electrode SE2 and the third sensor electrode SE3. The third sensor line SL3 may have a serpentine shape including a plurality of bent portions under the third sensor electrode SE3. For example, the second sensor line SL2 and the third sensor line SL3 may extend in one direction, bent in the other direction crossing the one direction, extend in a direction opposite to the one direction, and then bent in the other direction. The second sensor line SL2 may have a serpentine shape including a plurality of bent portions even under the third sensor electrode SE3.

As shown in FIG. 28, when each of the second sensor line SL2 and the third sensor line SL3 has a serpentine shape including a plurality of bent portions, a difference in resistance between the first to third sensor lines SL1, SL2, and SL3 may be lowered.

FIG. 29 is a layout view illustrating a sensor electrode layer of a display device according to one or more embodiments.

The embodiment of FIG. 29 is different from the embodiment of FIG. 6 in that a plurality of sub ground lines SGL connected to the second ground line CRL2 are provided.

Referring to FIG. 29, a plurality of sub-ground lines SGL may extend in the second direction (Y-axis direction). The plurality of sub-ground lines SGL may be connected to the second ground line GRL2 in the sensor peripheral area TPA, but the present disclosure is not limited thereto. The plurality of sub-ground lines SGL may be electrically floating without being connected to the second ground line GRL2.

The plurality of sub-ground lines SGL may be arranged in parallel to the sensor lines SL in the second direction (Y-axis direction). The plurality of sub-ground lines SGL may be electrically separated from the sensor lines SL. The plurality of sub-ground lines SGL may be disposed to be spaced from the sensor lines SL. Each of the plurality of sub-ground lines SGL may overlap at least one sensor electrode SE.

As shown in FIG. 29, due to a difference in the number of sensor lines SL in the area where the sensor lines SL are not arranged and in the area where the sensor lines SL are arranged, the area where the sensor lines SL are not arranged may be seen to the user to prevent (or substantially prevent) image quality from being deteriorated.

FIG. 30 is a layout view illustrating a sensor electrode layer of a display device according to one or more embodiments.

The embodiment of FIG. 30 is different from the embodiment of FIG. 6 in that a radio signal connection unit RFC is disposed on the display panel 300.

Referring to FIG. 30, the radio signal connection unit RFC may be disposed adjacent to the sensor pad area SPA. For example, the radio signal connection unit RFC may be disposed over the sensor pad area SPA. However, the position of the radio signal connection unit RFC is not limited thereto, and may be disposed adjacent to the sensor area TSA. In one or more embodiments, the radio signal connection unit RFC may be disposed in the entire space between the sensor pad area SPA and the sensor area TSA. In one or more embodiments, the radio signal connection unit RFC may also be disposed in the sensor area TSA.

The radio signal connection unit RFC may include radio signal lines RFLs. The radio signal lines RFLs may be connected one-to-one to the sensor pads TP of the sensor pad area SPA. Thus, the radio signal lines RFLs may be electrically connected to the antenna driving circuit 340 of the display circuit board 310.

Figure 31:
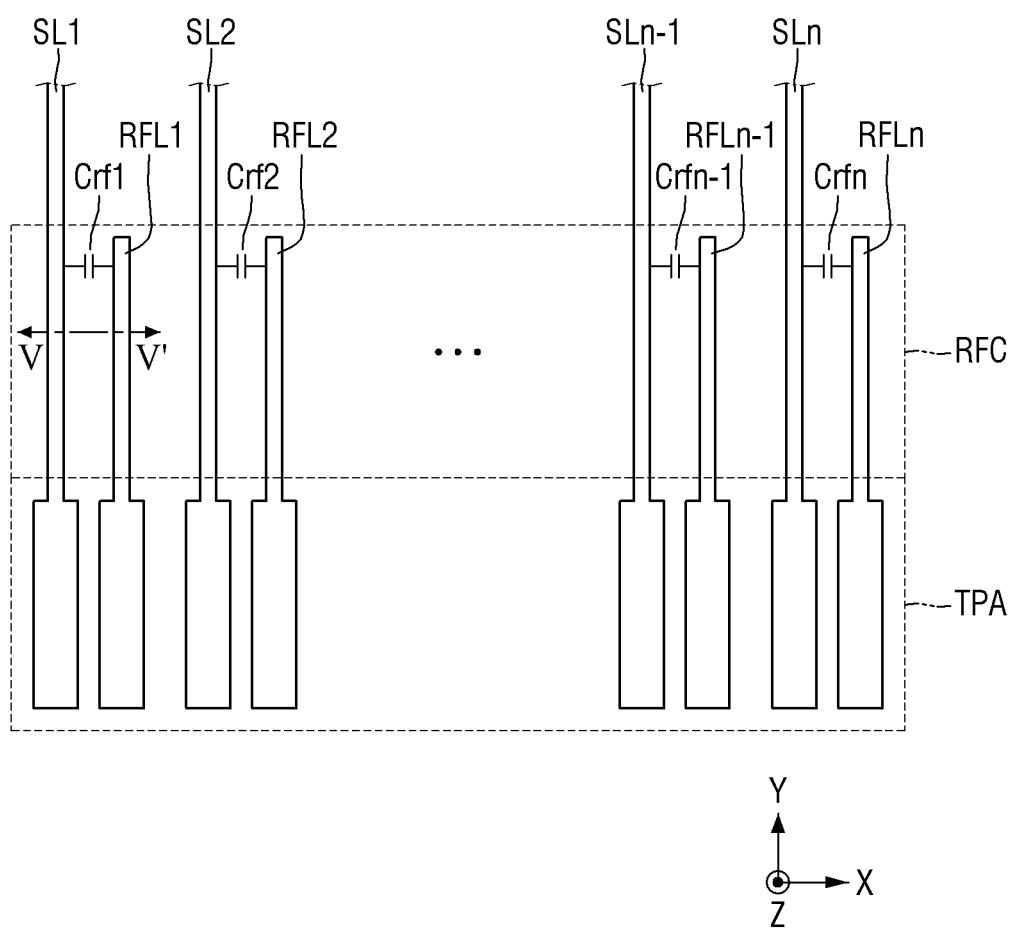
FIG. 31 is a layout view illustrating an example of the radio signal connection unit of FIG. 30.
Figure 32:
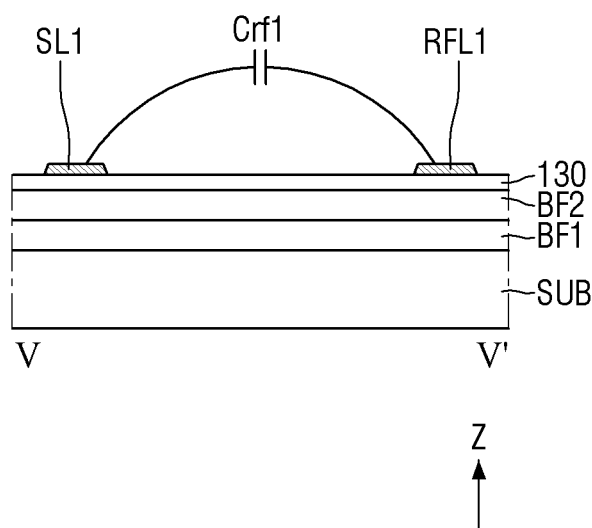
FIG. 32 is a cross-sectional view illustrating an example of a display panel taken along the line V-V' of FIG. 31.

FIG. 31 is a layout view illustrating an example of the radio signal connection unit of FIG. 30, and FIG. 32 is a cross-sectional view illustrating an example of a display panel taken along the line V-V' of FIG. 31.

Referring to FIGS. 31 and 32, radio signal lines RFL1 to RFLn and sensor lines SL1 to SLn may extend in the second direction (Y-axis direction). The radio signal lines RFL1 to RFLn and the sensor lines SL1 to SLn may be alternately arranged along the first direction (X-axis direction). In the first direction (X-axis direction), sensor lines SL1 to SLn may be disposed between adjacent radio signal lines RFL1 to RFLn, and in the first direction (X-axis direction), radio signal lines RFL1 to RFLn may be disposed between adjacent sensor lines SL1 to SLn.

Because the radio signal lines RFL1 to RFLn and the sensor lines SL1 to SLn are arranged in parallel to each other, as shown in FIG. 32, coupling capacitors Crf1 to Crfn corresponding to fringe capacitance may be formed between the radio signal lines RFL1 to RFLn and the sensor lines SL1 to SLn.

For example, as shown in FIG. 31, the first coupling capacitor Crf1 may be formed between the first radio signal line RFL1 and the first sensor line SL1, and the second coupling capacitor Crf2 may be formed between the second radio signal line RFL2 and the second sensor line SL2. In this case, the distance between the first radio signal line RFL1 and the first sensor line SL1 may be shorter than the distance between the first radio signal line RFL1 and the second sensor line SL2.

Further, the n−1th coupling capacitor Crfn−1 may be formed between the n−1th radio signal line RFLn−1 and the n−1th sensor line SLn−1, and the n-th coupling capacitor Crfn may be formed between the n-th radio signal line RFLn and the n-th sensor line SLn. In this case, the distance between the n−1th radio signal line RFLn−1 and the n−1th sensor line SLn−1 may be shorter than the distance between the n−1th radio signal line RFLn−1 and the n-th sensor line SLn.

The capacitance of the first coupling capacitor Crf1 may be proportional to the parallel lengths of the first sensor line SL1 and the first radio signal line RFL1. As the capacitance of the first coupling capacitor Crf1 increases, the signal coupling between the first sensor line SL1 and the first radio signal line RFL1 may be increased by the first coupling capacitor Crf1. Therefore, the parallel lengths of the first sensor line SL1 and the first radio signal line RFL1 may be designed in consideration of the capacitance of the first coupling capacitor Crf1.

The first sensor line SL1 and the first radio signal line RFL1 may be disposed at the same layer, and may be formed of the same material. For example, the sensor lines SL1 to SLn may be disposed on the third buffer film BF3 in the sensor area TSA as shown in FIG. 20, whereas the sensor lines SL1 to SLn may be disposed on the gate insulating film 130 in the sensor pad area SPA of the sensor peripheral area TPA and the radio signal connection unit RCF as shown in FIG. 32. In this case, the first sensor line SL1 and the first radio signal line RFL1 are disposed on the gate insulating film 130 as shown in FIG. 32, and may be formed of the same material as the gate electrode G of the thin film transistor ST shown in FIG. 20. In one or more embodiments, the first sensor line SL1 and the first radio signal line RFL1 may be disposed on the first interlayer insulating film 141 and may be formed of the same material as one electrode CE of the capacitor shown in FIG. 20. In one or more embodiments, the first sensor line SL1 and the first radio signal line RFL1 may be disposed on the second buffer film BF2 and may be formed of the same material as the active layer ACT of the thin film transistor ST shown in FIG. 20. In one or more embodiments, the first sensor line SL1 and the first radio signal line RFL1 may be disposed on the first buffer film BF1 and may be formed of the same material as the light blocking layer BML shown in FIG. 20.

As shown in FIGS. 31 and 32, because the radio signal lines RFL1 to RFLn and the sensor lines SL1 to SLn are arranged in parallel to each other, coupling capacitors Crf1 to Crfn corresponding to fringe capacitance may be formed between the radio signal lines RFL1 to RFLn and the sensor lines SL1 to SLn as shown in FIG. 32. Therefore, the signals of the sensor lines SL1 to SLn may be coupled to the radio signal lines RFL1 to RFLn by the coupling capacitors Crf1 to Crfn. Further, the signals of the radio signal lines RFL1 to RFLn may be coupled to the sensor lines SL1 to SLn by the coupling capacitors Crf1 to Crfn.

Figure 33:
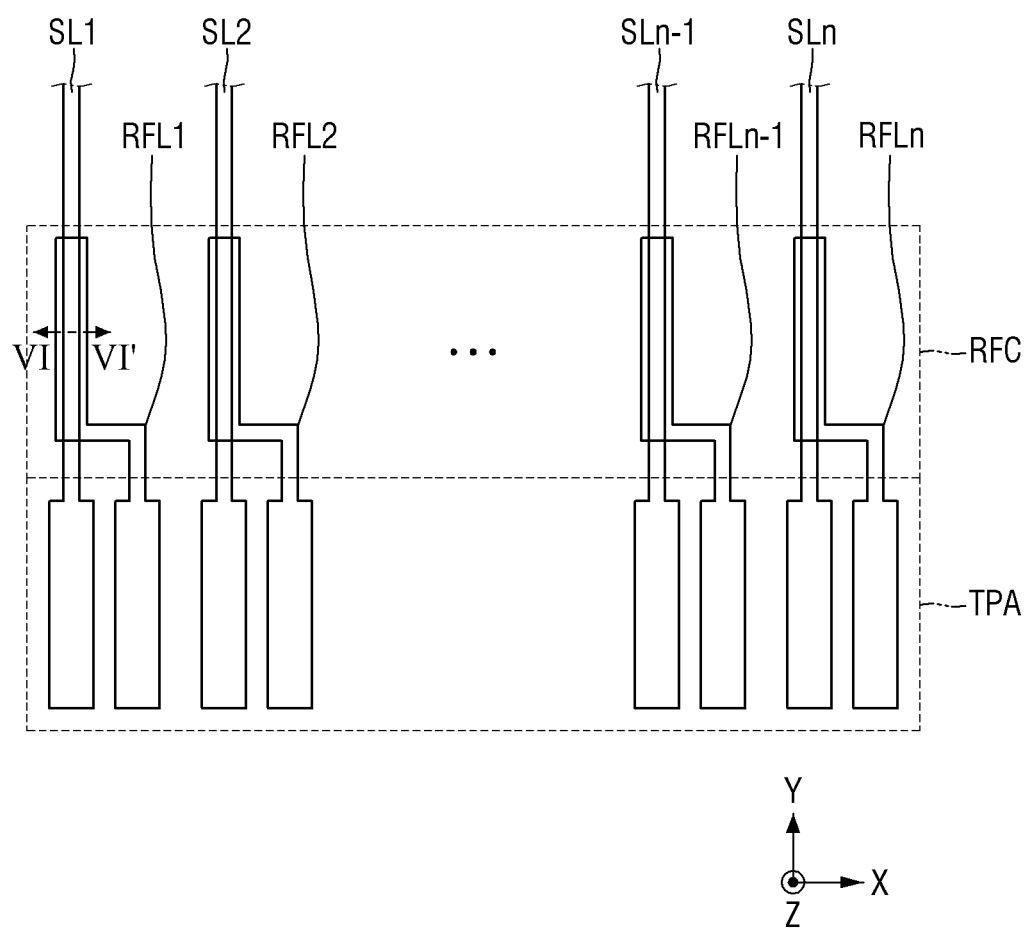
FIG. 33 is a layout view illustrating another example of the radio signal connection unit of FIG. 30.
Figure 34:
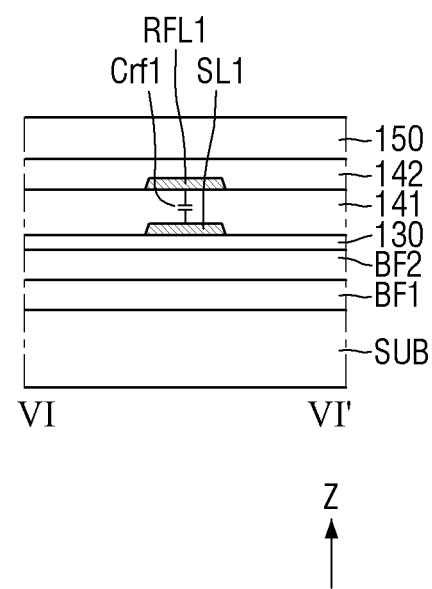
FIG. 34 is a cross-sectional view illustrating an example of a display panel taken along the line VI-VI' of FIG. 33.

FIG. 33 is a layout view illustrating another example of the radio signal connection unit of FIG. 30, and FIG. 34 is a cross-sectional view illustrating an example of a display panel taken along the line VI-VI' of FIG. 33.

The embodiment of FIGS. 33 and 34 is different from the embodiment of FIGS. 31 and 32 in that radio signal lines RFL1 to RFLn overlap sensor lines SL1 to SLn in the third direction (Z-axis direction) to form coupling capacitors Crf1 to Crfn.

Referring to FIGS. 33 and 34, because radio signal lines RFL1 to RFLn overlap sensor lines SL1 to SLn in the third direction (Z-axis direction), coupling capacitors Crf1 to Crfn may be formed between the radio signal lines RFL1 to RFLn and the sensor lines SL1 to SLn as shown in FIG. 34.

For example, as shown in FIG. 33, the first coupling capacitor Crf1 may be formed between the first radio signal line RFL1 and the first sensor line SL1, and the second coupling capacitor Crf2 may be formed between the second radio signal line RFL2 and the second sensor line SL2. Further, the n−1th coupling capacitor Crfn−1 may be formed between the n−1th radio signal line RFLn−1 and the n−1th sensor line SLn−1, and the n-th coupling capacitor Crfn may be formed between the n-th radio signal line RFLn and the n-th sensor line SLn.

The capacitance of the first coupling capacitor Crf1 may be proportional to the overlapping area between the first sensor line SL1 and the first radio signal line RFL1. As the capacitance of the first coupling capacitor Crf1 increases, signal coupling between the first sensor line SL1 and the first radio signal line RFL1 may be increased by the first coupling capacitor Crf1. Therefore, the overlapping area between the first sensor line SL1 and the first radio signal line RFL1 may be designed in consideration of the capacitance of the first coupling capacitor Crf1.

The first sensor line SL1 and the first radio signal line RFL1 may be disposed on different layers and may be formed of different materials. For example, the sensor lines SL1 to SLn may be disposed on the third buffer film BF3 in the sensor area TSA as shown in FIG. 20, whereas the sensor lines SL1 to SLn may be disposed on the gate insulating film 130 in the sensor pad area SPA of the sensor peripheral area TPA and the radio signal connection unit RCF as shown in FIG. 32. In this case, the first sensor line SL1 may be formed of the same material as the gate electrode G of the thin film transistor ST shown in FIG. 20, and the first radio signal line RFL1 may be disposed on the first interlayer insulating layer 141 as shown in FIG. 20 and may be formed of the same material as one electrode CE of the capacitor shown in FIG. 20. In one or more embodiments, the first radio signal line RFL1 may be disposed on the second buffer film BF2 and may be formed of the same material as the active layer ACT of the thin film transistor ST shown in FIG. 20. In one or more embodiments, the first radio signal line RFL1 may be disposed on the first buffer film BF1 and may be formed of the same material as the light blocking layer BML shown in FIG. 20.

As shown in FIGS. 33 and 34, because the radio signal lines RFL1 to RFLn overlap the sensor lines SL1 to SLn in the third direction (Z-axis direction), coupling capacitors Crf1 to Crfn may be formed between the radio signal lines RFL1 to RFLn and the sensor lines SL1 to SLn as shown in FIG. 34. Therefore, the signals of the sensor lines SL1 to SLn may be coupled to the radio signal lines RFL1 to RFLn by the coupling capacitors Crf1 to Crfn. Further, the signals of the radio signal lines RFL1 to RFLn may be coupled to the sensor lines SL1 to SLn by the coupling capacitors Crf1 to Crfn.

Figure 35:
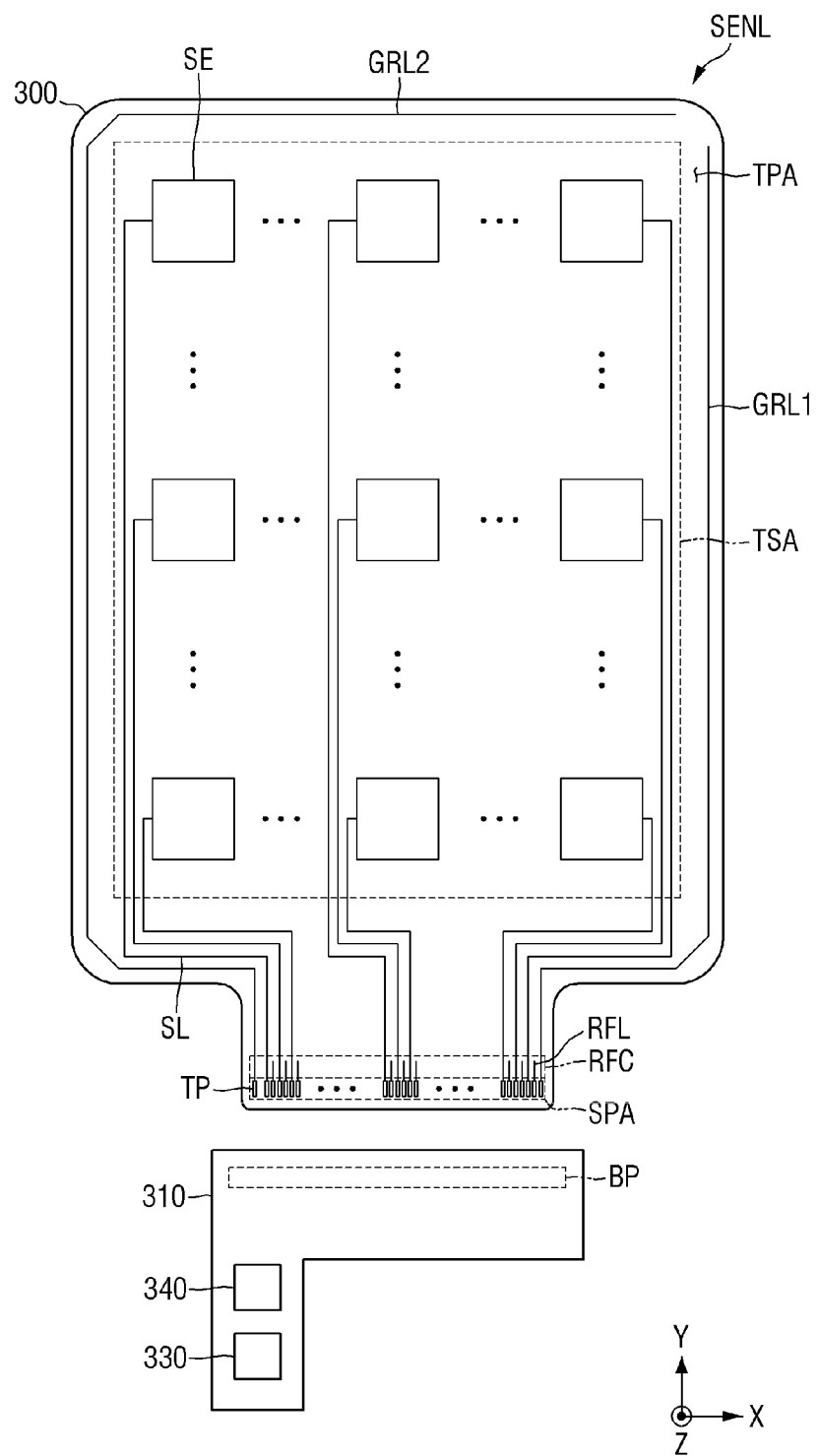
FIG. 35 is a layout view illustrating a sensor electrode layer of a display device according to one or more embodiments.

FIG. 35 is a layout view illustrating a sensor electrode layer of a display device according to one or more embodiments.

The embodiment of FIG. 35 is different from the embodiment of FIG. 30 in that sensor lines SL do not overlap any of sensor electrodes SE in the third direction (Z-axis direction).

Referring to FIG. 35, the sensor line SL may be disposed on one side of the sensor electrode SE. The sensor line SL and the sensor electrode SE are disposed at the same layer and may be formed of the same material. For example, the sensor line SL and the sensor electrode SE may be disposed on the third buffer film BF3 shown in FIG. 20.

Figure 36:
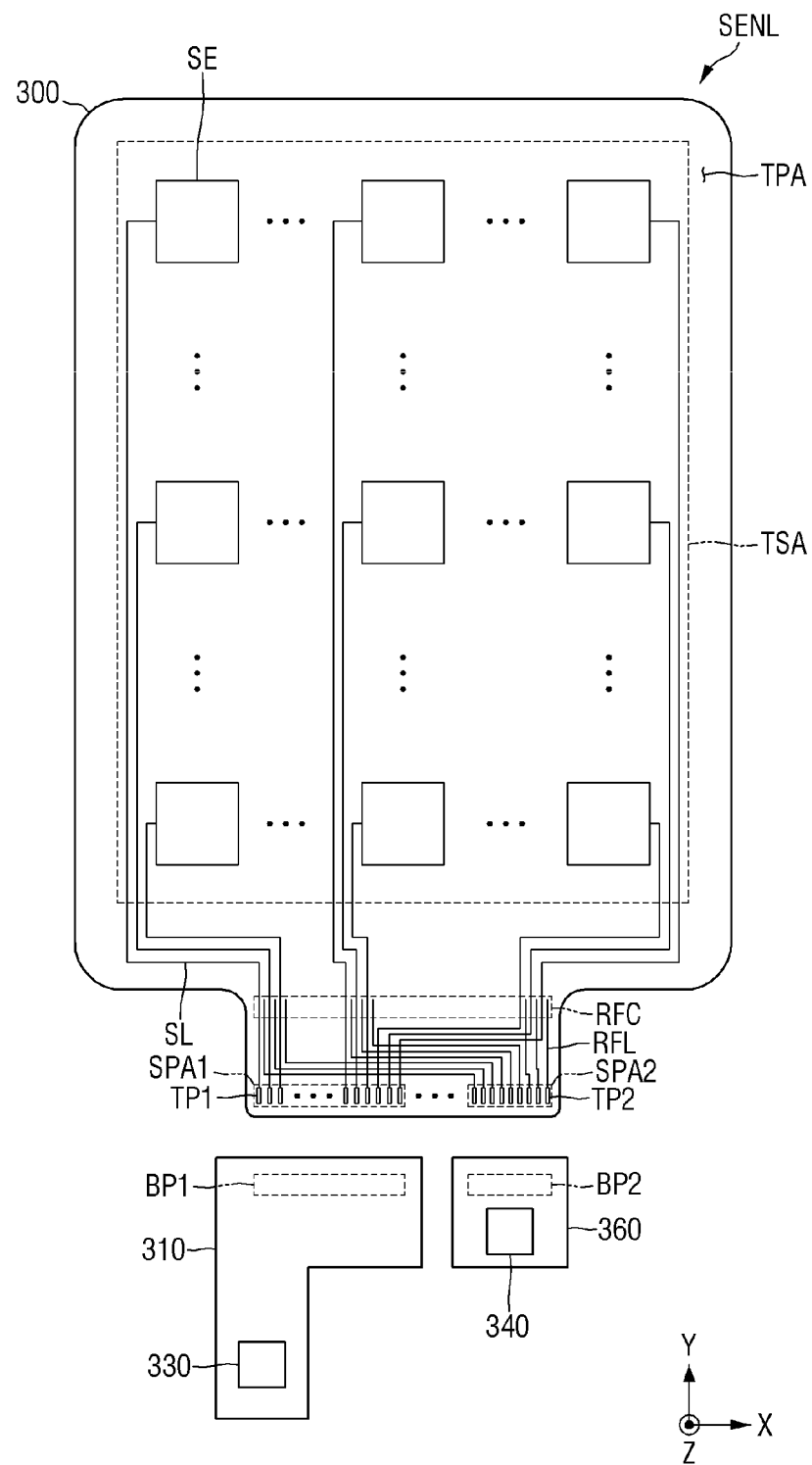
FIG. 36 is a layout view illustrating a sensor electrode layer of a display device according to one or more embodiments.

FIG. 36 is a layout view illustrating a sensor electrode layer of a display device according to one or more embodiments.

The embodiment of FIG. 36 is different from the embodiment of FIG. 35 in that the sensor lines SL are connected to the first sensor pads TP1 of the first sensor pad area SPA1 disposed on one side from among the sensor pad areas SPA1 and SPA2, and the radio signal lines RFL of the radio signal connection unit RFC are connected to the second sensor pads TP2 of the second sensor pad area SPA2 disposed on the other side from among the sensor pad areas SPA1 and SPA2.

Referring to FIG. 36, the sensor lines SL may be connected to the first sensor pads TP1 of the first sensor pad area SPA1 disposed on the left side from among the sensor pad areas SPA1 and SPA2. The first sensor pads TP1 of the first sensor pad area SPA1 may be electrically connected to the first bumps of the first bump area BP1 of the display circuit board 310 through an anisotropic conductive film. Thus, the sensor lines SL may be electrically connected to the touch driving circuit 330 of the display circuit board 310.

The radio signal lines RFL of the radio signal connection unit RFC may be connected to the second sensor pads TP2 of the second sensor pad area SPA2 disposed on the right side from among the sensor pad areas SPA1 and SPA2. The second sensor pads TP2 of the second sensor pad area SPA2 may be electrically connected to the second bumps of the second bump area BP2 of the antenna circuit board 360 through an anisotropic conductive film. Thus, the radio signal lines RFLs may be electrically connected to the antenna driving circuit 340 of the antenna circuit board 360.

As shown in FIG. 36, the first sensor pad area SPA1 including the first sensor pads TP1 connected to the sensor lines SL are disposed on one side of the sensor pad areas SPA1 and SPA2, and the second sensor pad area SPA2 including the second sensor pads TP2 connected to the radio signal lines RFL is disposed on the other side of the sensor pad areas SPA1 and SPA2, thereby connecting the first sensor pad area SPA1 and the second sensor pad area SPA2 to different circuit boards from each other. Therefore, the touch driving circuit 330 and the antenna driving circuit 340 may be disposed on different circuit boards from each other.

Figure 37:
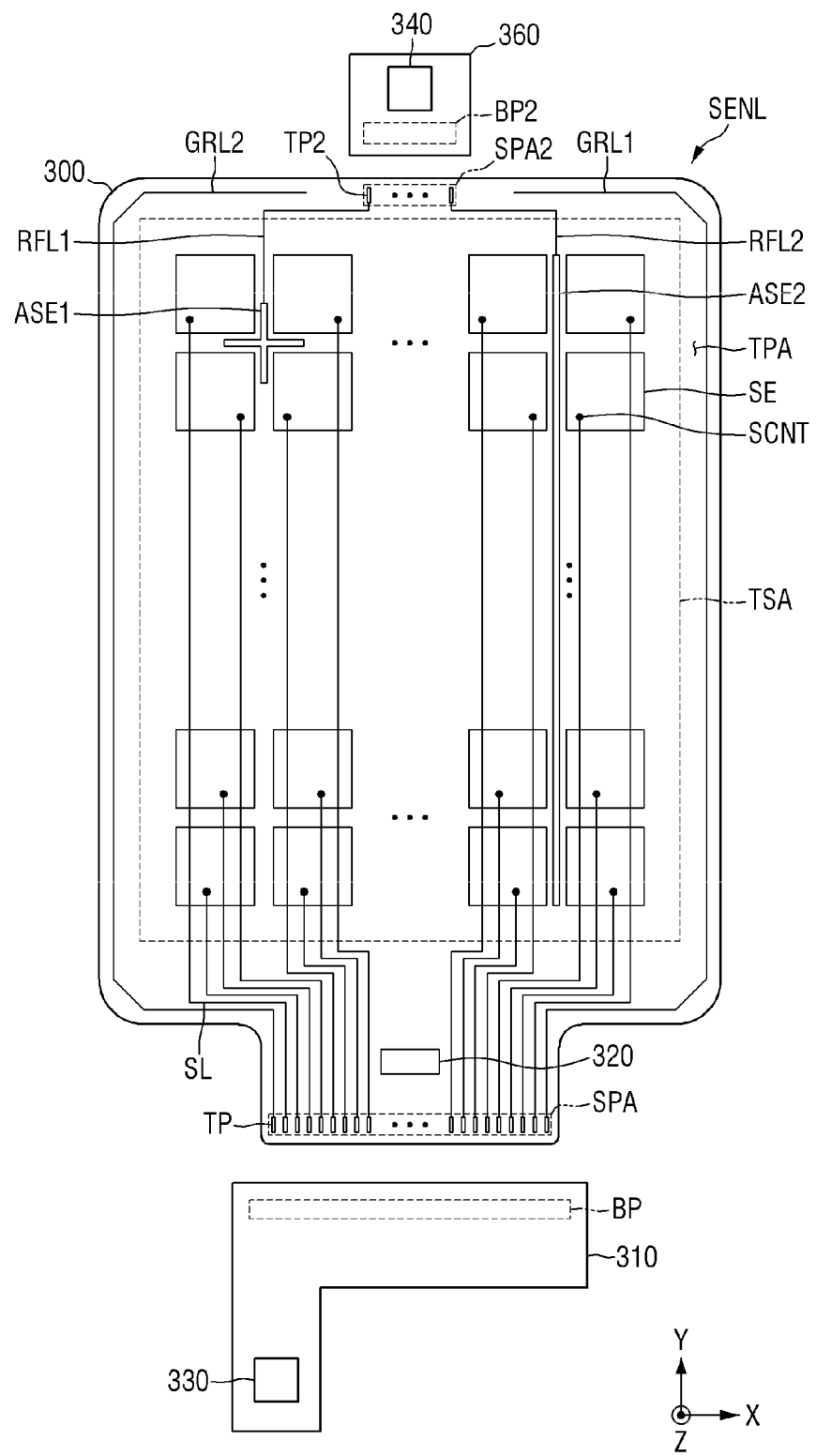
FIG. 37 is a layout view illustrating a sensor electrode layer of a display device according to one or more embodiments.

FIG. 37 is a layout view illustrating a sensor electrode layer of a display device according to one or more embodiments.

The embodiment of FIG. 37 is different from the embodiment of FIG. 6 in that separate antenna electrodes ASE1 and ASE2 are disposed between sensor electrodes SE.

Referring to FIG. 37, the first antenna electrode ASE1 may be disposed between four sensor electrodes SE adjacent to each other in the first direction (X-axis direction) and the second direction (Y-axis direction). The first antenna electrode ASE1 may have a planar shape of a cross. The first antenna electrode ASE1 may be connected to the first radio signal line RFL1.

The second antenna electrode ASE2 may extend in the second direction (Y-axis direction). The second antenna electrode ASE2 may be disposed between sensor electrodes SE disposed in a k-th column (k is a positive integer) and sensor electrodes SE disposed in a k+1th column. The second antenna electrode ASE2 may have a planar shape of a bar. The second antenna electrode ASE2 may be connected to the second radio signal line RFL2.

The first radio signal line RFL1 and the second radio signal line RFL2 may be connected to the second sensor pads TP2 of the second sensor pad area SPA2 disposed at the upper side of the display panel 300. The second sensor pads TP2 of the second sensor pad area SPA2 may be electrically connected to the second bumps of the second bump area BP2 of the antenna circuit board 360 through an anisotropic conductive film. Thus, the radio signal lines RFLs may be electrically connected to the antenna driving circuit 340 of the antenna circuit board 360.

As shown in FIG. 37, when separate antenna electrodes ASE1 and ASE2 are disposed between the sensor electrodes SE, the radio signal connection unit RFC may be omitted.

Further, the radio signal lines RFL1 and RFL2 connected to the antenna electrodes ASE1 and ASE2 may be connected to the second sensor pads TP2 of the second sensor pad area SPA2 disposed at the upper side of the display panel 300, and the second sensor pads TP2 may be electrically connected to the second bumps of the second bump area BP2 of the antenna circuit board 360 provided with the antenna driving circuit 340. Therefore, the touch driving circuit 330 and the antenna driving circuit 340 may be disposed on different circuit boards from each other.

Figure 38:
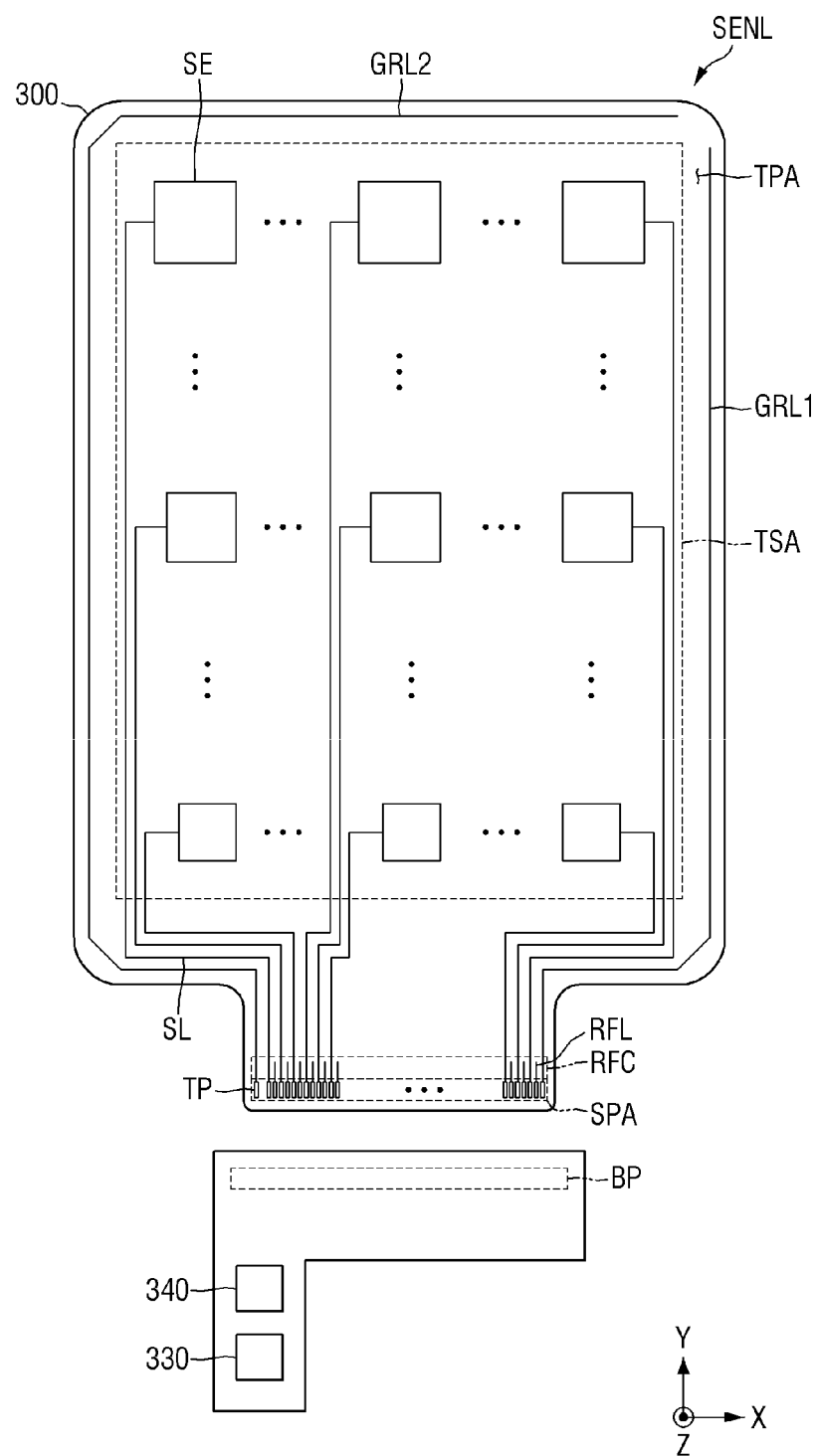
FIG. 38 is a layout view illustrating a sensor electrode layer of a display device according to one or more embodiments.

FIG. 38 is a layout view illustrating a sensor electrode layer of a display device according to one or more embodiments.

The embodiment of FIG. 38 is different from the embodiment of FIG. 35 in that the area of the sensor electrode SE decreases from the upper side toward the lower side of the sensor area TSA.

Referring to FIG. 38, the number of the sensor lines SL increases from the upper side toward the lower side of the sensor area TSA. Therefore, a space in which the sensor lines SL are disposed may be secured by decreasing the area of the sensor electrode SE from the upper side toward the lower side of the sensor area TSA. Further, because the resistance of the sensor line SL connected to the sensor electrode SE disposed at the upper side of the sensor area TSA is larger than the resistance of the sensor line SL connected to the sensor electrode SE disposed at the lower side of the sensor area TSA, the area of the sensor electrode SE may increase from the lower side toward the upper side of the sensor area TSA.

Figure 39:
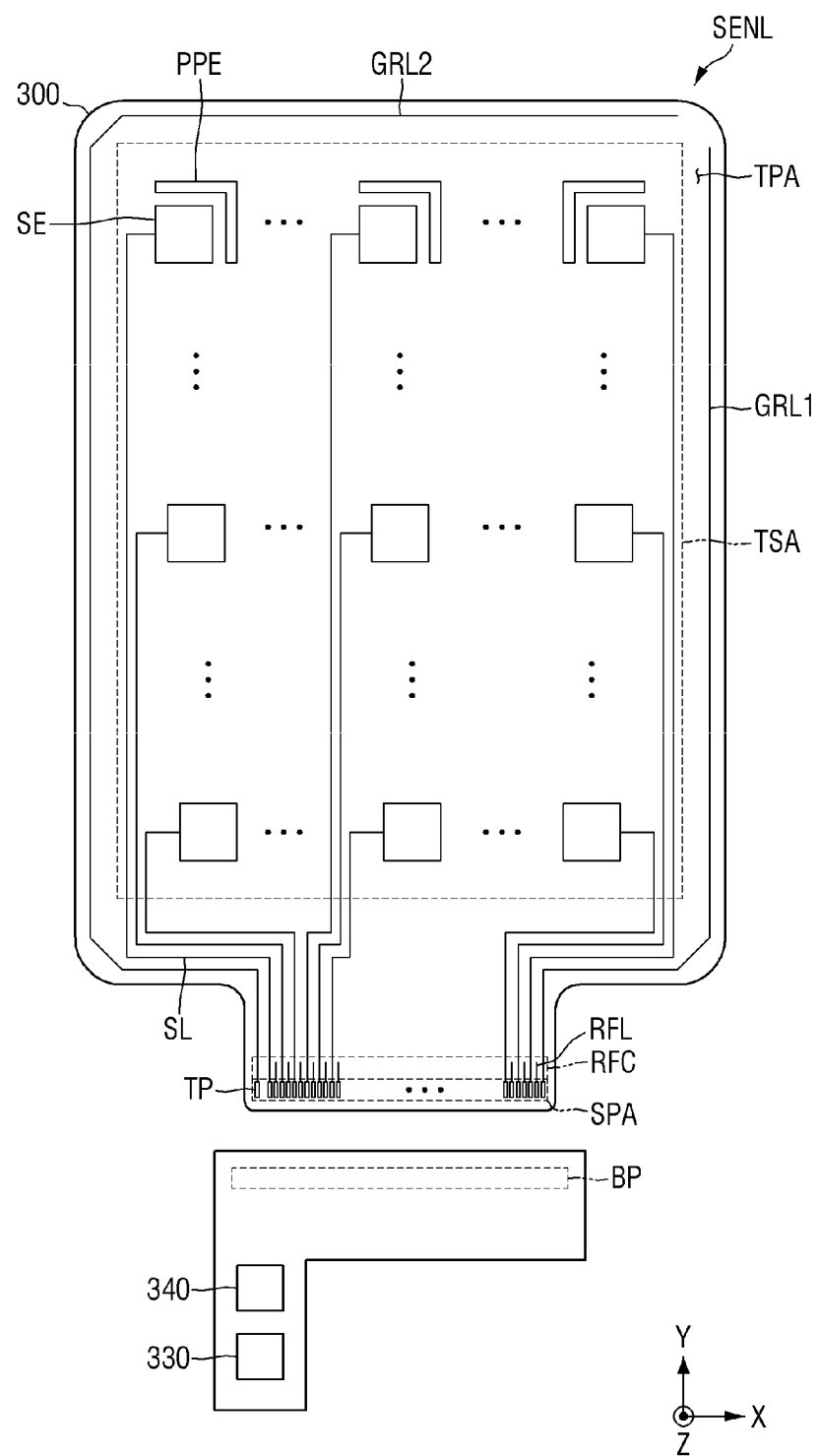
FIG. 39 is a layout view illustrating a sensor electrode layer of a display device according to one or more embodiments.

FIG. 39 is a layout view illustrating a sensor electrode layer of a display device according to one or more embodiments.

The embodiment of FIG. 39 is different from the embodiment of FIG. 38 in that the area of each of the sensor electrodes SE in the sensor area TSA is substantially the same, and the sensor electrode SE adjacent to the upper side of the sensor area TSA includes a protection pattern PPE.

Referring to FIG. 39, when considering the resistance of the sensor line SL, in some embodiments, the area of the sensor electrode SE increases from the lower side toward the upper side of the sensor area TSA. However, when the area of the sensor electrode SE becomes larger than the area required for 5G communication, it may be difficult to perform a normal role as an antenna. Therefore, the sensor electrode SE may include the protection pattern PPE disposed at least one side of the sensor electrode SE without increasing the area of the sensor electrode SE from the lower side toward the upper side of the sensor area TSA.

Although it is illustrated in FIG. 39 that the protection pattern PPE is disposed at two sides of the sensor electrode SE, the present disclosure is not limited thereto. Further, although it is illustrated in FIG. 39 that the protection pattern PPE is formed in an '¬' shape that is bent at least once, the present disclosure is not limited thereto.

The protection pattern PPE may be electrically floated or connected to the second ground line CRL2 to receive a ground voltage. In this case, because static electricity applied to the sensor electrode SE may be discharged to the protective pattern PPE, the sensor electrode SE may be protected from static electricity.

Figure 40:
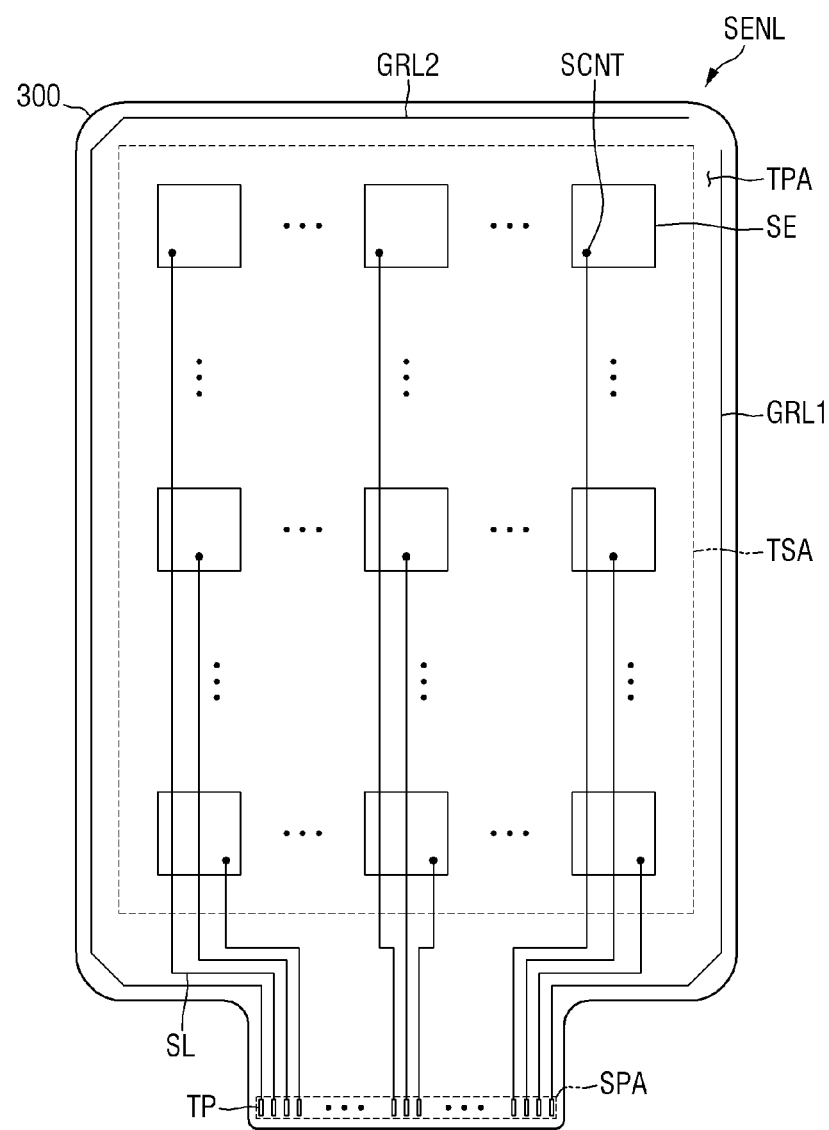
FIG. 40 is a layout view illustrating a sensor electrode layer of a display device according to one or more embodiments.

FIG. 40 is a layout view illustrating a sensor electrode layer of a display device according to one or more embodiments.

The embodiment of FIG. 40 is different from the embodiment of FIG. 6 in that the display device 10 includes a switching circuit unit SWC instead of the radio signal connection unit RFC.

Although it is illustrated in FIG. 40 that the switching circuit unit SWC is disposed on the display circuit board 310, the present disclosure is not limited thereto. The switching circuit unit SWC may be disposed on the display panel 300 as shown in FIG. 30. In this case, the switching circuit unit SWC may be disposed in a space between the sensor pad area SPA and the sensor area TSA.

Figure 41A:
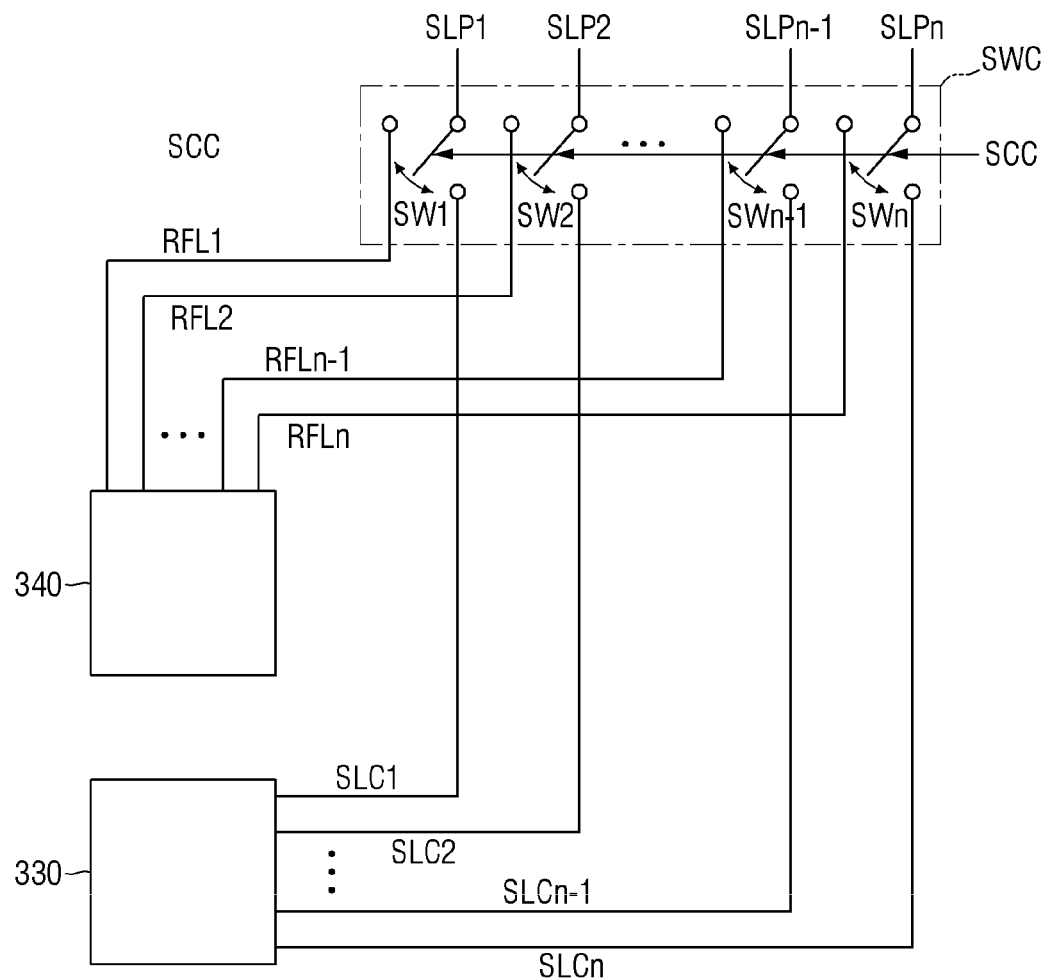
FIG. 41A is a circuit diagram illustrating an example of the switching circuit unit of FIG. 40.

FIG. 41A is a circuit diagram illustrating an example of the switching circuit unit of FIG. 40.

The embodiment of FIG. 41A is different from the embodiment of FIG. 7 in that a switching circuit unit SWC is provided instead of the radio signal connection unit RFC.

Referring to FIG. 41A, the display circuit board 310 may include sensor circuit lines SLP1 to SLPn, radio signal lines RFL1 to RFLn, sensor connection lines SLC1 to SLCn, and switching elements SW1 to SWn of the switching circuit unit.

One end of each of the sensor circuit lines SLP1 to SLPn may be connected to any one of the bumps of the bump area BP of FIG. 6, and the other end thereof may be connected to any one of the switching elements SW1 to SWn. Because the sensor circuit lines SLP1 to SLPn are connected to the pads TP of the display panel 300 through bumps, the sensor circuit lines SLP1 to SLPn may be electrically connected to the sensor electrodes SE and the sensor lines SL of the display panel 300.

One end of each of the radio signal lines RFL1 to RFLn may be connected to any one of the switching elements SW1 to SWn, and the other end thereof may be connected to the antenna driving circuit 340.

One end of each of the sensor connection lines SLC1 to SLCn may be connected to any one of the switching elements SW1 to SWn, and the other end thereof may be connected to the touch driving circuit 330.

Each of the switching elements SW1 to SWn may connect any one of the sensor circuit lines SLP1 to SLPn to any one of the sensor connection lines SLC1 to SLCn or any one of the radio signal lines RFL1 to RFLn according to a switching control signal SCC. The switching control signal SCC may be output from the touch driving circuit 330. The switching control signal SCC may be output from the antenna driving circuit 340.

For example, the first switching circuit SW1 may connect the first sensor circuit line SLP1 to any one of the first sensor connection line SLC1 and the first radio signal line RFL1 according to the switching control signal SCC. The second switching circuit SW2 may connect the second sensor circuit line SLP2 to any one of the second sensor connection line SLC2 and the second radio signal line RFL2 according to the switching control signal SCC. The n−1th switching circuit SWn−1 may connect the n−1th sensor circuit line SLPn−1 to any one of the n−1th sensor connection line SLCn−1 and the n−1th radio signal line RFLn−1 according to the switching control signal SCC. The n-th switching circuit SWn may connect the n-th sensor circuit line SLPn to any one of the n-th sensor connection line SLCn and the n-th radio signal line RFLn according to the switching control signal SCC.

As shown in FIG. 41A, when the sensor circuit lines SLP1 to SLPn are connected to the sensor connection lines SLC1 to SLCn by the switching elements SW1 to SWn, the sensor electrodes SE may be electrically connected to the touch driving circuit 330. Further, when the sensor circuit lines SLP1 to SLPn are connected to the radio signal lines RFL1 to RFLn by the switching elements SW1 to SWn, the sensor electrodes SE may be electrically connected to the antenna driving circuit 340. Therefore, the touch driving circuit 330 and the antenna driving circuit 340 are capable of time division duplex.

Figure 41B:
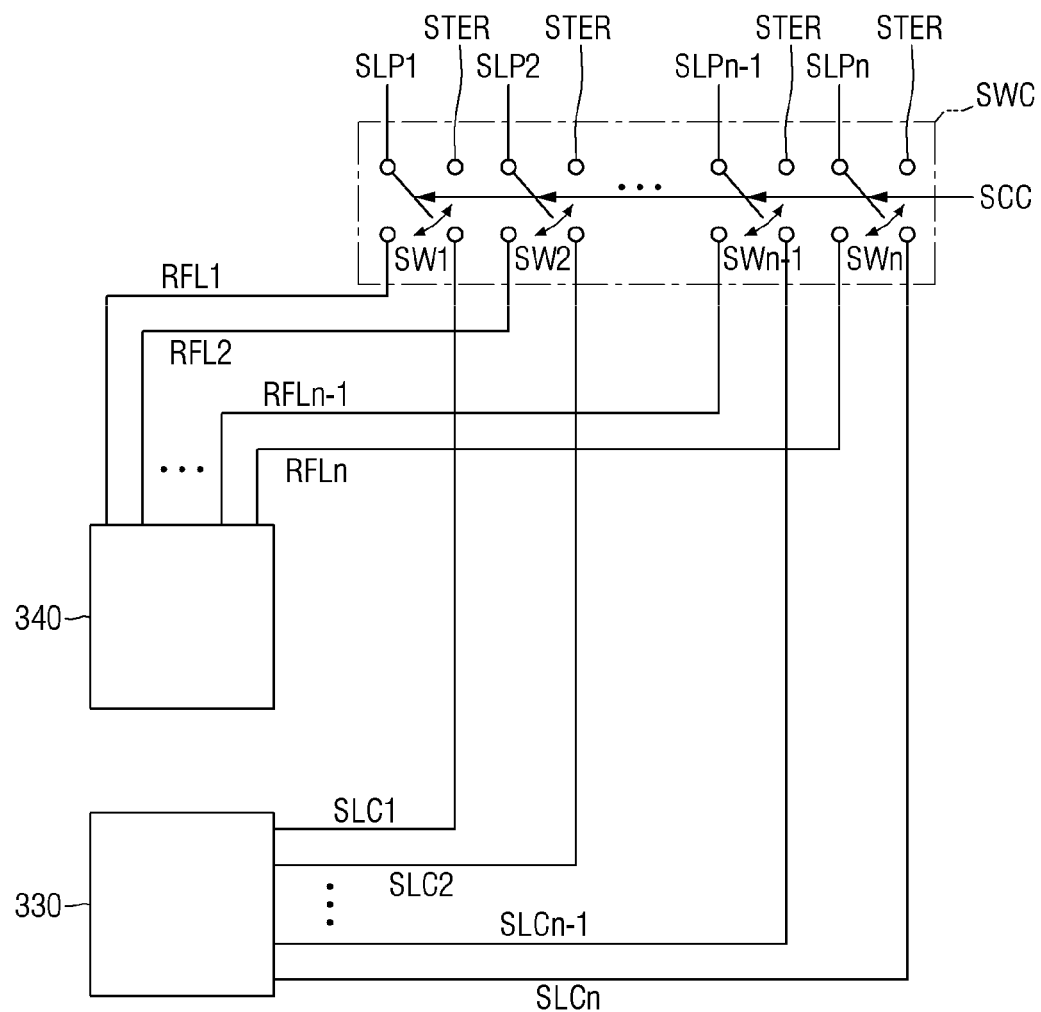
FIG. 41B is a circuit diagram illustrating another example of the switching circuit unit of FIG. 40.

FIG. 41B is a circuit diagram illustrating another example of the switching circuit unit of FIG. 40.

The embodiment of FIG. 41B is different from the embodiment of FIG. 41A in that each of the switching elements SW1 to SWn may connect any one of the sensor circuit lines SLP1 to SLPn to any one of the sensor connection lines SLC1 to SLCn, any one of the coupling capacitors Crf1 to Crfn connected to the radio signal lines RFL1 to RFLn, or any one of the separation terminals STER according to the switching control signal SCC.

As shown in FIG. 41B, when the sensor circuit lines SLP1 to SLPn are connected to the sensor connection lines SLC1 to SLCn by the switching elements SW1 to SWn, the sensor electrodes SE may be electrically connected to the touch driving circuit 330. Further, when the sensor circuit lines SLP1 to SLPn are connected to the coupling capacitors Crf1 to Crfn connected to the radio signal lines RFL1 to RFLn by the switching elements SW1 to SWn, the sensor electrodes SE may be electrically connected to the antenna driving circuit 340. Further, when the sensor circuit lines SLP1 to SLPn are connected to the separation terminals STER by the switching elements SW1 to SWn, the sensor circuit lines SLP1 to SLPn, the coupling capacitors Crf1 to Crfn connected to the radio signal lines RFL1 to RFLn, and the sensor connection lines SLC1 to SLCn may be electrically separated from each other.

Figure 42:
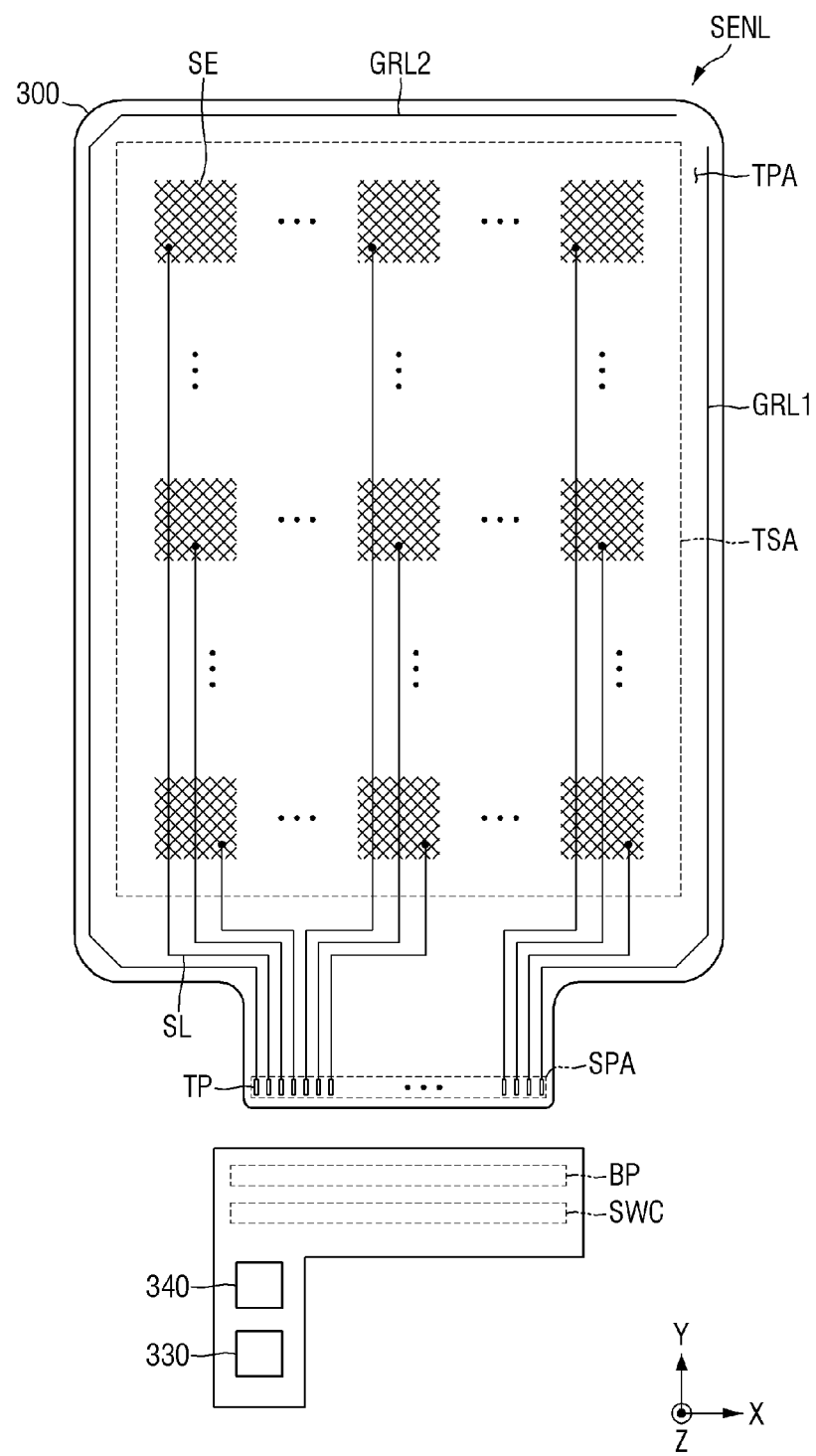
FIG. 42 is a cross-sectional view illustrating a display device according to one or more embodiments.
Figure 44:
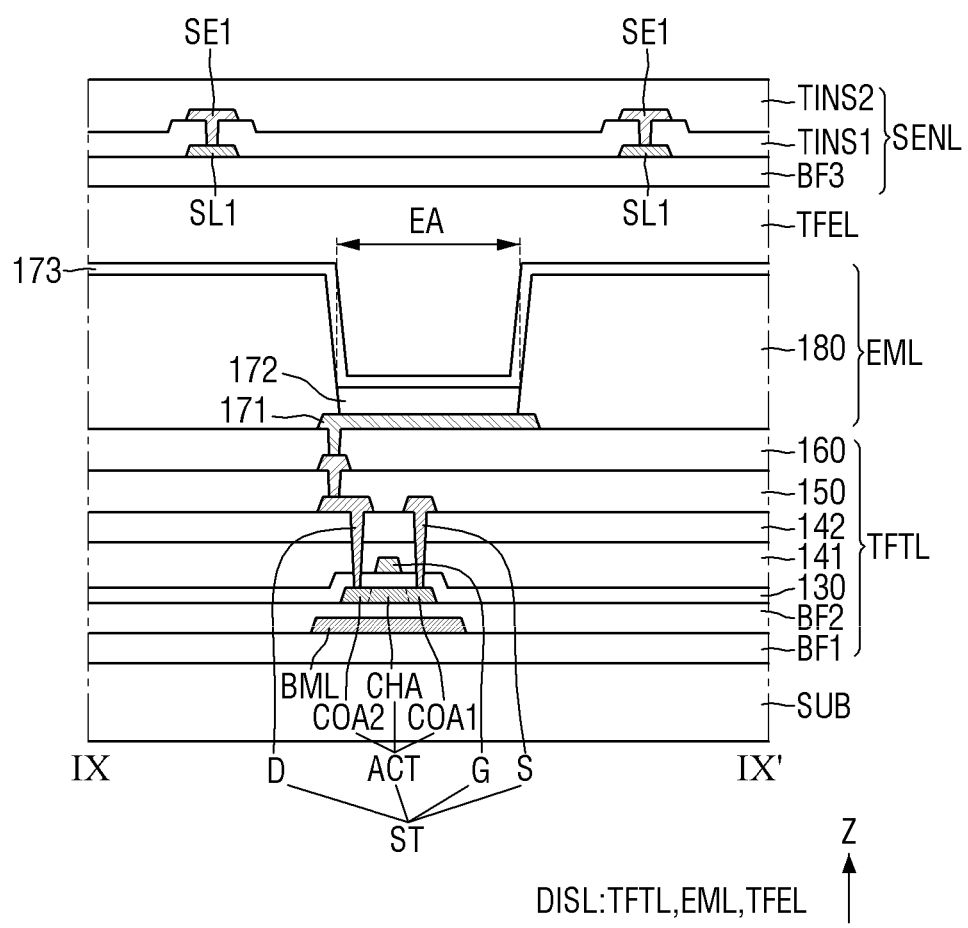
FIG. 44 is a cross-sectional view illustrating an example of a display panel taken along the line IX-IX' of FIG. 43.

FIG. 42 is a cross-sectional view illustrating a display device according to one or more embodiments, FIG. 43 is a layout view illustrating an example of the sensor line, the sensor electrode, and the sensor contact unit of FIG. 42, and FIG. 44 is a cross-sectional view illustrating an example of a display panel taken along the line IX-IX' of FIG. 43.

Referring to FIGS. 42-44, the sensor electrode SE and the sensor line SL may have a mesh structure or a network structure in a plan view. The sensor electrode SE and the sensor line SL may not overlap the light emitting areas EA. Therefore, light emitted from the light emitting areas EA is not blocked by the sensor electrode SE, thereby preventing the luminance of light from being lowered.

The sensor electrode SE and the sensor line SL may extend in the fourth direction DR4 and the fifth direction DR5. The fourth direction DR4 may be inclined by about 45° with respect to the first direction (X-axis direction), but is not limited thereto. The fifth direction DR5 may be inclined by about 45° with respect to the second direction (Y-axis direction), but is not limited thereto.

The sensor electrode SE may be connected to the sensor line SL through the sensor contact units SCNT1. The sensor line SL may be disposed on the third buffer film BF3, and the sensor electrode SE may be disposed on the first sensor insulating film TINS1. The sensor contact unit SCNT1 may be a hole that penetrates the first sensor insulating film TINS1 and exposes the sensor line SL. Each of the sensor electrode SE and the sensor line SL may be formed of a single layer of molybdenum (Mo), titanium (Ti), copper (Cu), or aluminum (Al), or may be formed as a laminate structure (Ti/Al/Ti) of aluminum and titanium, a laminate structure (ITO/Al/ITO) of aluminum and ITO, an APC alloy structure, or a laminate structure (ITO/APC/ITO) of an APC alloy and ITO.

The light emitting areas EA may include first light emitting areas RE, second light emitting areas GE, and third light emitting areas BE. Each of the first light emitting areas RE may emit light of a first color, and each of the second light emitting areas GE may emit light of a second color, and each of the third light emitting areas BE may emit light of a third color. For example, the first color may be red, the second color may be green, and the third color may be blue, but the present disclosure is not limited thereto.

Each of the first light emitting areas RE, the second light emitting areas GE, and the third light emitting areas BE has been illustrated as having a rhombic planar shape or a rectangular planar shape, but the shape thereof is not limited thereto. Each of the first light emitting areas RE, the second light emitting areas GE, and the third light emitting areas BE may have a planar shape such as polygon other than rectangle, circle, or ellipse. Further, although it is illustrated that the area of the third light emitting area BE is the largest and the area of the second light emitting area GE is the smallest, the present disclosure is not limited thereto.

One first light emitting area RE, two second light emitting areas GE, and one third light emitting area BE may be defined as one light emitting group EG for expressing white gradation. For example, white gradation may be expressed by the combination of light emitted from one first light emitting area RE, light emitted from two second light emitting areas GE, and light emitted from one third light emitting area BE.

The second light emitting areas GE may be arranged in odd rows. The second light emitting areas GE may be arranged in parallel in the first direction (X-axis direction) in each of the odd rows. In each of the odd rows, any one of the second light emitting areas GE adjacent in the first direction (X-axis direction) has a long side in the fourth direction DR4 and a short side in the fifth direction DR5, whereas the other one thereof may have a long side in the fifth direction DR5 and a short side in the fourth direction DR4. The fourth direction DR4 may be a direction between the first direction (X-axis direction) and the second direction (Y-axis direction), and the fifth direction DR5 may be a direction crossing the fourth direction DR4.

The first light emitting areas RE and the third light emitting areas BE may be arranged in even rows. The first light emitting areas RE and the third light emitting areas BE may be arranged in parallel in the second direction (Y-axis direction) in each of the even rows. The first light emitting areas RE and the third light emitting areas BE may be alternately arranged in each of the even rows.

The second light emitting areas GE may be arranged in even columns. The second light emitting areas GE may be arranged in parallel in the second direction (Y-axis direction) in each of the even columns. In each of the even columns, any one of the second light emitting areas GE adjacent in the second direction (Y-axis direction) may have a short side in the fifth direction DR5 and a long side in the fourth direction DR4. Also, the other of the second light emitting areas GE adjacent in the second direction (Y-axis direction) may have a long side in the fifth direction DR5 and a short side in the fourth direction DR4.

The first light emitting areas RE and the third light emitting areas BE may be arranged in odd columns. The first light emitting areas RE and the third light emitting areas BE may be arranged in parallel in the second direction (Y-axis direction) in each of the odd columns. The first light emitting areas RE and the third light emitting areas BE may be alternately arranged in each of the odd columns.

Figure 45:
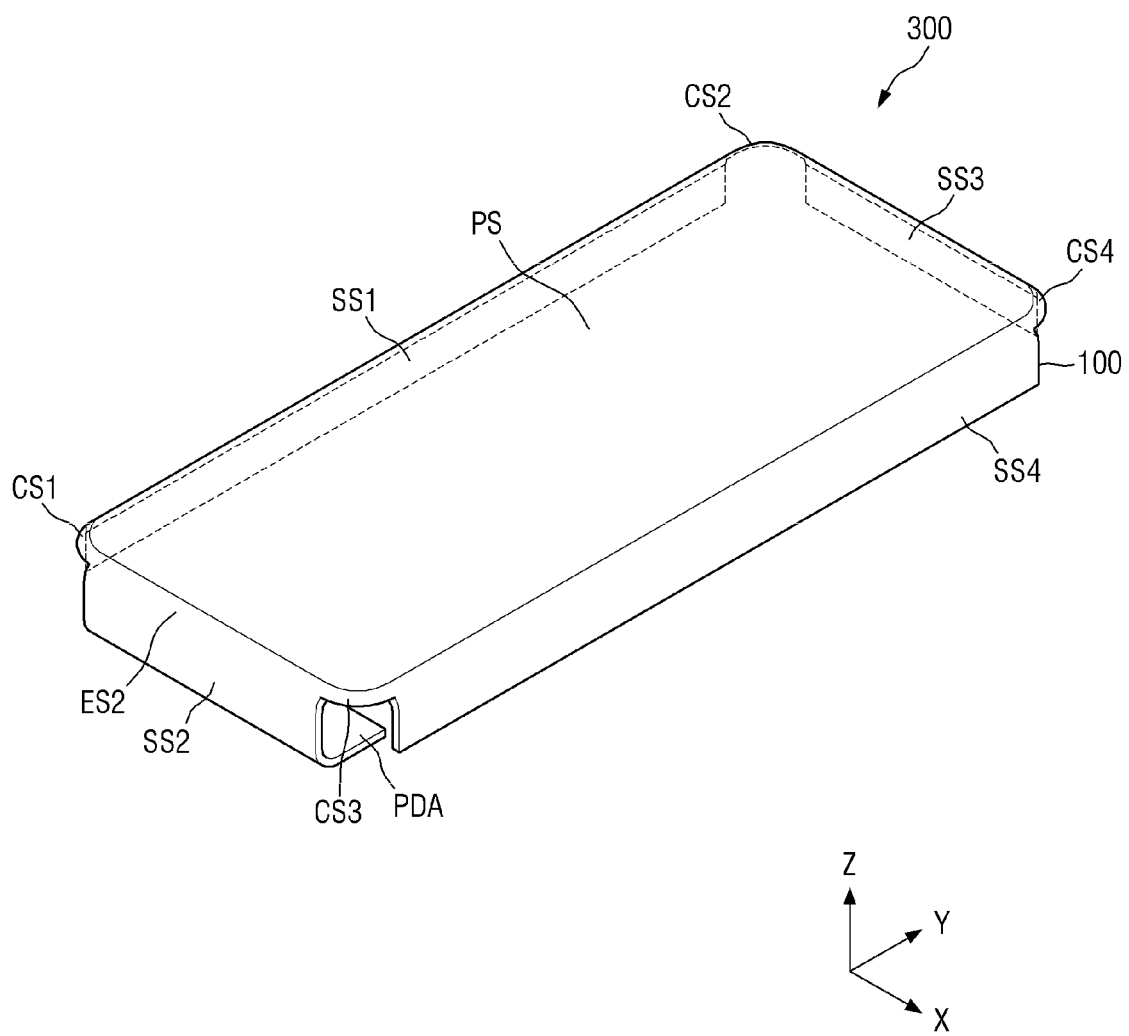
FIG. 45 is a perspective view of a display device according to one or more embodiments.

FIG. 45 is a perspective view of a display device according to another embodiment. FIG. 45 illustrates that the display device 10 displays images on four side surfaces as well as one front surface.

Referring to FIG. 45, the display panel 300 includes surface including a front portion PS, a first side portion SS1, a second side portion SS2, a third side portion SS3, a fourth side portion SS4, and a first corner portion CS1, a second corner portion CS2, a third corner portion CS3, and a fourth corner portion CS4.

The front portion PS of the display panel 300 may have a rectangular planar shape having short sides in the first direction (X-axis direction) and long sides in the second direction (Y-axis direction), but the present disclosure is not limited thereto. The front portion PS may have another polygonal planar shape, a circular planar shape, or an elliptical planar shape. In the front portion PS, the corner where the short side meets the long side may be formed to be bent with a set curvature (e.g., a predetermined curvature). Although it is illustrated in FIG. 45 that the front portion is formed flat, the present disclosure is not limited thereto. The front portion PS may include a curved surface.

The first side portion SS1 of the display panel 300 may extend from the first side of the front portion PS. For example, as shown in FIG. 45, the first side portion SS1 may extend from the left side of the front portion PS. The first side portion SS1 may be bent from a first bending line. The first bending line may be a boundary between the front portion PS and the first side portion SS1. The first side portion SS1 may be a left side portion of the display panel 300.

The second side portion SS2 of the display panel 300 may extend from the second side of the front portion PS. For example, as shown in FIG. 45, the second side portion SS2 may extend from the lower side of the front portion PS. The second side portion SS2 may be bent from a second bending line. The second bending line may be a boundary between the front portion PS and the second side portion SS2. The second side portion SS2 may be a lower side portion of the display panel 300.

The third side portion SS3 of the display panel 300 may extend from the third side of the front portion PS. For example, as shown in FIG. 45, the third side portion SS3 may extend from the upper side of the front portion PS. The third side portion SS3 may be bent from a third bending line. The third bending line may be a boundary between the front portion PS and the third side portion SS3. The third side portion SS3 may be an upper side portion of the display panel 300.

The fourth side portion SS4 of the display panel 300 may extend from the fourth side of the front portion PS. For example, as shown in FIG. 45, the fourth side portion SS4 may extend from the left side of the front portion PS. The fourth side portion SS4 may be bent from a fourth bending line. The fourth bending line may be a boundary between the front portion PS and the fourth side portion SS4. The fourth side portion SS4 may be an upper side portion of the display panel 300.

The first corner portion CS1 of the display panel 300 may extend from a first corner where the first side of the front portion PS meets the second side of the front portion PS. The first corner portion CS1 may be disposed between the first side portion SS1 and the second side portion SS2.

The second corner portion CS2 of the display panel 300 may extend from a second corner where the first side of the front portion PS meets the third side of the front portion PS. The second corner portion CS2 may be disposed between the first side portion SS1 and the third side portion SS3.

The third corner portion CS3 of the display panel 300 may extend from a third corner where the second side of the front portion PS meets the fourth side of the front portion PS. The third corner portion CS3 may be disposed between the second side portion SS2 and the fourth side portion SS4.

The fourth corner portion CS4 of the display panel 300 may extend from a fourth corner where the third side of the front portion PS meets the fourth side of the front portion PS. The fourth corner portion CS4 may be disposed between the third side portion SS3 and the fourth side portion SS4.

The pad portion PDA of the display panel 300 may extend from one side of the second side portion SS2. For example, the pad portion PDA may extend from the lower side of the second side portion SS2. The pad portion PDA may be bent from a fifth bending line BLS. The pad portion PDA of the display panel 300 may be bent at the fifth bending line BL5 and disposed to face the front portion PS of the display panel 300.

The front portion PS, the first side portion SS1, the second side portion SS2, the third side portion SS3, and the fourth side portion SS4 of the display panel 300 may be display portions displaying an image. For example, the front portion PS of the display panel 300 is a main display portion displaying a main image, and the first to fourth side portions SS1, SS2, SS3, and SS4 may be sub-display portions displaying sub-images.

Figure 46:
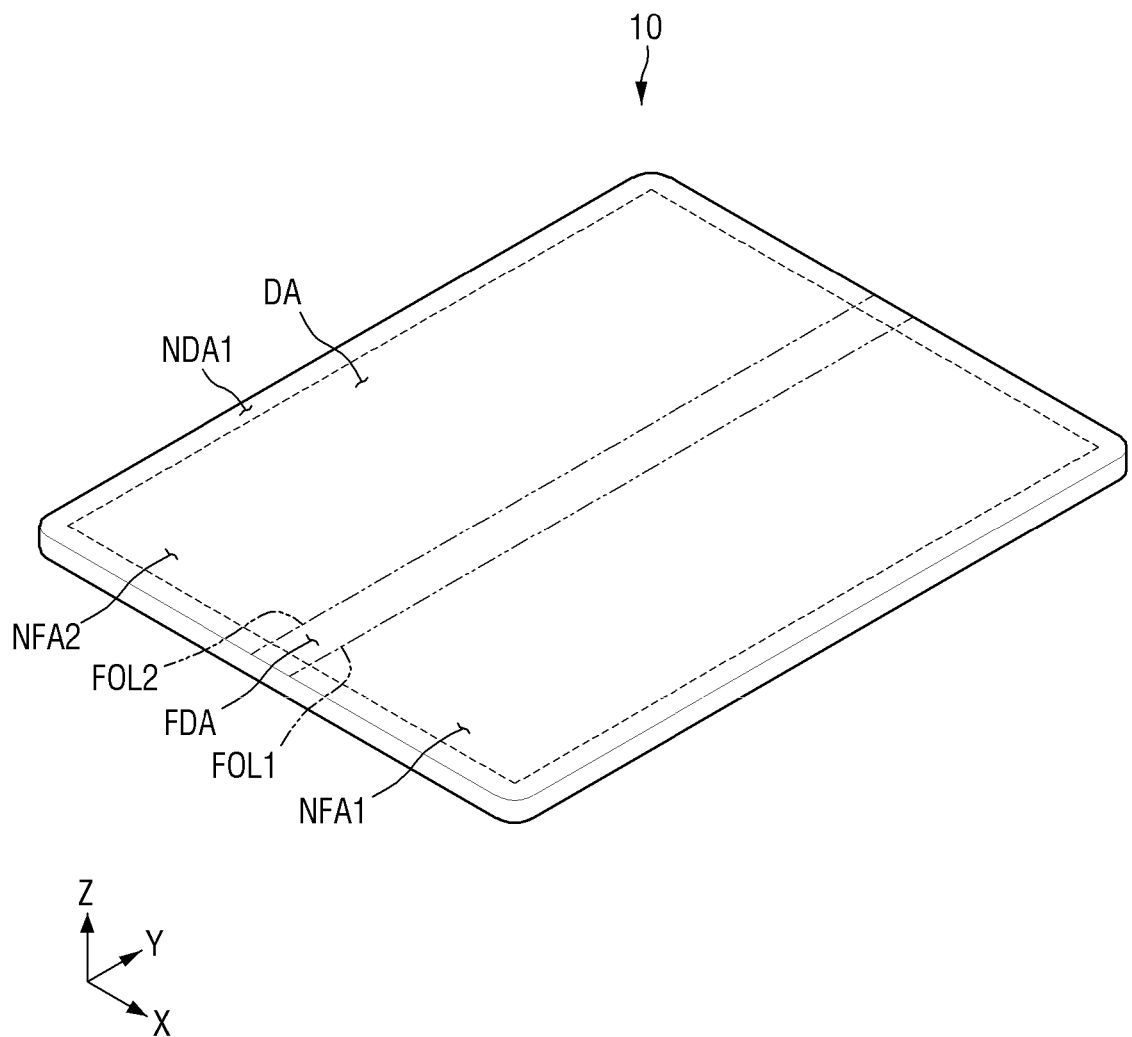
FIGS. 46 and 47 are perspective views of a display device according to one or more embodiments.
Figure 47:
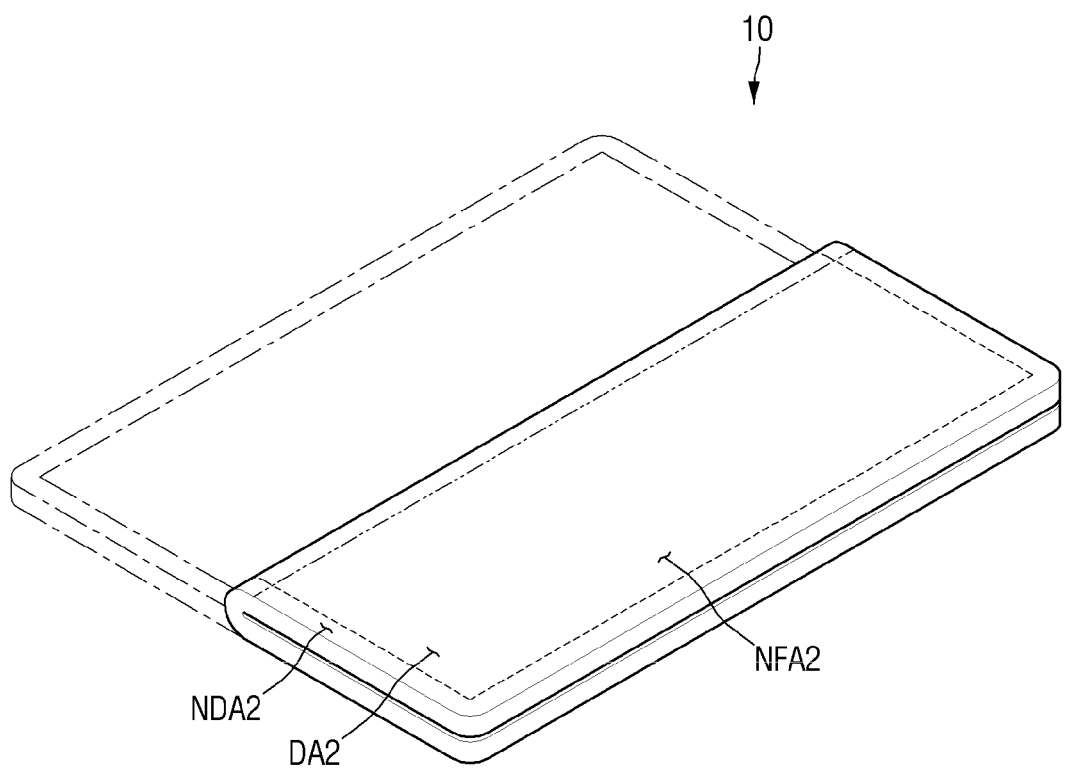

FIGS. 46 and 47 are perspective views of a display device according to another embodiment. FIGS. 46 and 47 illustrate that the display device 10 is a foldable display device folded in the first direction (X-axis direction).

Referring to FIGS. 46 and 47, the display device 10 may maintain both a folded state and an unfolded state. The display device 10 may be folded in an in-folding manner in which the front surface is disposed inside. When the display device 10 is bent or folded in an in-folding manner, the front surfaces of the display devices 10 may be disposed to face each other. In one or more embodiments, the display device 10 may be folded in an out-folding manner in which the front surface is disposed outside. When the display device 10 is bent or folded in an out-folding manner, the back surfaces of the display devices 10 may be disposed to face each other.

The first non-folding area NFA1 may be disposed at one side of the folding area FDA, for example, at the right side thereof. The second non-folding area NFA2 may be disposed at the other side of the folding area FDA, for example, at the left side thereof.

The first folding line FOL1 and the second folding line FOL2 may extend in the second direction (Y-axis direction), and the display device 10 may be folded in the first direction (X-axis direction). Thus, because the length of the display device 10 in the first direction (X-axis direction) may be reduced to approximately half, it may be convenient for a user to carry the display device 10.

In one or more embodiments, the extension direction of the first folding line FOL1 and the extension direction of the second folding line FOL2 are not limited to the second direction (Y-axis direction). For example, the first folding line FOL1 and the second folding line FOL2 may extend in the first direction (X-axis direction), and the display device 10 may be folded in the second direction (Y-axis direction). In this case, the length of the display device 10 in the second direction (Y-axis direction) may be reduced to approximately half. In one or more embodiments, the first folding line FOL1 and the second folding line FOL2 may extend in a diagonal direction of the display device 10 between the first direction (X-axis direction) and the second direction (Y-axis direction). In this case, the display device 10 may be folded in a triangular shape.

When the first folding line FOL1 and the second folding line FOL2 extend in the second direction (Y-axis direction), the length of the folding area FDA in the first direction (X-axis direction) may be shorter than the length of the folding area FDA in the second direction (Y-axis direction). Further, the length of the first non-folding area NFA1 in the first direction (X-axis direction) may be longer than the length of the folding area FDA in the first direction (X-axis direction). The length of the first non-folding area NFA2 in the first direction (X-axis direction) may be longer than the length of the first non-folding area FDA in the first direction (X-axis direction).

The display device 10 may include a first display area DA1, a second non-display area DA2, a first non-display area NDA1, and a second non-display area NDA2. The first display area DA1 and the first non-display area NDA1 may be disposed on the upper surface of the display device 10. The first display area DA1 and the first non-display area NDA1 may overlap the folding area FDA, the first non-folding area NFA1, and the second non-folding area NFA2. Therefore, when the display device 10 is unfolded, an image may be displayed on the upper surface of the folding area FDA, the first non-folding area NFA1, and the second non-folding area NFA2 of the display device 10.

The second display area DA2 and the second non-display area NDA2 may be disposed on the lower surface of the display device 10. The second display area DA2 and the second non-display area NDA2 may overlap the second non-display area NFA2. Therefore, when the display device 10 is folded, an image may be displayed on the lower surface of the second non-folding area NFA2 of the display device 10.

Figure 48:
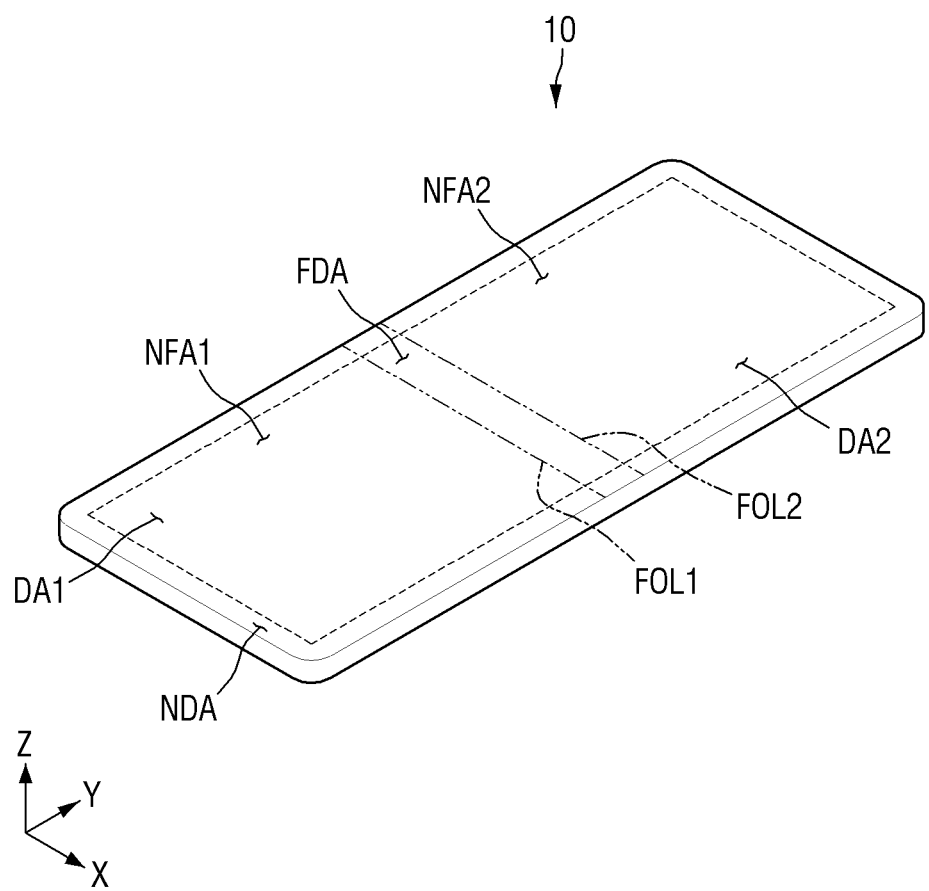
FIGS. 48 and 49 are perspective views of a display device according to one or more embodiments.
Figure 49:
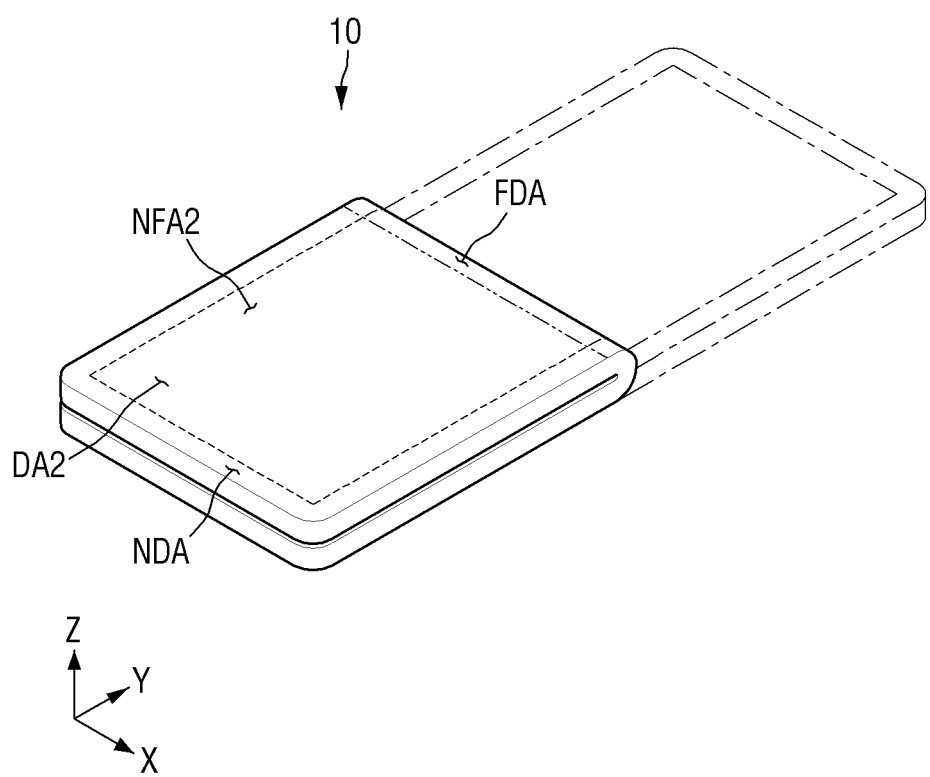

FIGS. 48 and 49 are perspective views of a display device according to one or more embodiments. FIGS. 48 and 49 illustrate that the display device 10 is a foldable display device folded in the second direction (Y-axis direction).

Referring to FIGS. 48 and 49, the display device 10 may maintain both a folded state and an unfolded state. The display device 10 may be folded in an in-folding manner in which the front surface is disposed inside. When the display device 10 is bent or folded in an in-folding manner, the front surfaces of the display devices 10 may be disposed to face each other. In one or more embodiments, the display device 10 may be folded in an out-folding manner in which the front surface is disposed outside. When the display device 10 is bent or folded in an out-folding manner, the back surfaces of the display devices 10 may be disposed to face each other.

The display device 10 may include a folding area FDA, a first non-folding area NFA1, and a second non-folding area NFA2. The folding area FDA may be an area where the display device 10 is folded, and the first non-folding area NFA1 and the second non-folding area NFA2 may be areas where the display device 10 is not folded.

The first non-folding area NFA1 may be disposed at one side of the folding area FDA, for example, at the lower side thereof. The second non-folding area NFA2 may be disposed at the other side of the folding area FDA, for example, at the upper side thereof. The folding area FDA may be an area bent at a set curvature (e.g., a predetermined curvature) in the first folding line FOL1 and the second folding line FOL2. Therefore, the first folding line FOL1 is a boundary between the folding area FDA and the first non-folding area NFA1, and the second folding line FOL2 may be a boundary between the folding area FDA and the second non-folding area NFA2.

As shown in FIGS. 48 and 49, the first folding line FOL1 and the second folding line FOL2 may extend in the first direction (X-axis direction), and the display device 10 may be folded in the second direction (Y-axis direction). Thus, because the length of the display device 10 in the second direction (Y-axis direction) may be reduced to approximately half, it may be convenient for a user to carry the display device 10.

Meanwhile, the extension direction of the first folding line FOL1 and the extension direction of the second folding line FOL2 are not limited to the first direction (X-axis direction). For example, the first folding line FOL1 and the second folding line FOL2 extend in the second direction (Y-axis direction), and the display device 10 may be folded in the first direction (X-axis direction). In this case, the length of the display device 10 in the first direction (X-axis direction) may be reduced to approximately half. In one or more embodiments, the first folding line FOL1 and the second folding line FOL2 may extend in a diagonal direction of the display device 10 between the first direction (X-axis direction) and the second direction (Y-axis direction). In this case, the display device 10 may be folded in a triangular shape.

When the first folding line FOL1 and the second folding line FOL2 extend in the first direction (X-axis direction) as shown in FIGS. 48 and 49, the length of the folding area FDA in the second direction (Y-axis direction) may be shorter than the length of the folding area FDA in the first direction (X-axis direction). Further, the length of the first non-folding area NFA1 in the second direction (Y-axis direction) may be longer than the length of the folding area FDA in the second direction (Y-axis direction). The length of the first non-folding area NFA2 in the second direction (Y-axis direction) may be longer than the length of the first non-folding area FDA in the second direction (Y-axis direction).

The display area DA may be disposed on the upper surface of the display device 10. Although it is illustrated in FIGS. 48 and 49 that each of the display area DA and the non-display area NDA overlaps the folding area FDA, the first non-folding area NFA1, and the second non-folding area NFA2, the present disclosure is not limited thereto. For example, each of the display area DA and the non-display area NDA may overlap at least one of the folding area FDA, the first non-folding area NFA1, and the second non-folding area NFA2.

Although aspects of some example embodiments of the present disclosure have been disclosed for illustrative purposes, those skilled in the art will appreciate that various modifications, additions and substitutions are possible, without departing from the scope and spirit of embodiments according to the present disclosure as defined by the accompanying claims and equivalents thereof.

What is claimed is:

1. A display device comprising:
    a display panel comprising a plurality of sensor electrodes, and a plurality of sensor lines connected to the plurality of sensor electrodes, each of the plurality of sensor lines connected to a corresponding sensor electrode from among the plurality of sensor electrodes;
    a plurality of sensor circuit lines electrically connected to the plurality of sensor lines, each of the plurality of sensor circuit lines connected to a corresponding sensor line from among the plurality of sensor lines;
    a plurality of radio signal lines; and
    a plurality of coupling capacitors, each of the plurality of coupling capacitors between a corresponding sensor circuit line from among the plurality of sensor circuit lines and a corresponding radio signal line from among the plurality of radio signal lines.

2. The display device of claim 1, further comprising:
    a circuit board in which the plurality of sensor circuit lines, the plurality of radio signal lines, and the plurality of coupling capacitors are located.

3. The display device of claim 2, further comprising:
    an antenna driving circuit connected to the plurality of radio signal lines.

4. The display device of claim 3, wherein the antenna driving circuit is on the circuit board.

5. The display device of claim 3, wherein the antenna driving circuit is configured to transmit radio transmission signals to the plurality of radio signal lines and receive radio reception signals from the plurality of radio signal lines.

6. The display device of claim 5, further comprising:
    a touch driving circuit connected to the plurality of sensor circuit lines.

7. The display device of claim 6, wherein the touch driving circuit is on the circuit board.

8. The display device of claim 6, wherein the touch driving circuit is configured to output touch driving signals to the plurality of sensor circuit lines, and sensing voltages of the plurality of sensor electrodes through the plurality of sensor circuit lines.

9. The display device of claim 8, wherein a frequency of the radio transmission signals is higher than a frequency of the touch driving signals.

10. The display device of claim 1, further comprising:
    a first ground line overlapping at least one sensor electrode from among the plurality of sensor electrodes.

11. The display device of claim 10, wherein the plurality of sensor lines and the first ground line extend in a first direction.

12. The display device of claim 10, wherein the first ground line is electrically separated from the plurality of sensor lines.

13. The display device of claim 10, wherein the display panel comprises a display area including a plurality of light emitting areas for displaying an image, and a non-display area which is a peripheral area of the display area,
    wherein the first ground line is in the display area,
    wherein the display device further comprises a second ground line in the non-display area, and
    wherein the first ground line and the second ground line are connected in the non-display area.

14. A display device comprising:
    a display panel comprising a plurality of sensor electrodes, and a plurality of sensor lines connected to the plurality of sensor electrodes, each of the plurality of sensor lines connected to a corresponding sensor electrode from among the plurality of sensor electrodes;
    a plurality of radio signal lines; and
    a plurality of coupling capacitors, each of the plurality of coupling capacitors between a corresponding sensor line from among the plurality of sensor lines and a corresponding radio signal line from among the plurality of radio signal lines.

15. The display device of claim 14, wherein the display panel comprises a display area including a plurality of light emitting areas for displaying an image, and a non-display area which is a peripheral area of the display area, and
    wherein the plurality of radio signal lines and the plurality of coupling capacitors are in the non-display area.

16. The display device of claim 15, wherein the plurality of sensor lines and the plurality of radio signal lines are arranged in parallel in one direction.

17. The display device of claim 15, wherein the corresponding sensor line overlaps the corresponding radio signal line in a thickness direction of the display panel.

18. The display device of claim 15, further comprising:
    an antenna driving circuit electrically connected to the plurality of radio signal lines.

19. The display device of claim 18, wherein the antenna driving circuit is configured to transmit radio transmission signals to the plurality of radio signal lines and receive radio reception signals from the plurality of radio signal lines.

20. The display device of claim 18, further comprising:
    a touch driving circuit connected to a plurality of sensor circuit lines coupled to the plurality of sensor lines.

21. The display device of claim 20, wherein the touch driving circuit is configured to output touch driving signals to the plurality of sensor circuit lines, and sense the plurality of sensor electrodes through the plurality of sensor circuit lines.

22. The display device of claim 20, further comprising:
    a circuit board on which the antenna driving circuit and the touch driving circuit are located.

23. A method for driving a display device comprising:
    receiving radio reception signals from a plurality of sensor electrodes through a plurality of coupling capacitors;
    selecting at least one antenna electrode from among the plurality of sensor electrodes; and
    outputting radio transmission signals to the antenna electrodes through a plurality of coupling capacitors.

24. The method of claim 23, wherein each of the plurality of coupling capacitors is between a corresponding sensor line from among a plurality of sensor lines and a corresponding radio signal line from among a plurality of radio signal lines, and
    wherein each of the plurality of sensor lines are electrically connected to a corresponding sensor electrode from among the plurality of sensor electrodes.

25. The method of claim 24, further comprising:
outputting touch driving signals to a plurality of sensor circuit lines through the plurality of sensor lines; and
sensing voltages of the plurality of sensor electrodes through the plurality of sensor circuit lines.

26. The method of claim 25, wherein the selecting at least one antenna electrode from among the plurality of sensor electrodes comprises selecting the at least one antenna electrode by excluding a touched sensor electrode from among the plurality of sensor electrodes.

27. The method of claim 23, wherein the selecting at least one antenna electrode from among the plurality of sensor electrodes comprises selecting P×Q sensor electrodes from among the plurality of sensor electrodes as the at least one antenna electrode, and
wherein the P×Q sensor electrodes are arranged in parallel in a first direction and in a second direction perpendicular to the first direction, wherein P and Q are positive integers.

28. The method of claim 23, wherein the selecting at least one antenna electrode from among the plurality of sensor electrodes comprises selecting a plurality of sub-antenna electrode groups as the at least one antenna electrode, and
wherein the plurality of sub-antenna electrode groups are spaced from each other in a first direction and a second direction perpendicular to the first direction.

29. The method of claim 28, wherein a first sub-antenna electrode group from among the plurality of sub-antenna electrode groups is at a first corner of a display panel of the display device, and
wherein a second sub-antenna electrode group from among the plurality of sub-antenna electrode groups is at a second corner of the display panel.

30. The method of claim 28, wherein each of the plurality of sub-antenna electrode groups comprise R×S sensor electrodes arranged in parallel in the first direction and the second direction, wherein R and S are positive integers.

31. The method of claim 23, wherein the selecting at least one antenna electrode from among the plurality of sensor electrodes comprises selecting the at least one antenna electrode by excluding a sensor electrode adjacent to a ground from among the plurality of sensor electrodes according to an inclination degree and a rotation direction of the display device measured by an acceleration sensor and a gyro sensor.

32. The method of claim 23, wherein the selecting at least one antenna electrode from among the plurality of sensor electrodes comprises selecting a sensor electrode which is positioned at relatively high position from among the plurality of sensor electrodes as the at least one antenna electrode according to an inclination degree and a rotation direction of the display device measured by an acceleration sensor and a gyro sensor.

33. A method for driving a display device comprising:
receiving first radio reception signals from first antenna electrodes from among a plurality of sensor electrodes and second radio reception signals from second antenna electrodes from among the plurality of sensor electrodes;
selecting the first antenna electrodes from among the plurality of sensor electrodes based on the first radio reception signals;
selecting the second antenna electrodes from among the plurality of sensor electrodes based on the second radio reception signals; and
outputting first radio transmission signals to the first antenna electrodes and outputting second radio transmission signals to the second antenna electrodes,
wherein a frequency of the first radio transmission signals is different from a frequency of the second radio transmission signals.

\* \* \* \* \*